(12) United States Patent
Chan et al.

(10) Patent No.: US 6,542,096 B2
(45) Date of Patent: Apr. 1, 2003

(54) SERIALIZER/DESERIALIZER EMBEDDED IN A PROGRAMMABLE DEVICE

(75) Inventors: Andrew K. Chan, Palo Alto, CA (US); James M. Apland, Gilroy, CA (US); Senani Gunaratna, Campbell, CA (US); SunilKumar G. Mudunuri, San Jose, CA (US); Ket-Chong Yap, Fremont, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 0 days.

(21) Appl. No.: 09/939,533

(22) Filed: Aug. 24, 2001

(65) Prior Publication Data

US 2003/0039168 A1 Feb. 27, 2003

(51) Int. Cl.7 ............................................. H03M 9/00
(52) U.S. Cl. ......................................... 341/100; 716/16
(58) Field of Search ................... 341/100; 716/16; 326/41, 39, 40

(56) References Cited

U.S. PATENT DOCUMENTS

| | | | |
|---|---|---|---|
| 5,424,655 A | | 6/1995 | Chua ............................ 326/40 |
| 5,737,235 A | * | 4/1998 | Kean et al. .................. 364/490 |
| 5,825,201 A | | 10/1998 | Kolze ........................... 326/39 |

OTHER PUBLICATIONS

1995 Actel FPGA Data Book And Design Guide, 1995, pp. ix–xv, 1–5 through 1–34, 1–51, through 1–101, 1–153 through 1–222, 3–1 through 4–56.

1995 QuickLogic Data Book, 1995, pp. 1–5 through 2–11 and 6–3 through 6–18.

Brown, Stephen, "Field–Programmable Gate Arrays", Kluwer Academic Publishers, 1992, pp. 1–43 and 88–202.

Pellerin, David and Holley, Michael, "Practical Design Using Programmable Logic", Prentice Hall 1991, pp. 84–98.

Trimberger, Stephen (edited), "Field–Programmable Gate Array Technology", Kluwer Academic Publishers, 1994, pp. 1–14 and 98–170.

* cited by examiner

*Primary Examiner*—Peguy JeanPierre
*Assistant Examiner*—Joseph Lauture
(74) *Attorney, Agent, or Firm*—Skjerven Morrill LLP

(57) ABSTRACT

In accordance with the invention, a serializer/deserializer core of a field programmable gate array includes a channel clock and a data channel. The data channel can serialize and deserialize data in two modes. In the first mode, an embedded clock signal is recovered from the data. In the second mode, a clock signal is provided by the channel clock. A selection signal determines in which mode each of the data channels in the serializer/deserializer core operates. An stair-step clock generator generates a series of rising edge signals used to serialize and deserialize data. The number of bits serialized and deserialized is determined by the control signals to a set of multiplexers in the stair-step clock generator which determine how many registers in the stair-step clock generator are activated.

14 Claims, 70 Drawing Sheets

| FIG. 3A | FIG. 3B | FIG. 3C | FIG. 3D | FIG. 3E | FIG. 3F | FIG. 3G |
|---|---|---|---|---|---|---|
| FIG. 3H | FIG. 3I | FIG. 3J | FIG. 3K | FIG. 3L | FIG. 3M | FIG. 3N |
| FIG. 3O | FIG. 3P | FIG. 3Q | FIG. 3R | FIG. 3S | FIG. 3T | FIG. 3U |

Key To

Key To FIG. 2

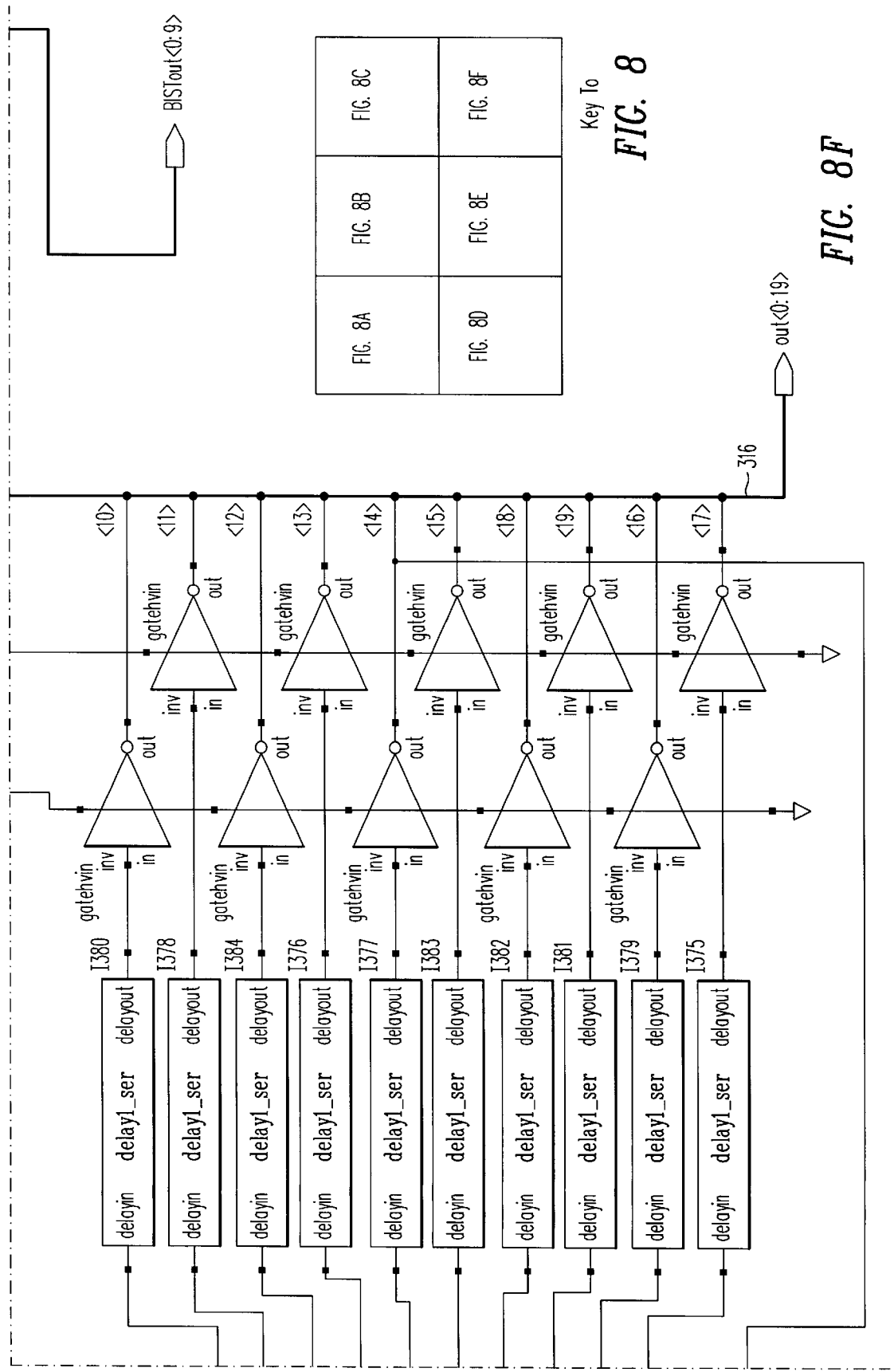

Key To

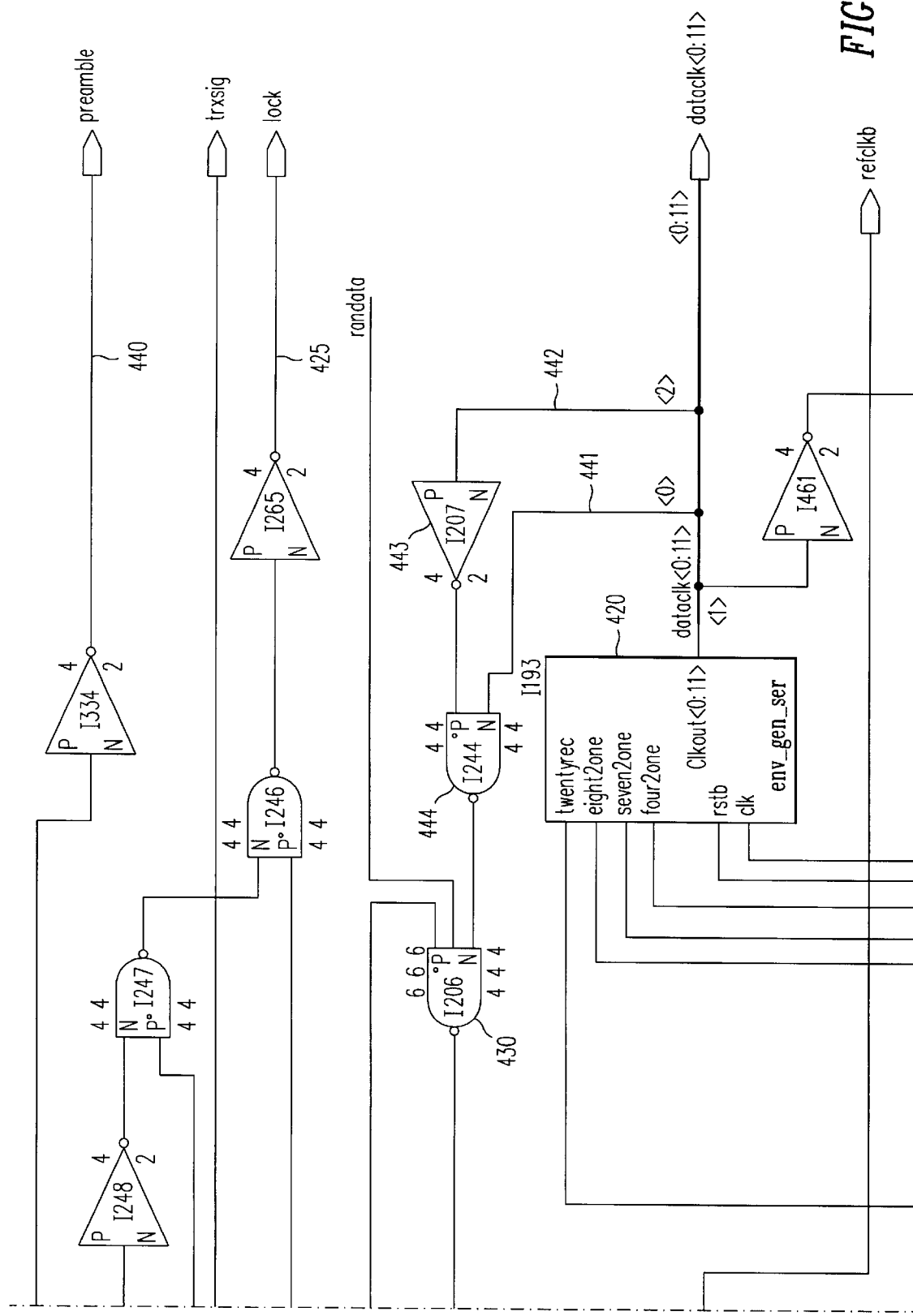

Key To FIG. 14

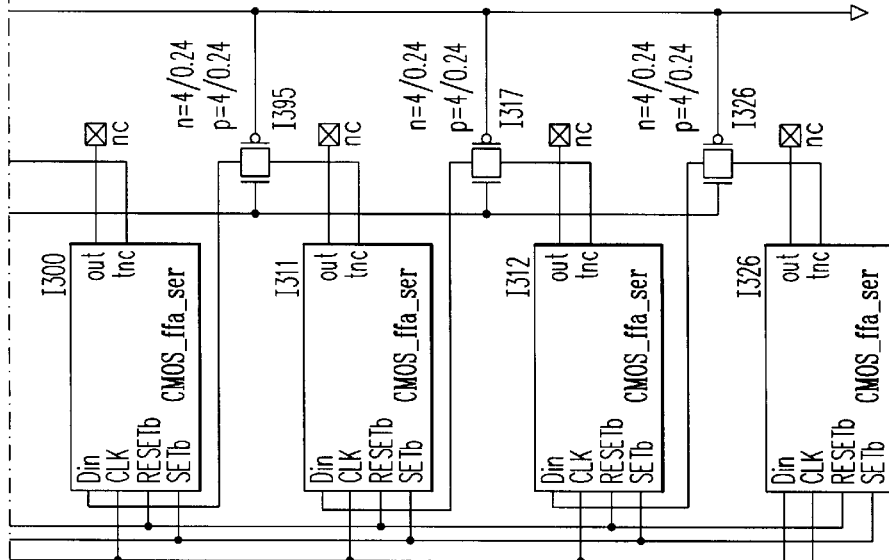
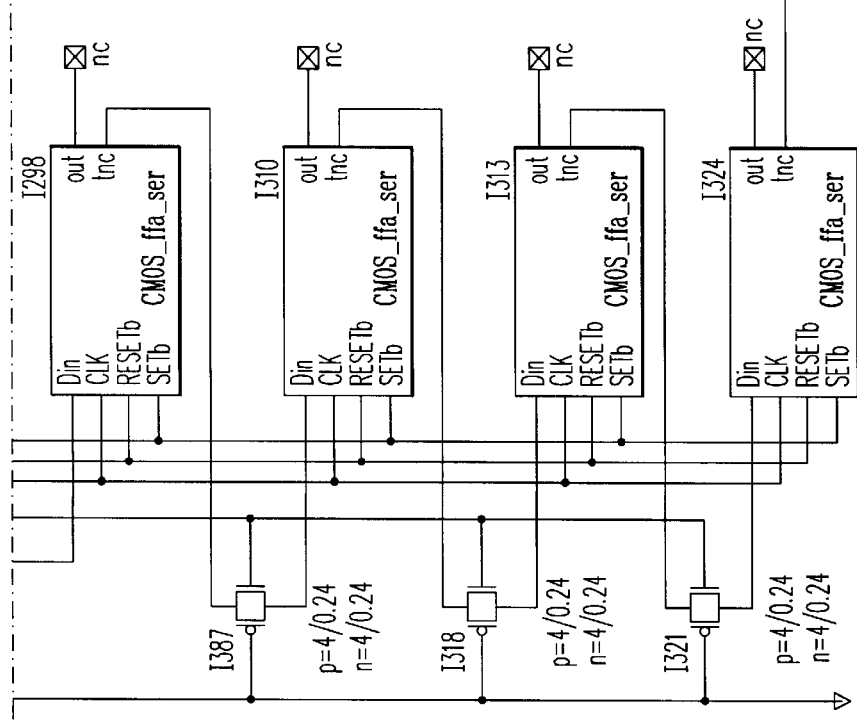
FIG. 15C
Key To
FIG. 15
| FIG. 15A |
| FIG. 15B |
| FIG. 15C |

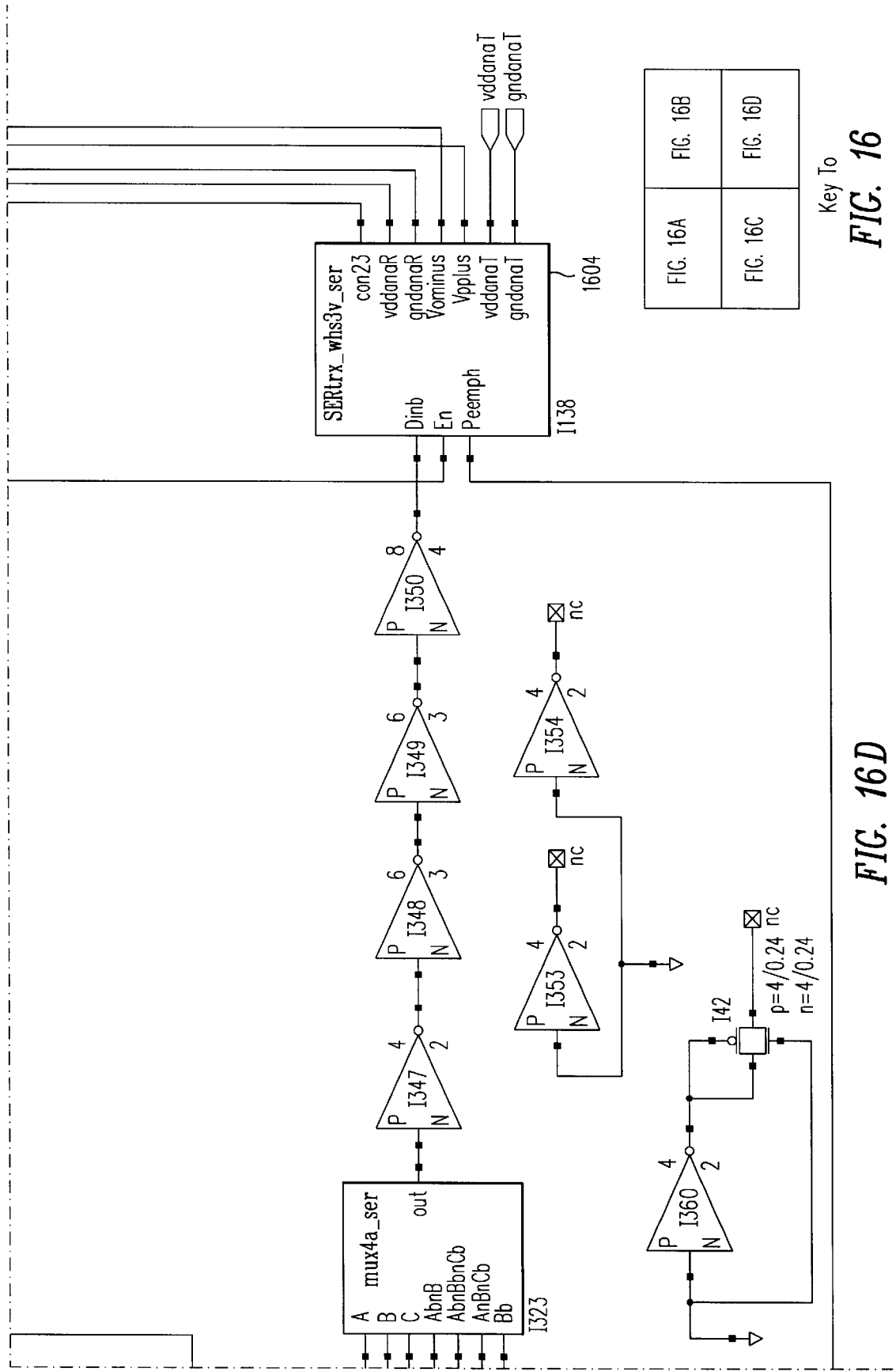

SERIALIZER/DESERIALIZER EMBEDDED IN A PROGRAMMABLE DEVICE

BACKGROUND

A programmable application specific integrated circuit (ASIC) is a versatile integrated circuit chip, the internal circuitry of which may be configured by an individual user to realize a user-specific circuit. To configure a programmable ASIC, the user configures an on-chip interconnect structure of the programmable ASIC so that selected input terminals and selected output terminals of selected on-chip circuit components are electrically connected together in such a way that the resulting circuit is the user-specific circuit desired by the user. In a programmable ASIC employing, for example, amorphous silicon antifuses, selected amorphous silicon antifuses disposed between selected wire segments are "programmed" to connect the selected wire segments together electrically. Which antifuses are programmed and which antifuses are left unprogrammed determines how the circuit components are interconnected and therefore determines the resulting circuit.

A field programmable gate array (an "FPGA") is one type of programmable application specific integrated circuit. For background information on field programmable gate arrays employing antifuses, see: "Field Programmable Gate Array Technology" edited by Stephen Trimberger, 1994, pages 1–14 and 98–170; "Field-Programmable Gate Arrays" by Stephen Brown et al., 1992, pages 1–43 and 88–202; "Practical Design Using Programmable Logic" by David Pellerin and Michael Holley, 1991, pages 84–98; the 1995 QuickLogic Data Book, 1995, pages 1-5 through 2-11 and 6-3 through 6-18; the 1995 Actel FPGA Data Book And Design Guide, 1995, pages ix-xv, 1-5 through 1-34, 1-51 through 1-101, 1-153 through 1-222, 3-1 through 4-56; U.S. Pat. No. 5,424,655 entitled "Programmable Application Specific Integrated Circuit Employing Antifuses And Methods Therefor"; U.S. Pat. No. 5,825,201 entitled "Programmable Architecture for a Programmable Integrated Circuit Employing Antifuses". The contents of these documents are incorporated herein by reference.

SUMMARY

In accordance with the invention, a field programmable gate array includes a serializer/deserializer core for serializing parallel data and deserializing serial data. The serializer/deserializer core includes a channel clock and a data channel. The data channel can serialize and deserialize data in two modes. In the first mode, an embedded clock signal is recovered from the data. In the second mode, a clock signal is provided by the channel clock. A selection signal determines in which mode each of the data channels in the serializer/deserializer core operates.

Data are serialized in a parallel-to-serial circuit which includes a series of registers. Once the parallel data are loaded into the series of registers, they are serially clocked out of the registers by a rising edge signal generated by an stair-step clock generator and provided to the series of registers. Data are deserialized in a serial-to-parallel circuit which includes a series of registers. Serial data are loaded into the registers using a series of rising edge signals generated by the stair-step clock generator. The data are then switched out of the registers onto a parallel bus in a single clock cycle.

The data channel includes a voltage controlled oscillator. The voltage controlled oscillator includes a set of capacitors. A set of transistors couples the capacitors to the output of the voltage controlled oscillator. The gates of the transistors are controlled by a control signal.

A pair of data channels can be tested in a bidirectional loop back test or built in self test. In the loop-back test, the first data channel may be configured to receive data and the second data channel may be configured to transmit data or vice versa. The first data channel receives serial data including an embedded clock, deserializes it, then provides the parallel data and clock to the second data channel. The second data channel reserializes the parallel data, embeds the clock, then transmits the data to be verified. The roles of the data channels are then switched and the loop back test is run in the opposite direction. In a loop back test, the serial data received by the first data channel are provided by an external source and the serial data transmitted by the second data channel are verified by an external test system. In a built in self test, both data channels are coupled to linear feedback shift registers. The linear feedback shift register coupled to the transmitter provides pseudo random parallel data. The linear feedback shift register coupled to the receiver accumulates the parallel data received and generates a signature. If at the end of the data stream the signature matches a predetermined hardwired correct signature, the test is automatically run in the opposite direction with the linear feedback shift registers and data channels switching values. Thus, the first data channel is then reconfigured to transmit data and the second data channel is reconfigured to receive data. The second data channel receives serial data, deserializes it, then provides the parallel data to the first data channel. The first data channel reserializes the parallel data, then transmits the data to be verified.

DETAILED DESCRIPTION

Figure 1:
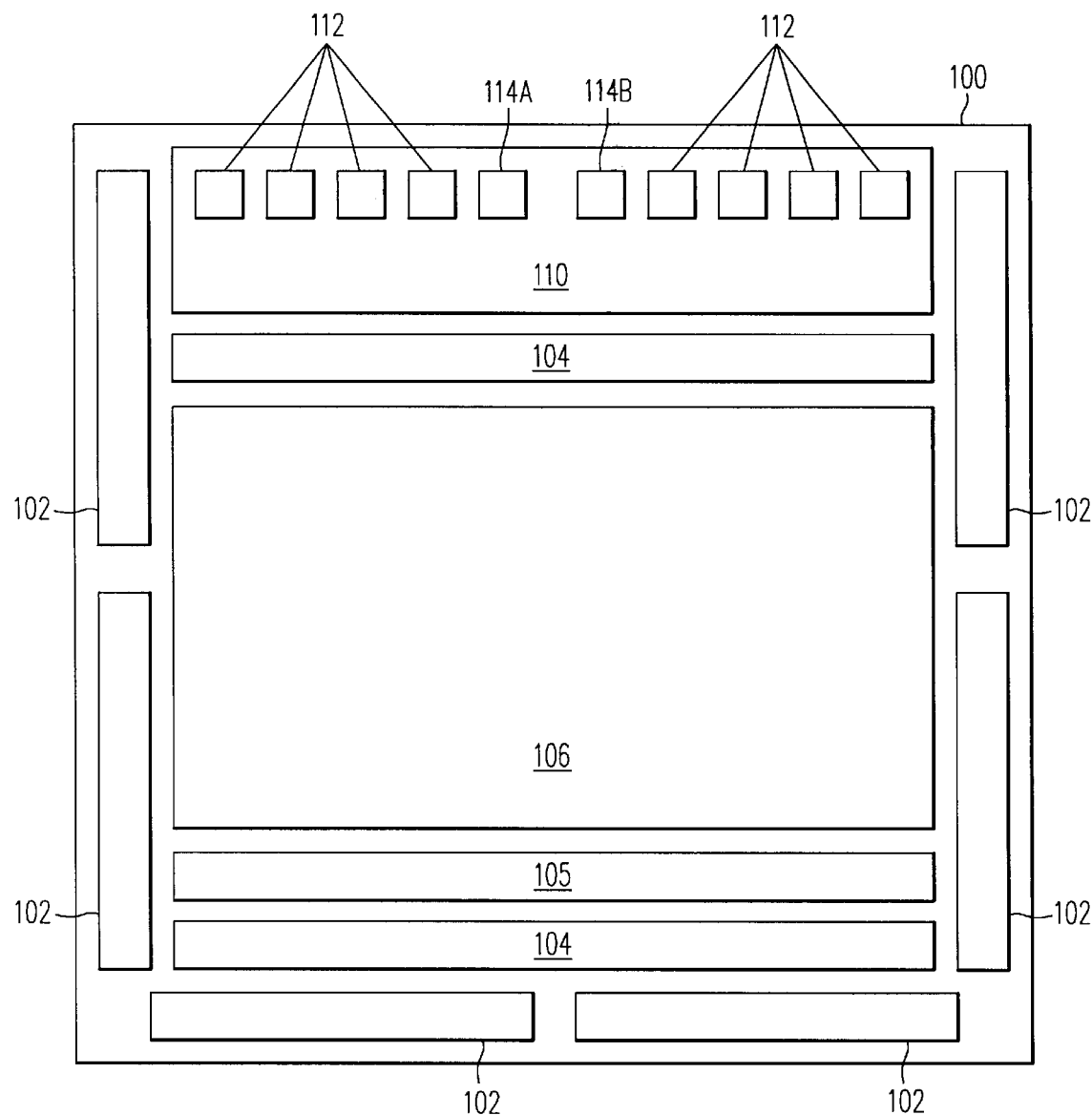
FIG. 1 is a block diagram of a field programmable gate array incorporating an embodiment of the present invention.
Figure 2C:
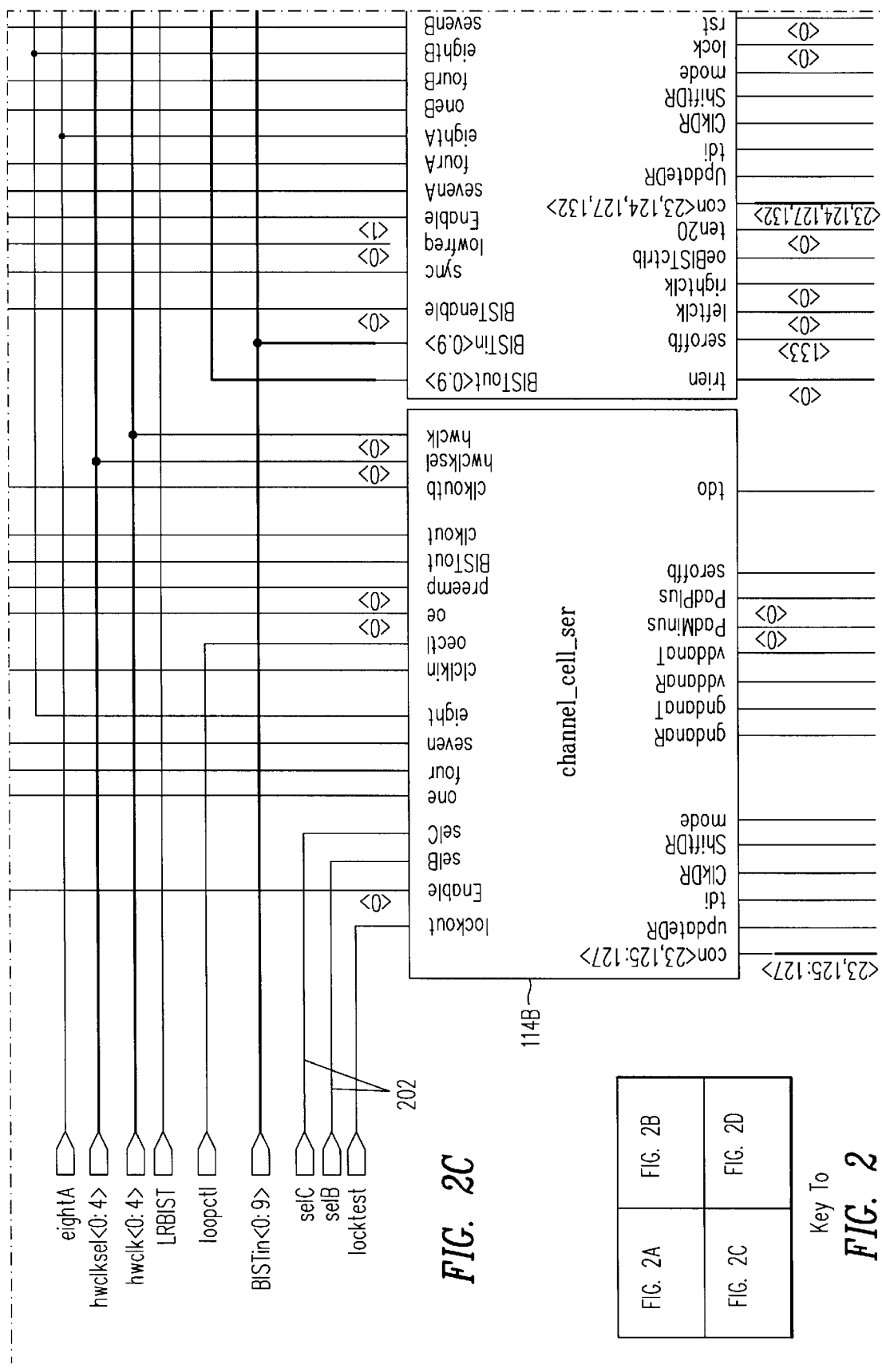
FIG. 2 is a schematic diagram of a portion of a serializer/deserializer core.
Figure 2A:
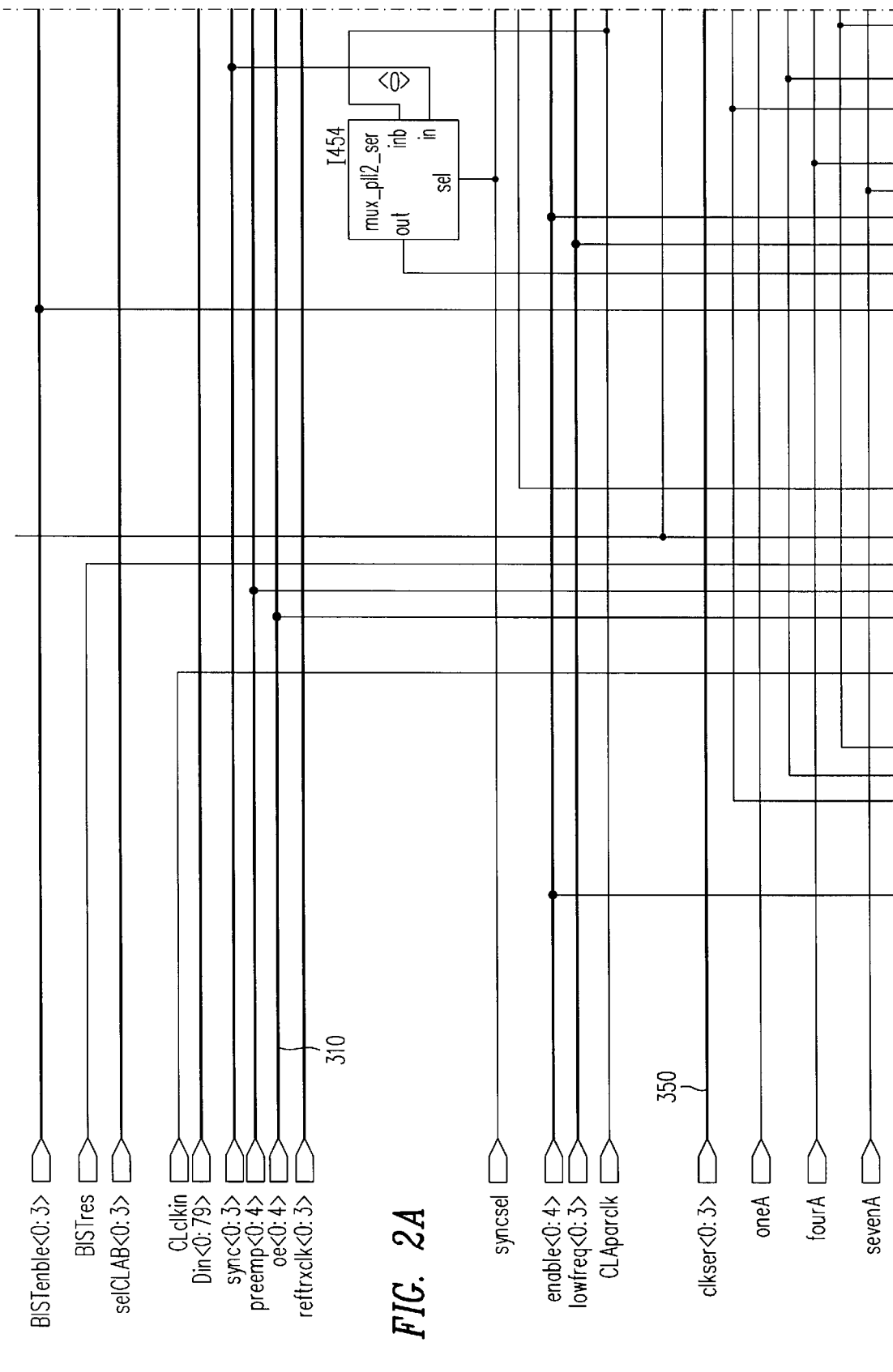
Figure 2B:
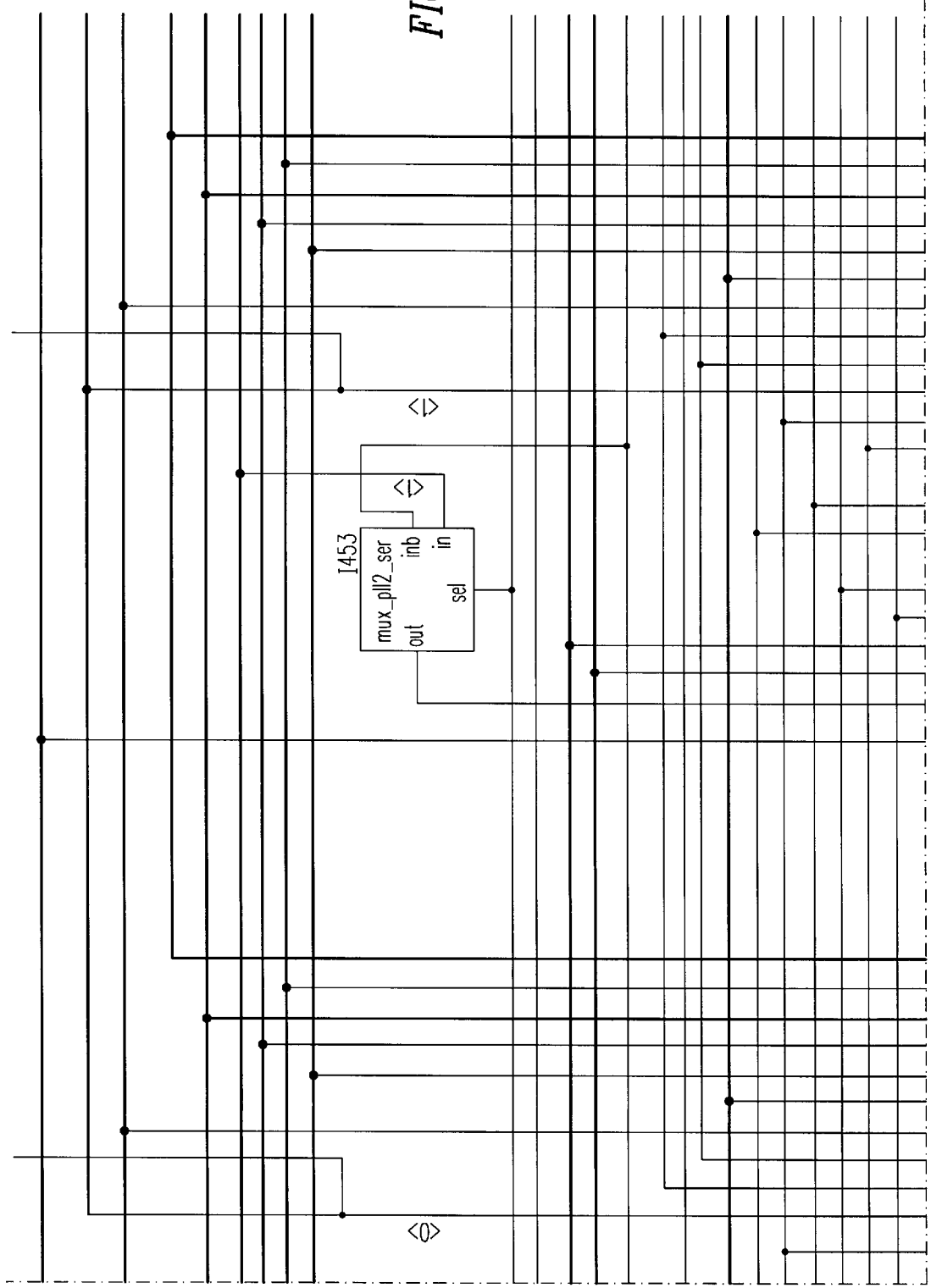
Figure 2D:
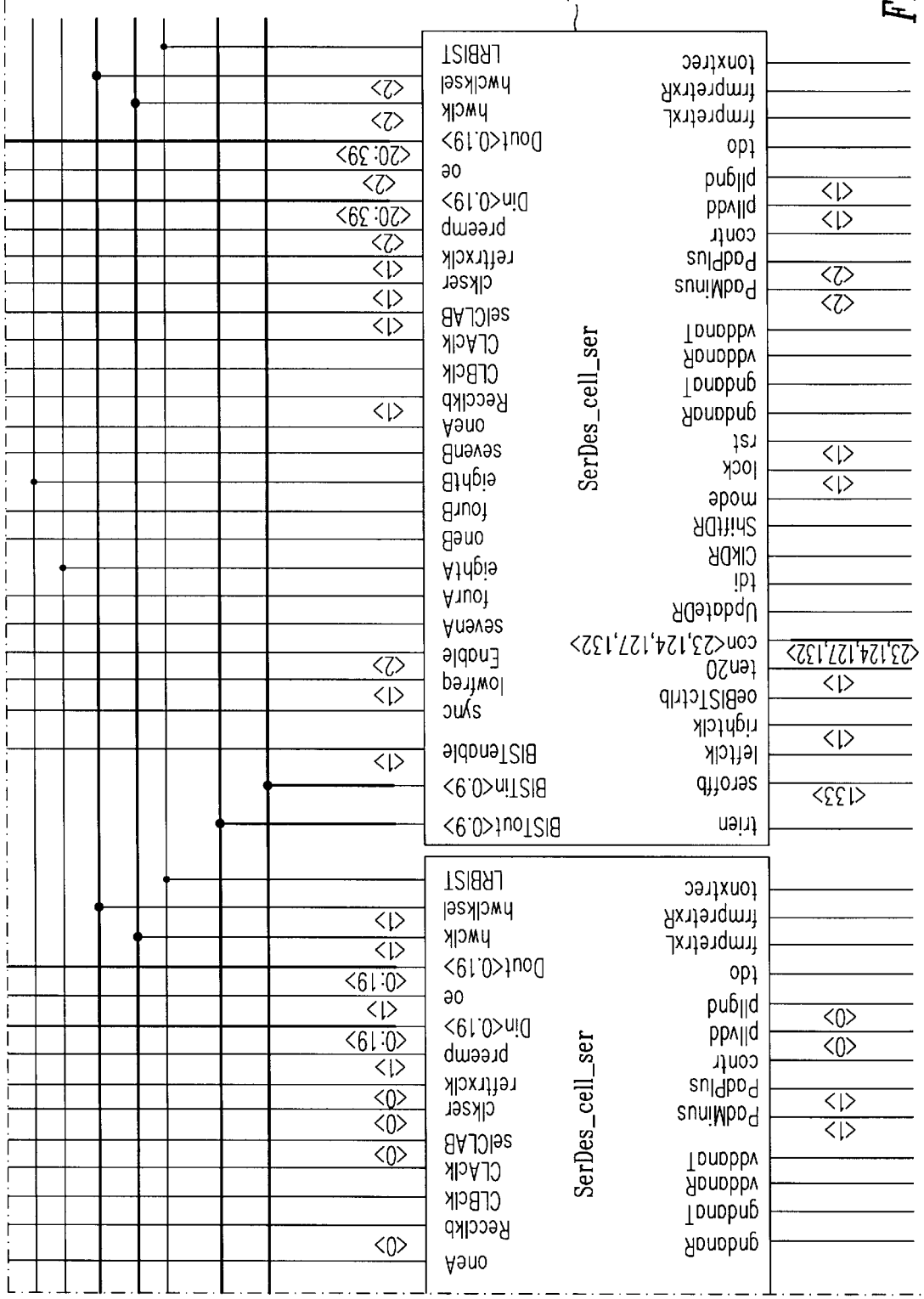
Figure 3G:
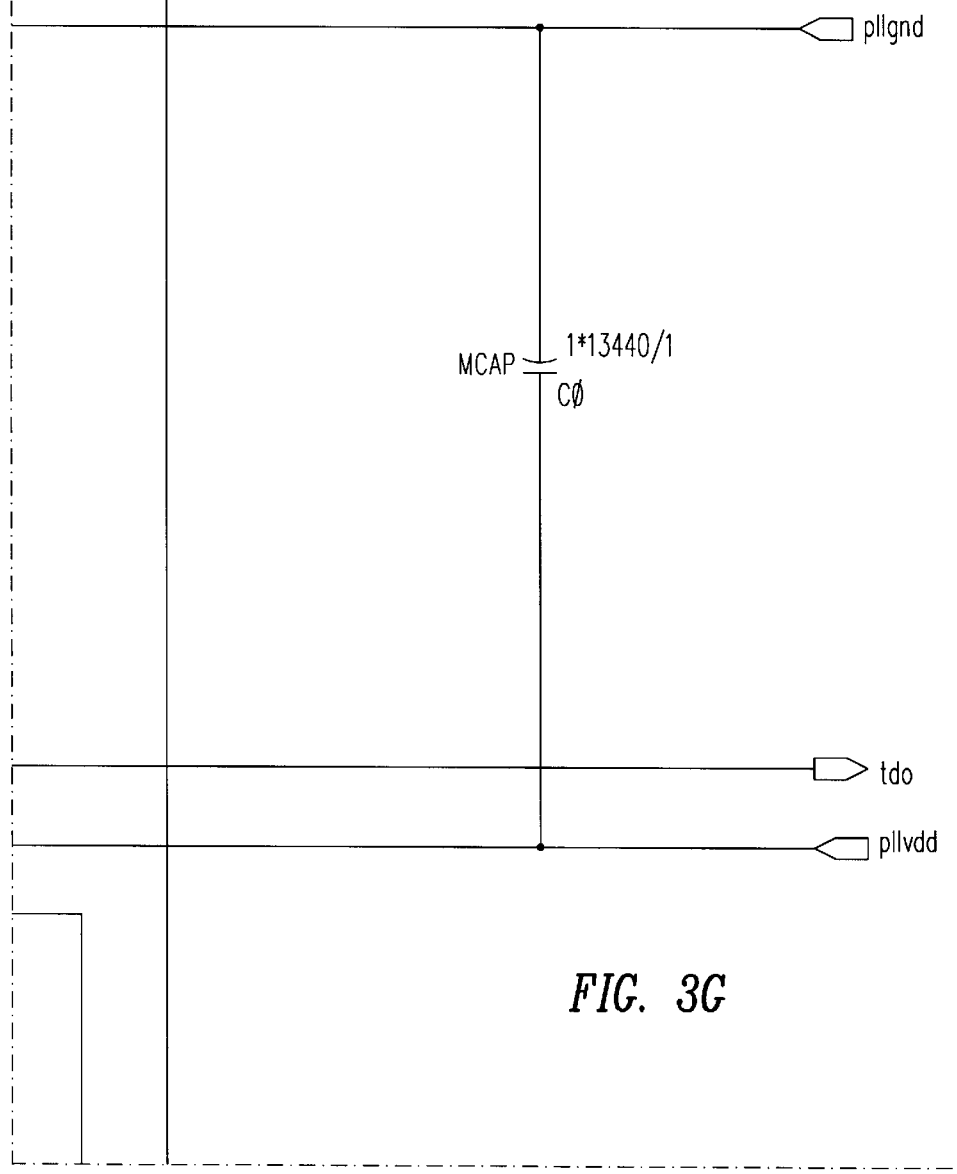
FIG. 3 is a schematic diagram of a data channel block in a serializer/deserializer core.
Figure 3A:
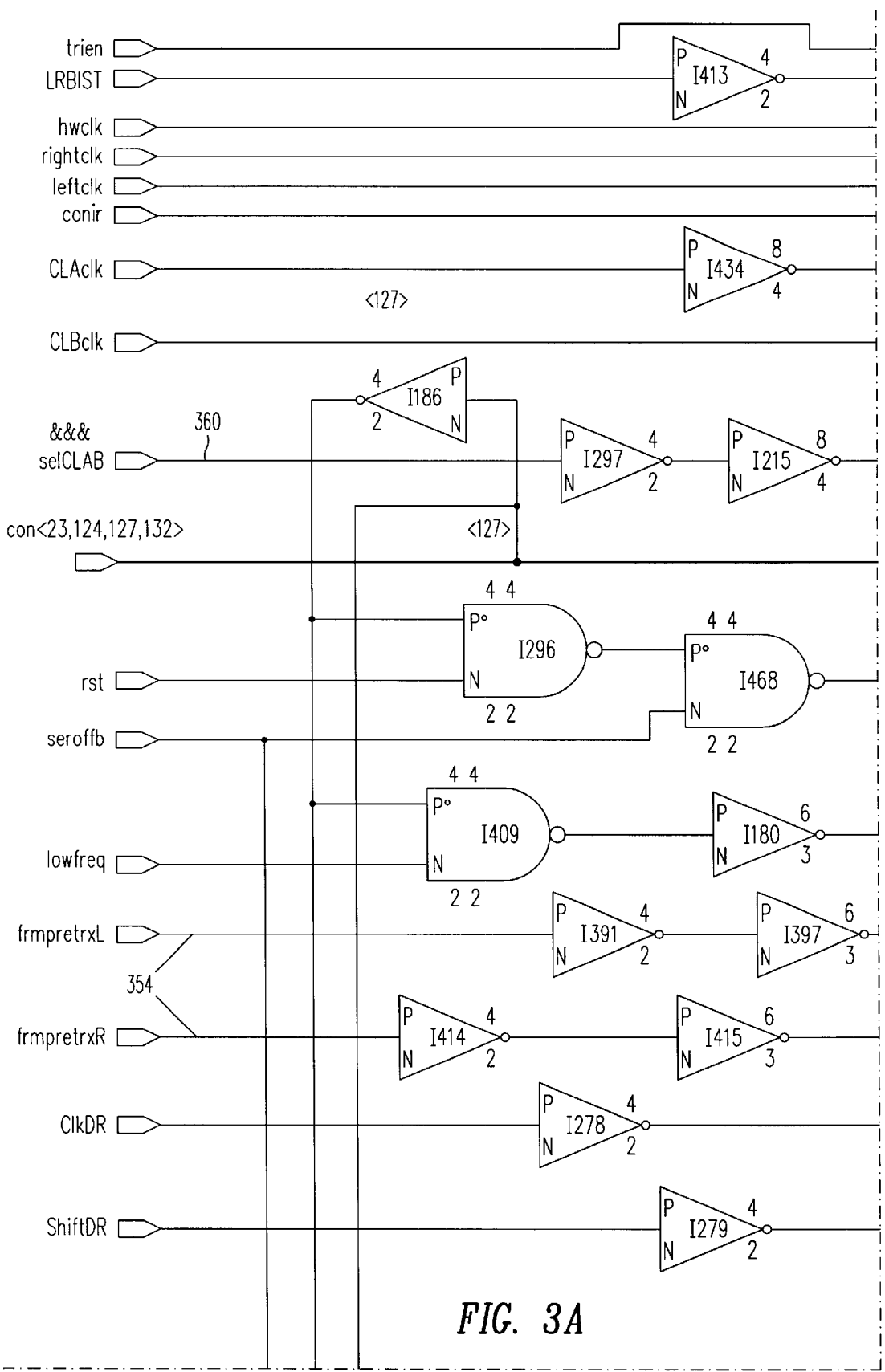
Figure 3B:
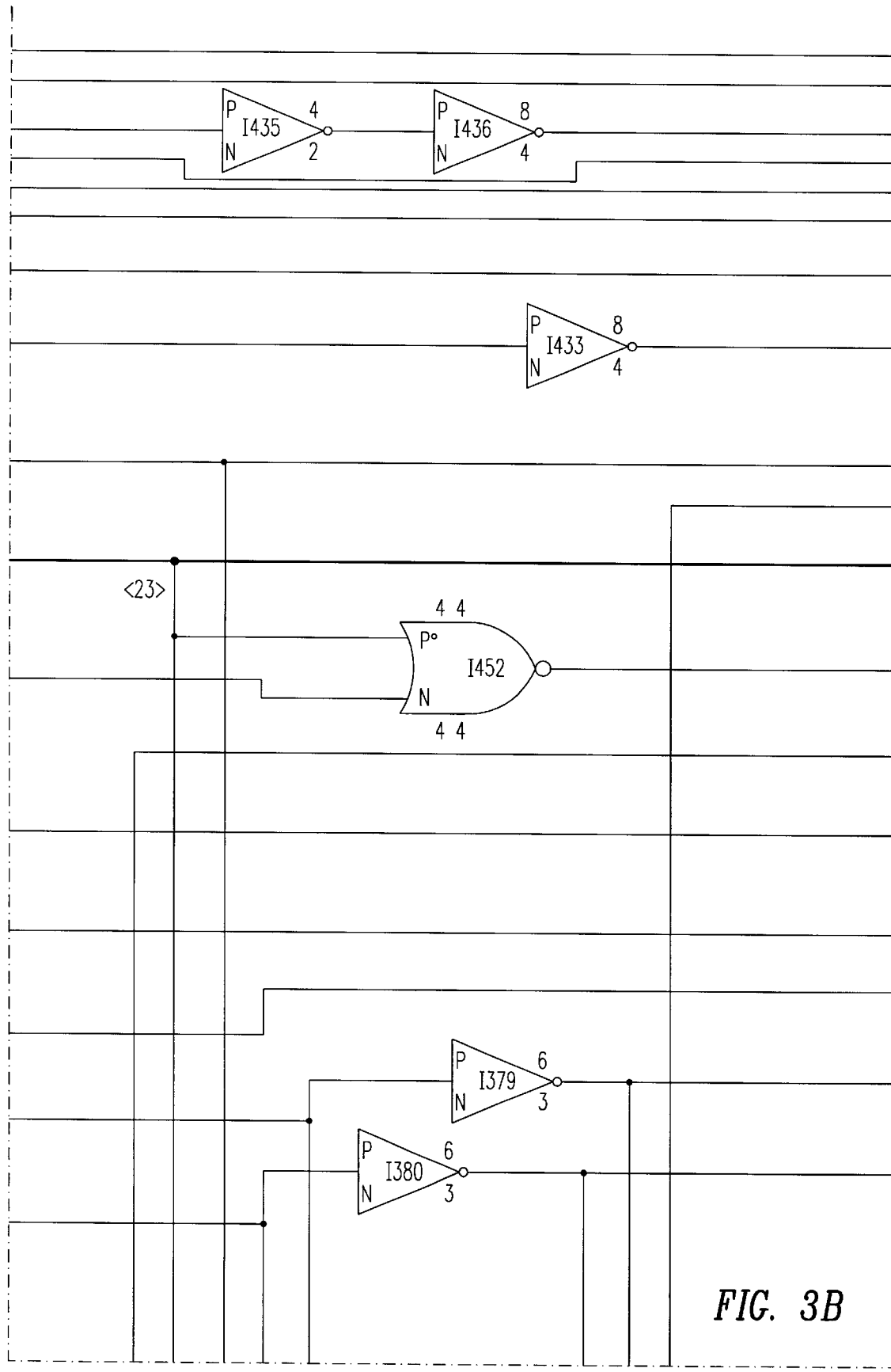
Figure 3C:
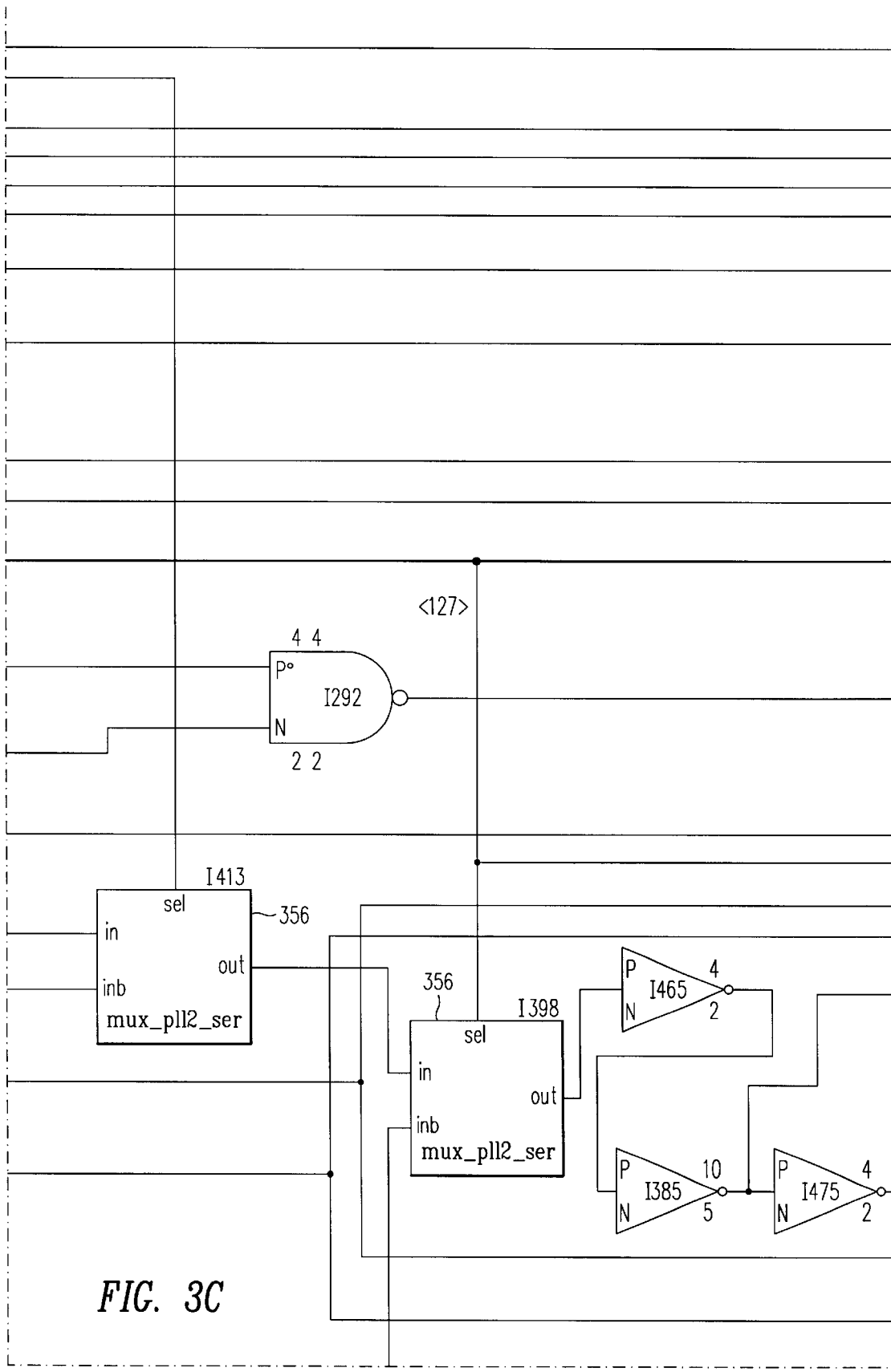
Figure 3D:
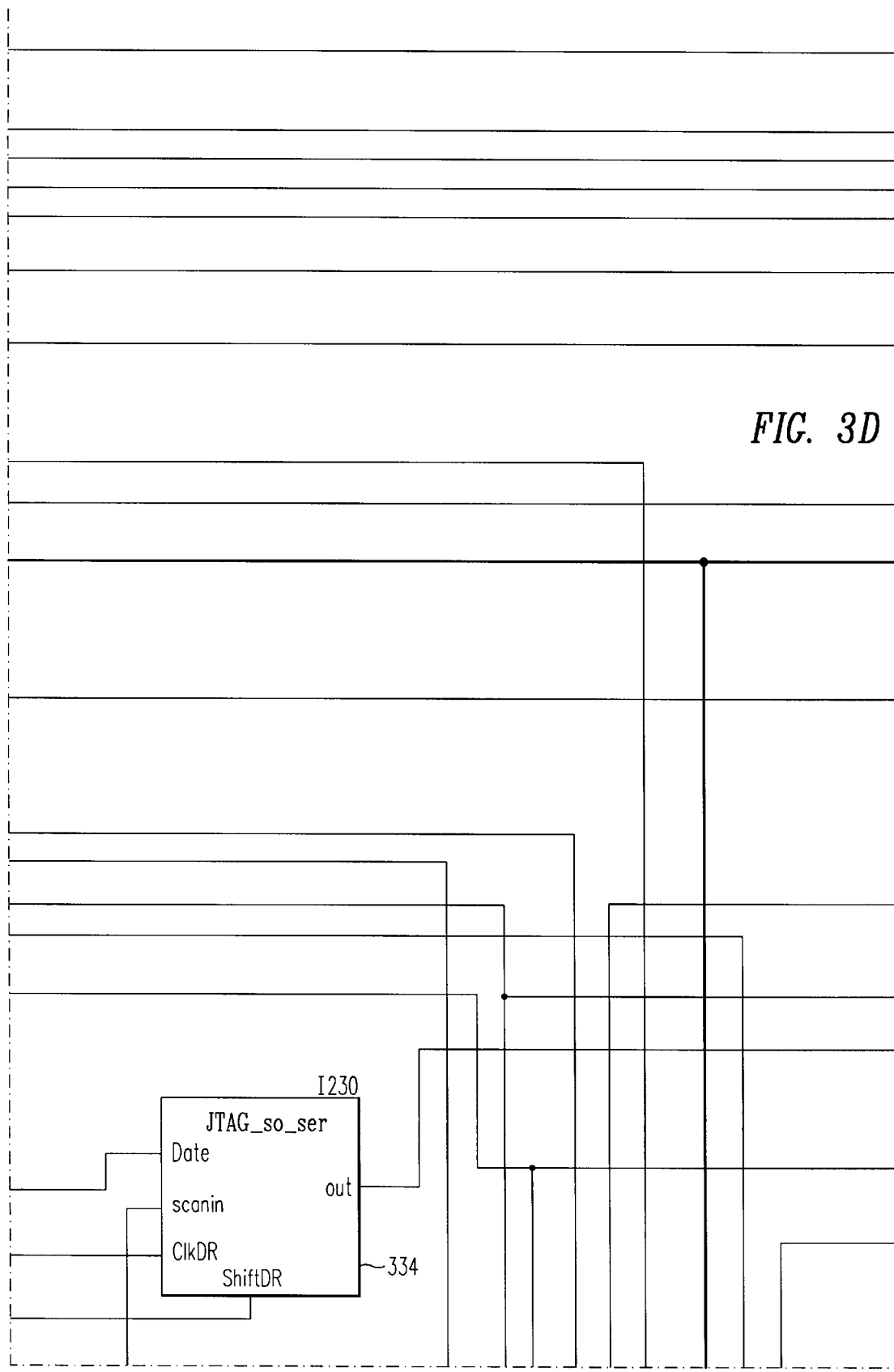
Figure 3E:
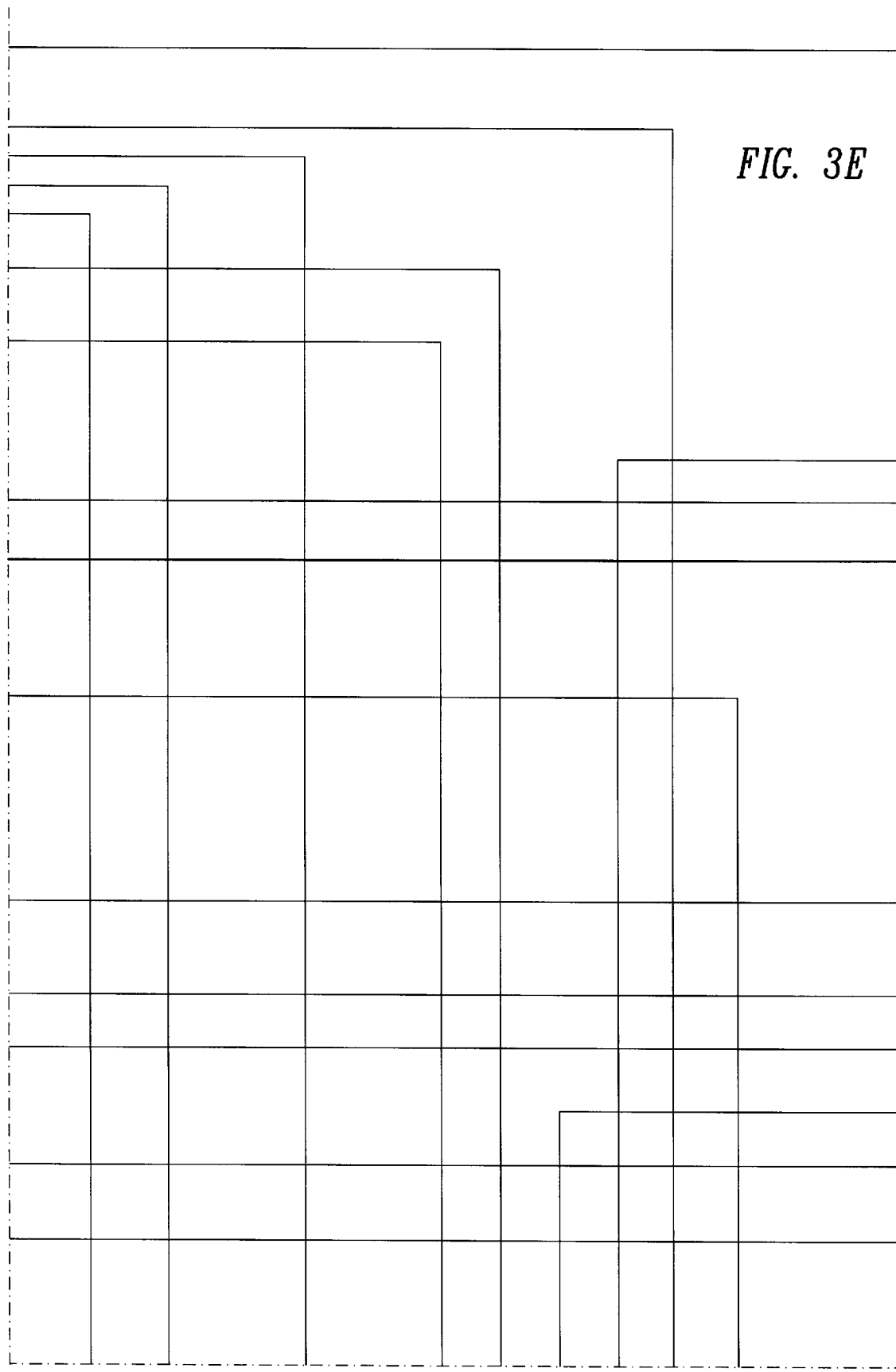
Figure 3F:
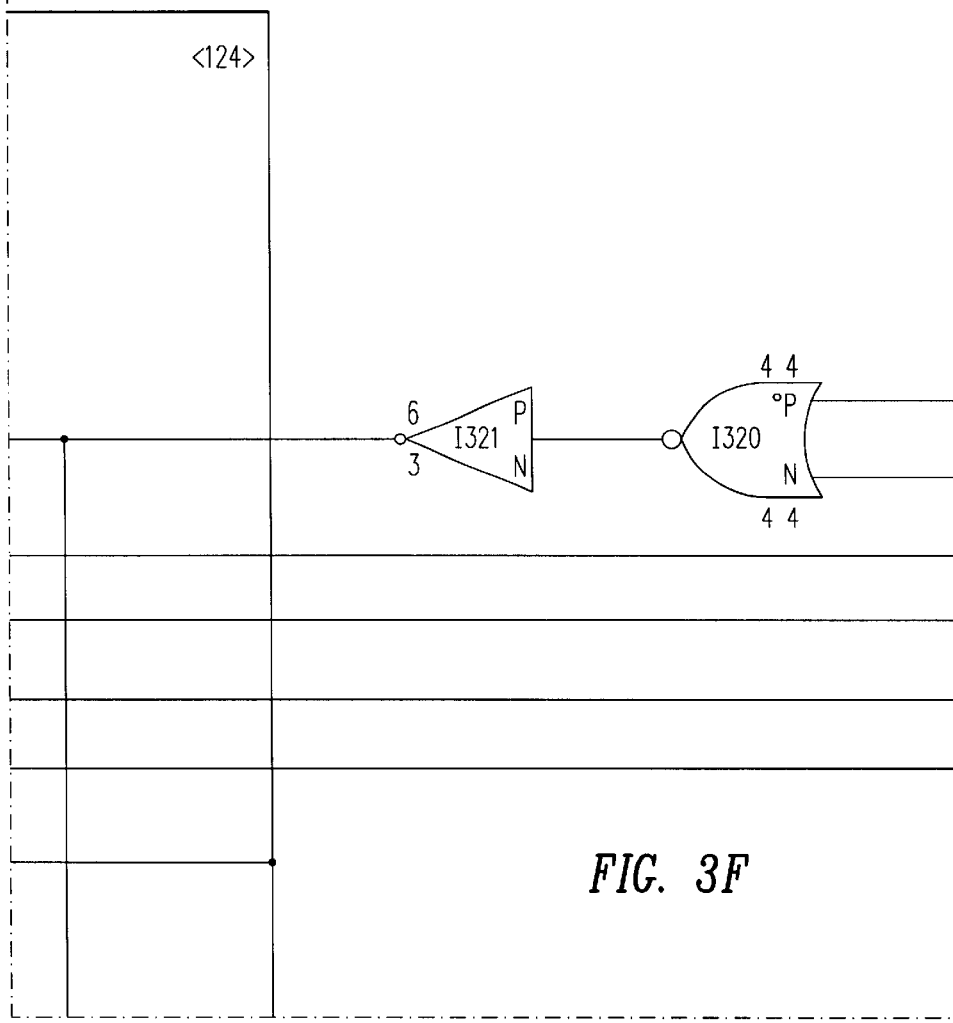
Figure 3H:
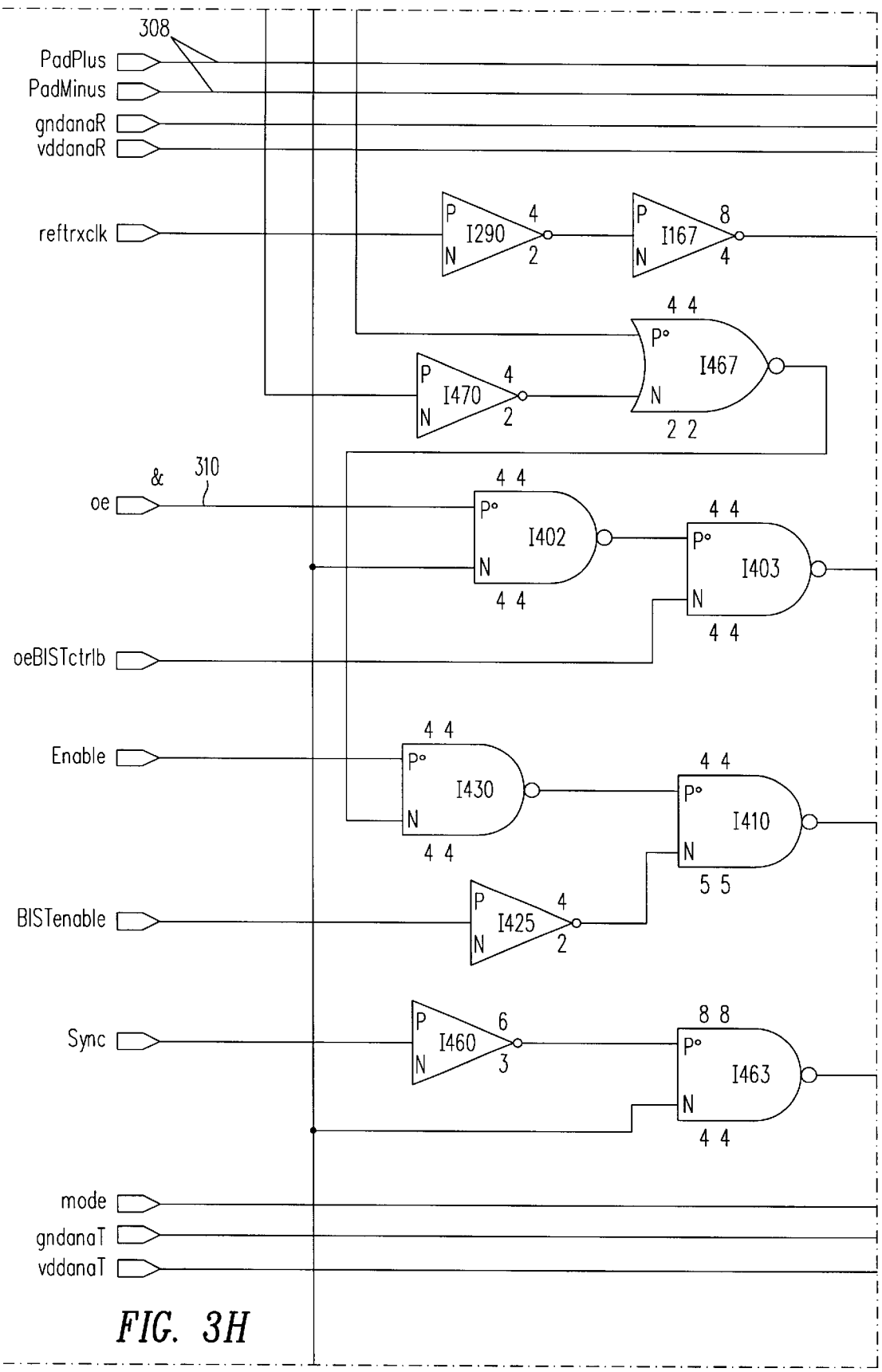
Figure 3I:
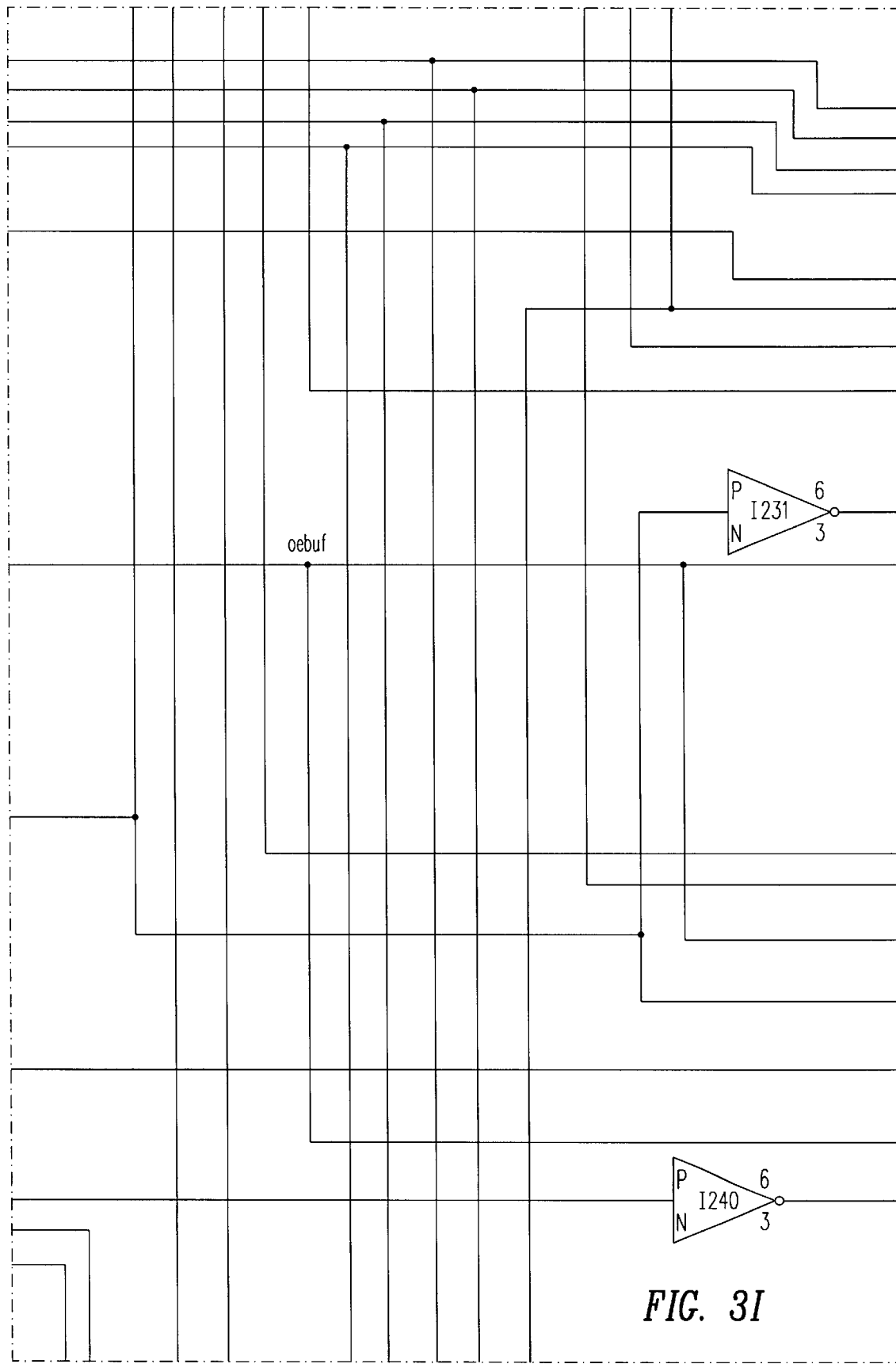
Figure 3J:
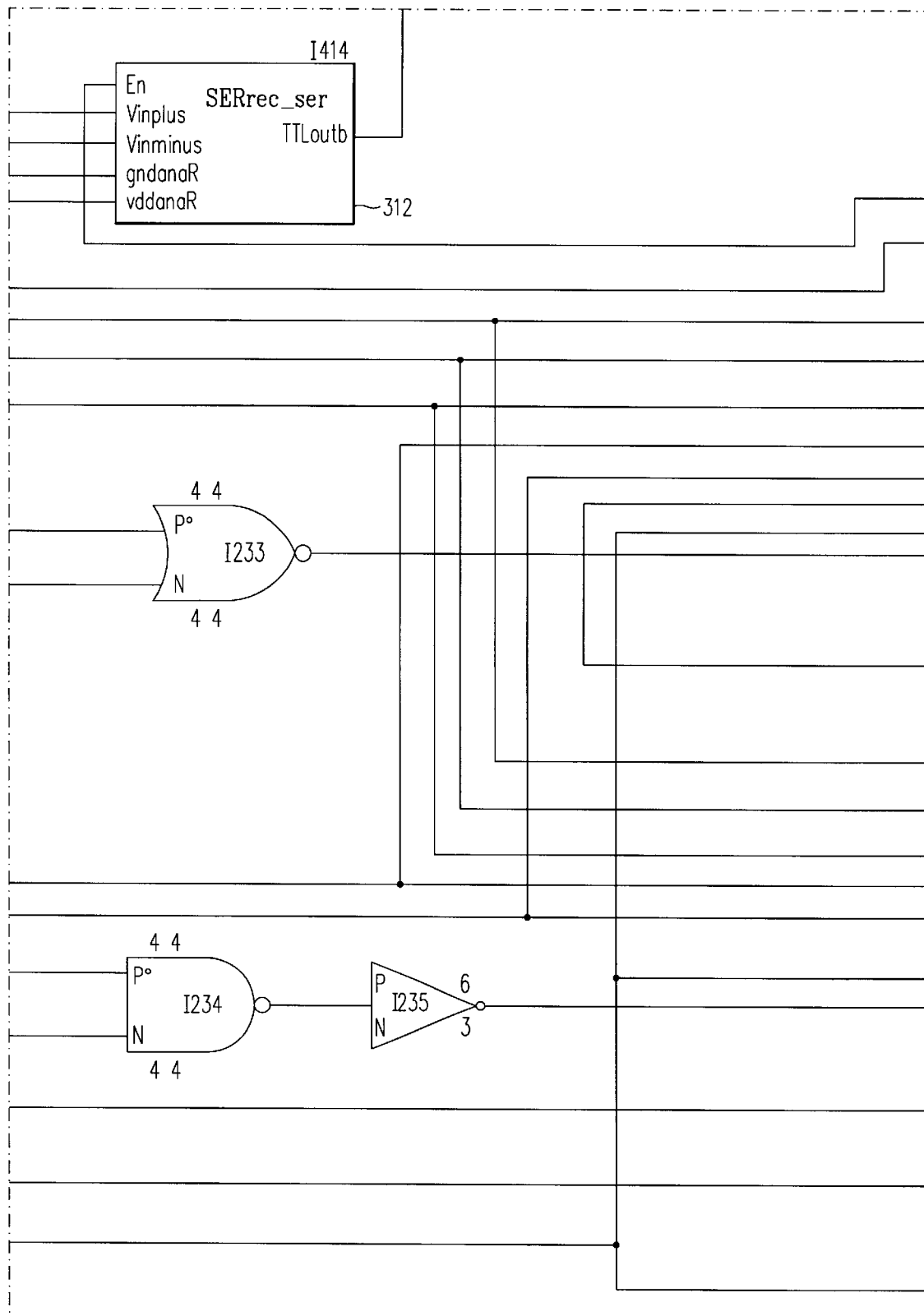
Figure 3K:
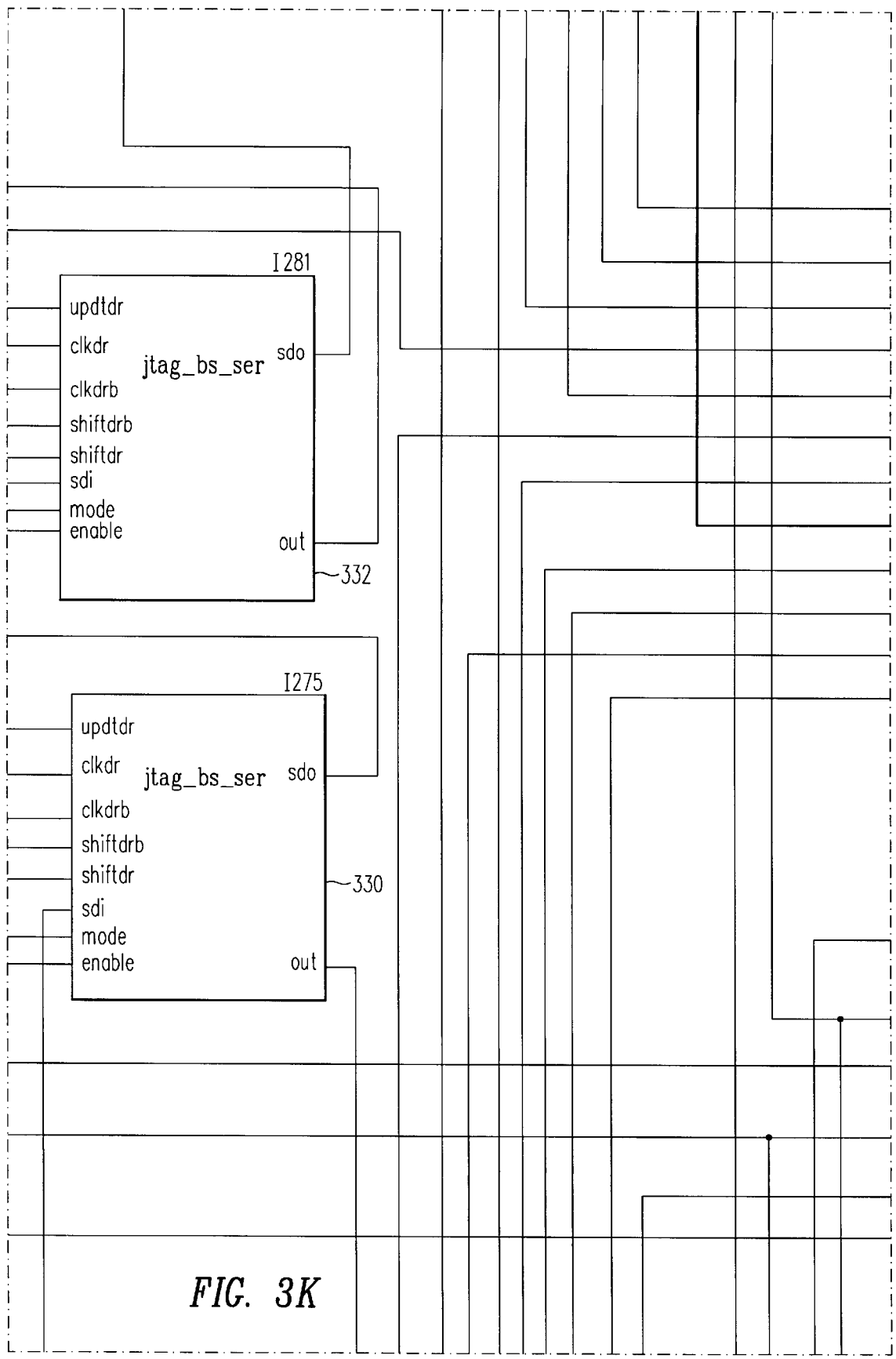
Figure 3L:
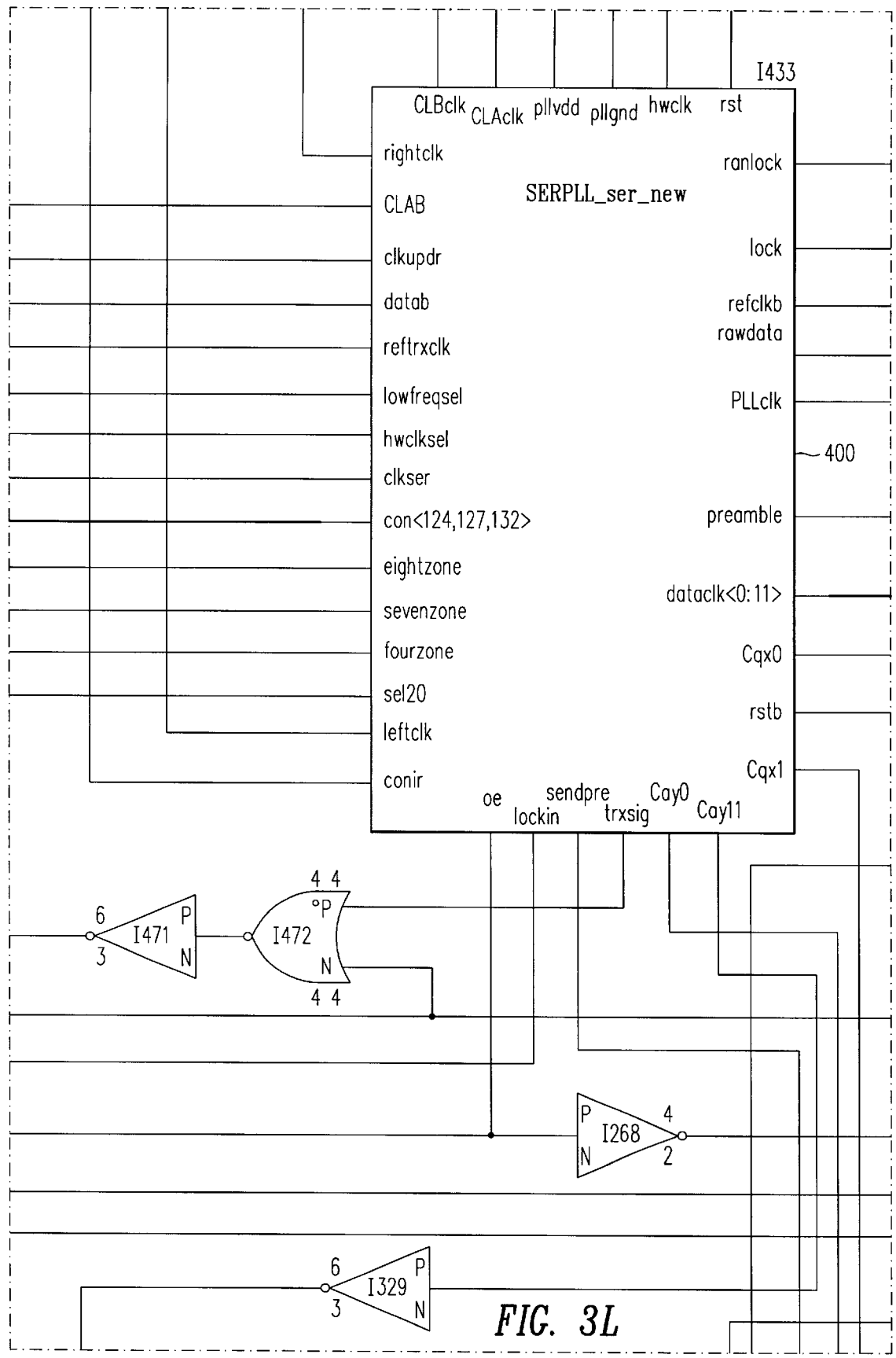
Figure 3M:
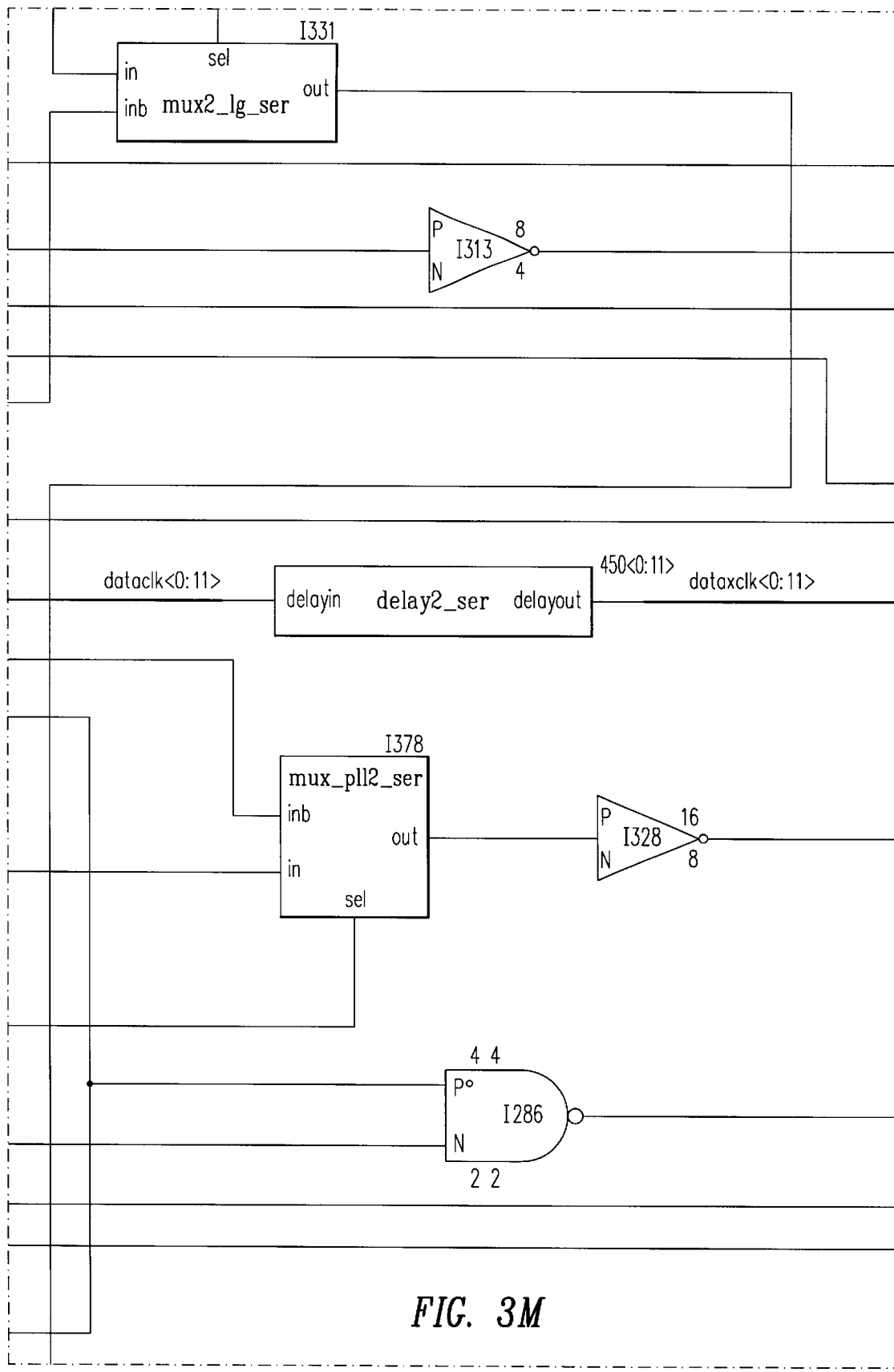
Figure 3N:
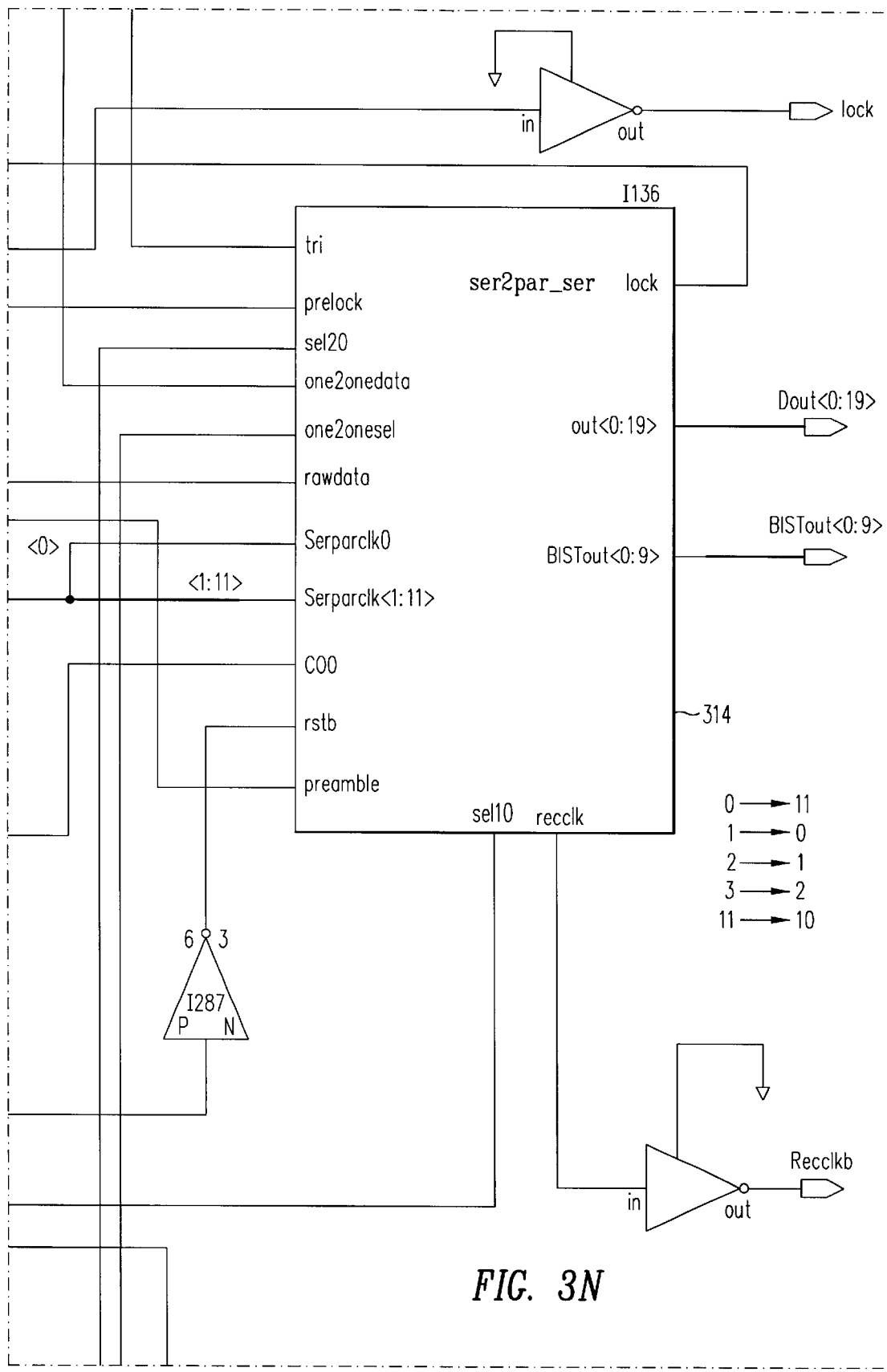
Figure 30:
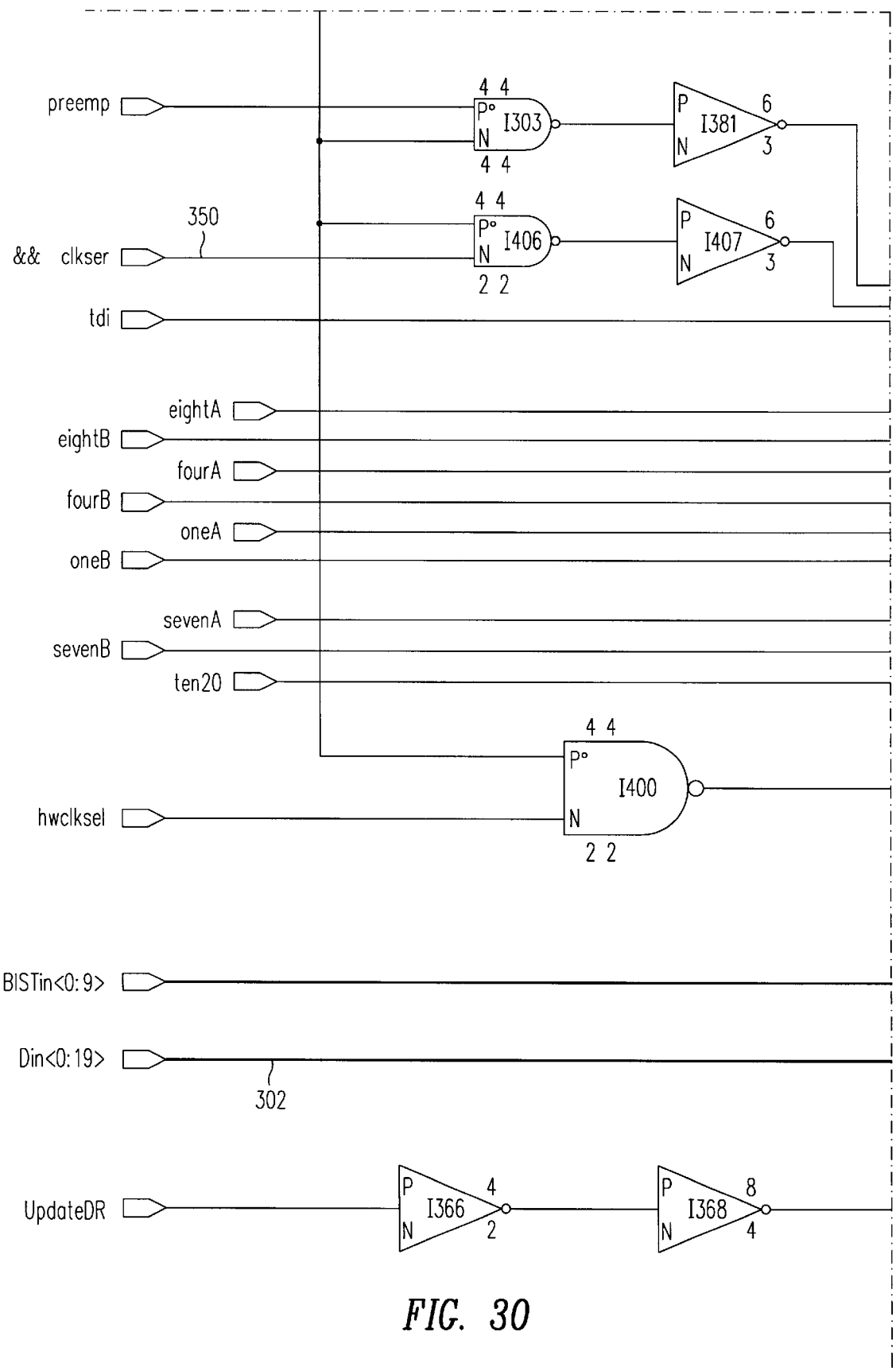
Figure 3P:
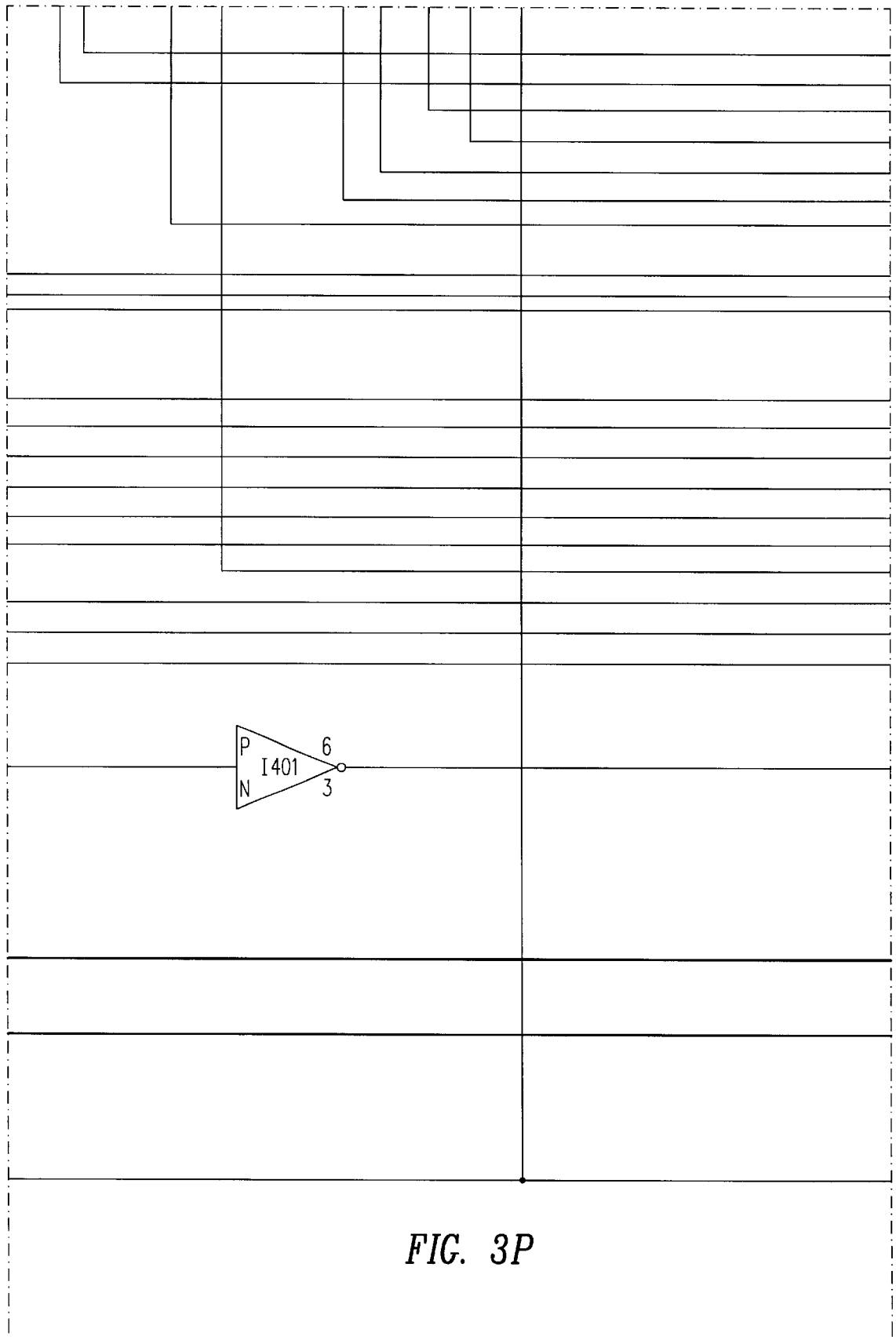
Figure 3Q:
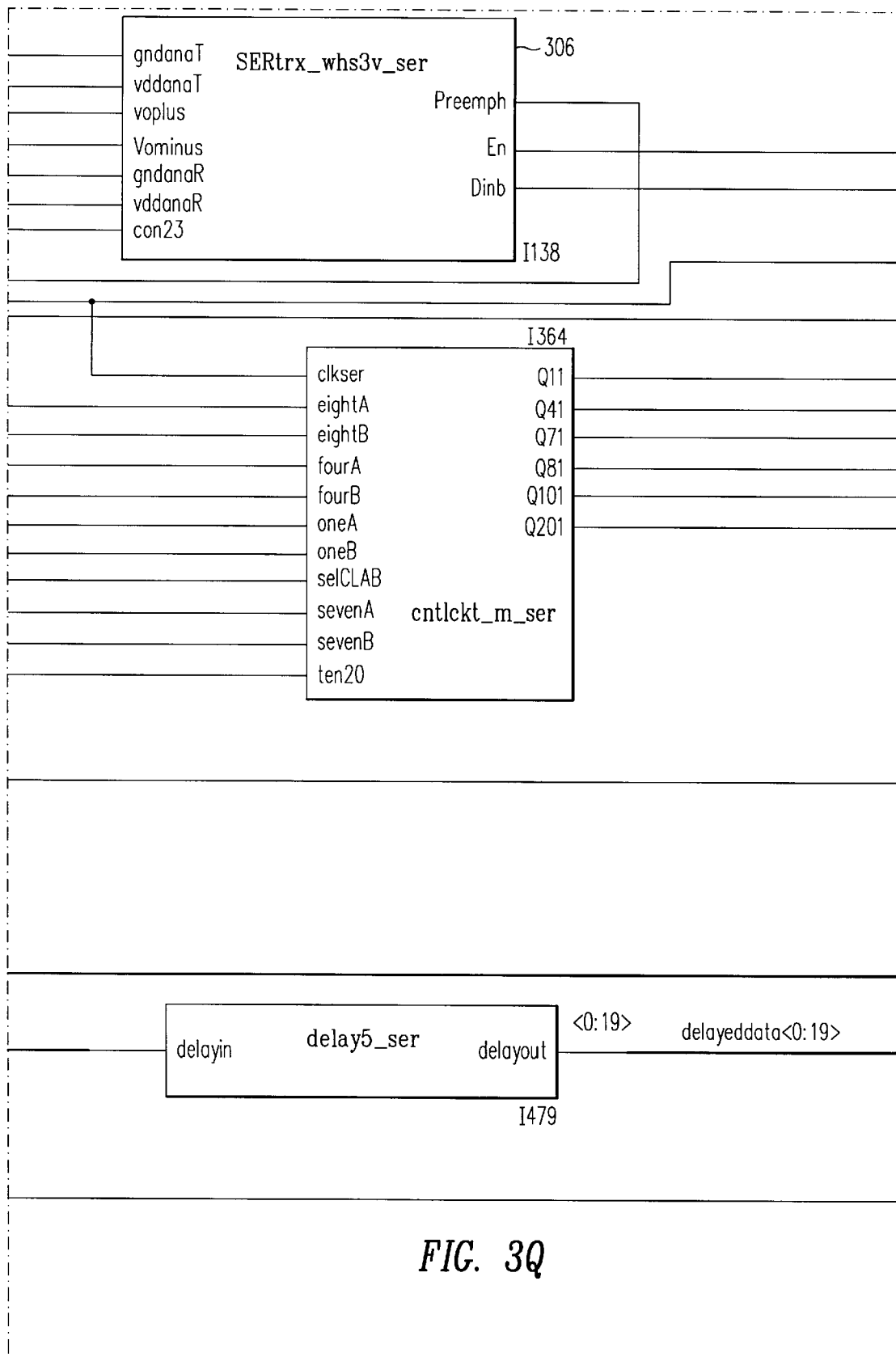
Figure 3R:
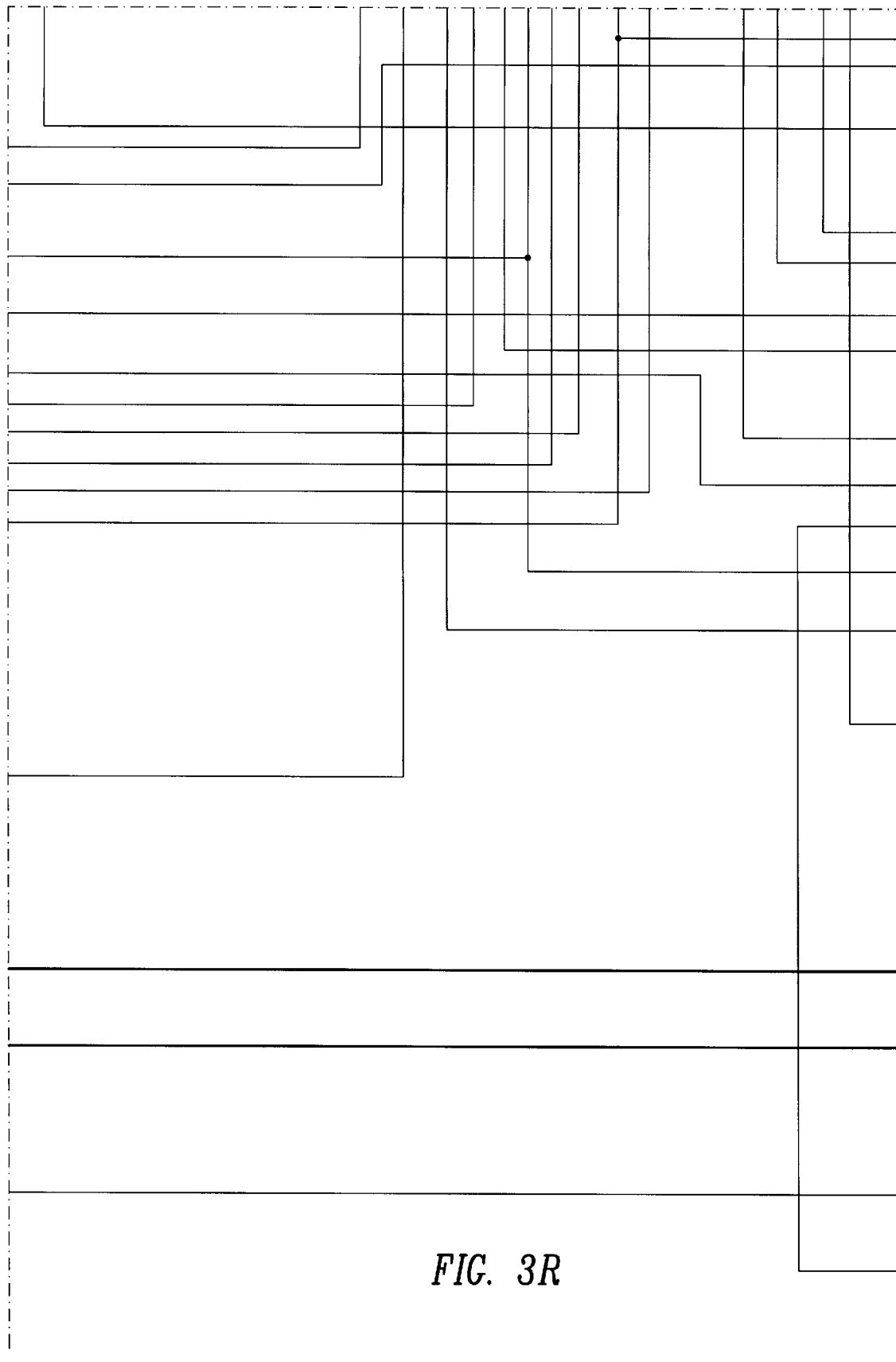
Figure 3S:
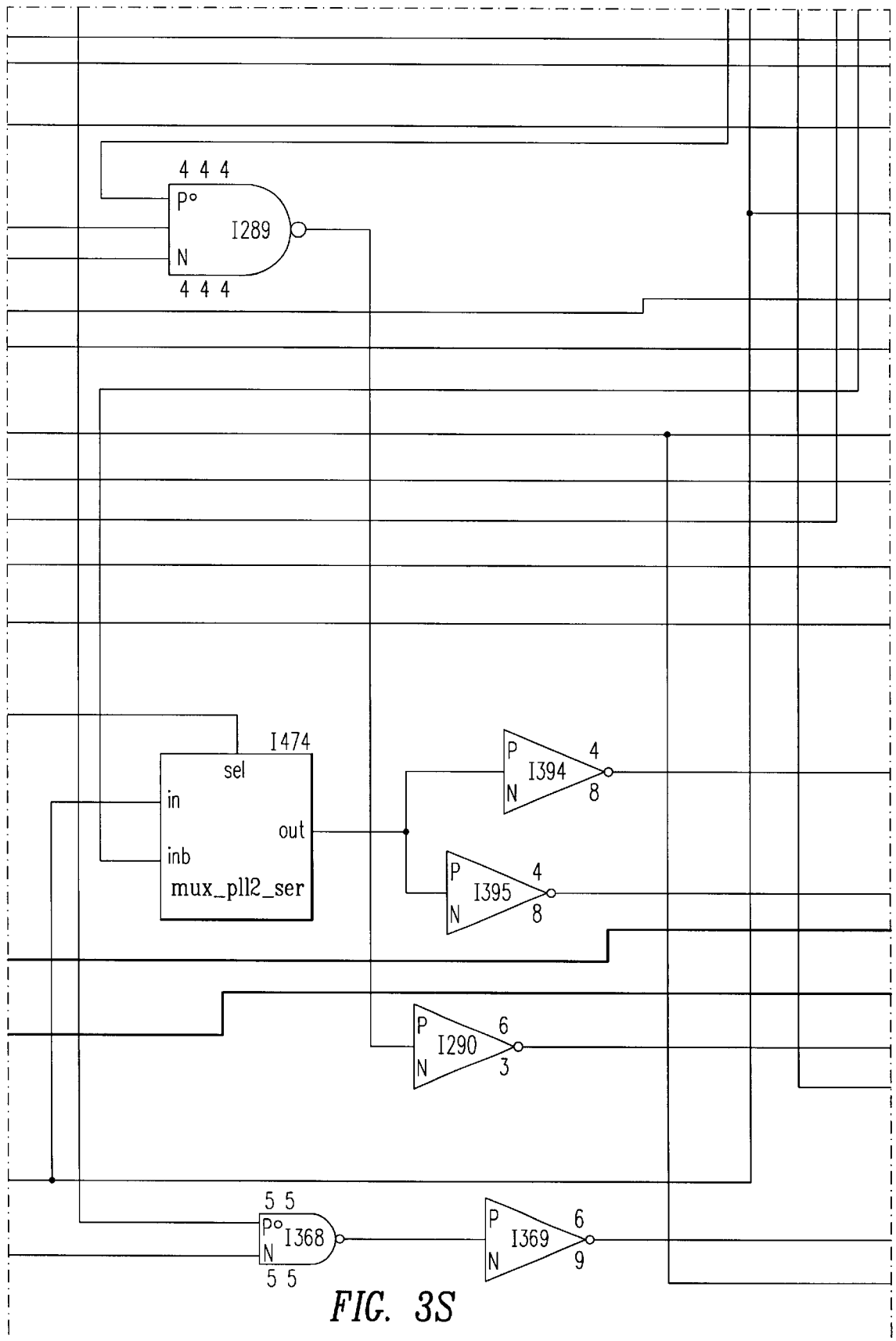
Figure 3T:
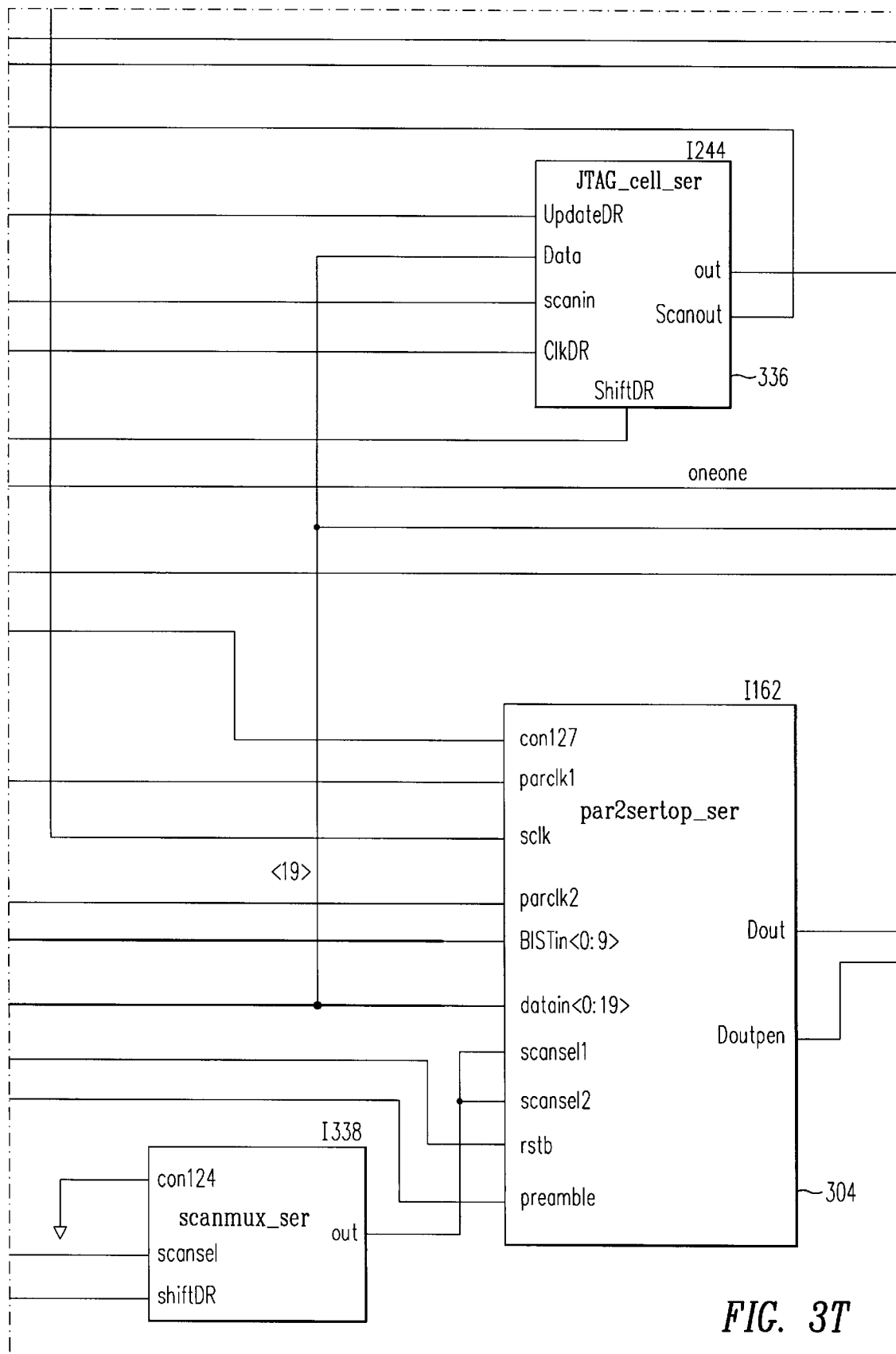
Figure 3U:
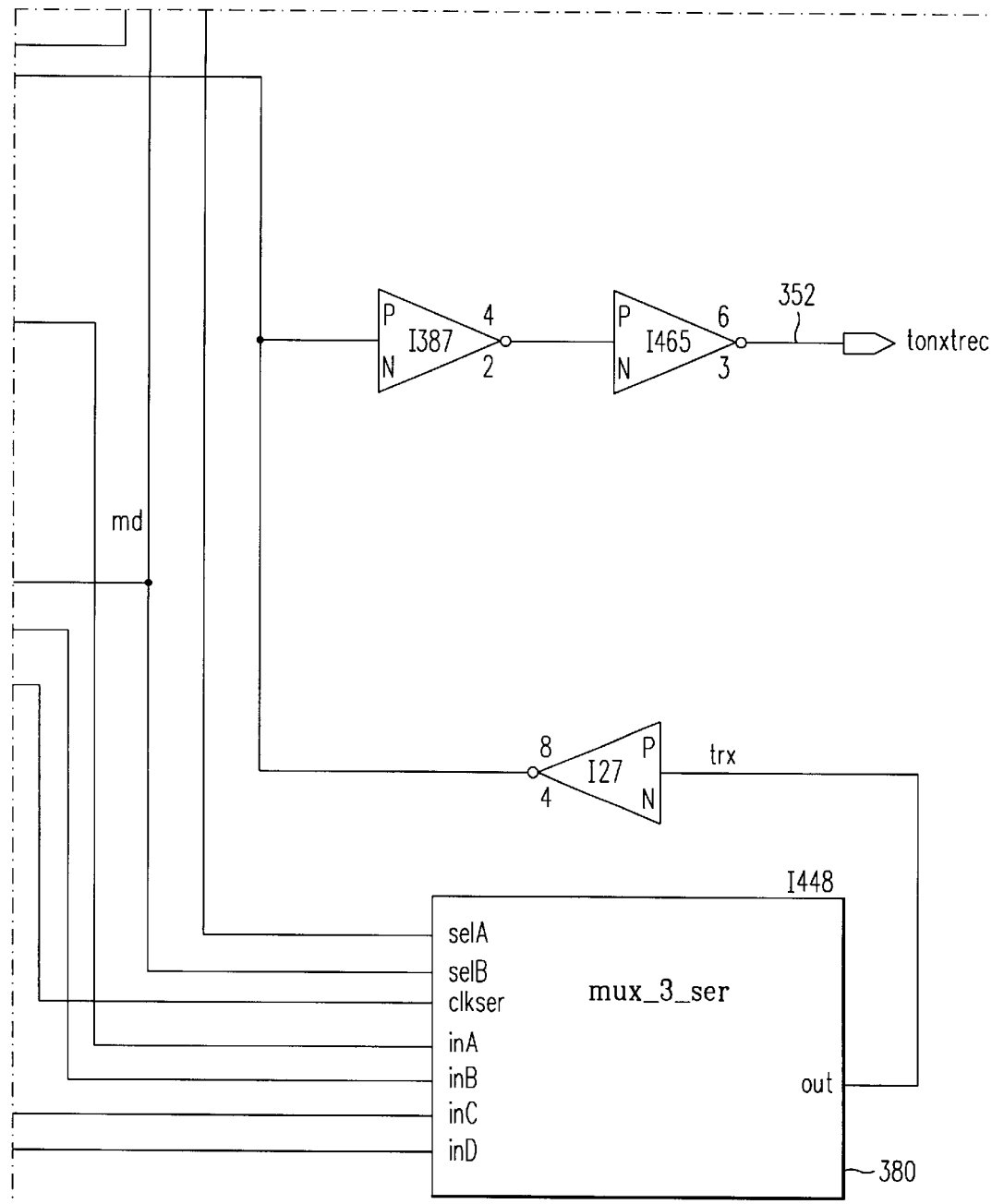

FIG. 1 shows a programmable device 100, such as a field programmable gate array. Device 100 includes I/O blocks 102 for connecting device 100 to external circuitry, and a bank of logic cells 106. As shown in FIG. 1, if desired, device 100 may include embedded circuitry such as RAM 104 and/or additional embedded circuit 105, which may perform any desired function. The RAM 104 and/or embedded circuit 105 may be a non-programmable or partially programmable application specific integrated circuit (ASIC) design. For more information on embedded circuits, such as RAM 104 and embedded circuit 105, see e.g. U.S. Ser. No. 09/650,773, entitled "Integrated Circuit Including Dedicated And Programmable Logic", and U.S. Ser. No. 09/345,663, titled "RAM with Configurable Depth and Width" and U.S. Ser. No. 09/451,681, titled "Programmable Device With An Embedded Portion For Receiving A Standard Circuit Design", all of which are incorporated herein by reference. The embedded circuit 105 may be, for example, a configurable computational unit, such as that described the U.S. patent application titled "Configurable Computational Unit Embedded In A Programmable Device" having Ser. No. 09/751,538, which is incorporated herein by reference.

FIG. 1 also includes a serializer/deserializer (SERDES) core 110. SERDES core 110 includes 8 data channel blocks 112 and two channel clock blocks 114A and 114B. In other embodiments of the invention, SERDES core 110 may have more or fewer data channel blocks 112 and channel clock blocks 114A and 114B. The right hand side of SERDES core 110, including one channel clock block 114B and four data channel blocks 112 is shown in FIG. 2.

Data channel blocks 112 in SERDES core 110 include circuitry for both transmitting and receiving data. In transmit mode, data channel blocks 112 serialize low speed parallel data such that the data can be transmitted at high speed. In receive mode, data channel blocks 112 deserialize high speed serial data such that the parallel data can be transmitted to the core of device 100. Each data channel block 112 receives a transmit/receive signal 310 which determines whether the data channel block operates in transmit mode or receive mode, by activating one of the transmitter and receiver and deactivating the other.

In accordance with an aspect of the invention, data channel blocks 112 of SERDES core 110 can operate in two modes. In the first mode, a clock signal is embedded with the data stream in transmit mode, and a clock signal is recovered from the data stream in receive mode. This first mode is referred to as clock recovery mode. In clock recovery mode, SERDES core 110 can be programmed to serialize and/or deserialize data streams of variable width, for example 10 or 20 bits wide. In the second mode, no clock signal is embedded with or recovered from the data stream. Rather, a separate clock signal is transmitted with the data. This second mode is referred to as channel clock mode. In channel clock mode, SERDES core 110 can be programmed to serialize and/or deserialize data streams of variable width, for example 1, 4, 7, or 8 bits wide. Each data channel block 112 in SERDES core 110 can be operated independently. Thus, some data channel blocks can be operating in transmit mode while other data channel blocks are operating in receive mode, and some data channel blocks can be operating in clock recovery mode while other data channel blocks are operating in channel clock mode. Each data channel block 112 receives a mode selection signal 350 which determines whether the data channel block operates in clock recovery mode or in channel clock mode.

FIG. 3 illustrates a data channel block 112 of FIG. 1 in more detail. When transmit/receive selection signal 310 is high, the data channel block is in transmit mode. When transmit/receive selection signal 310 is low, the data channel block is in receive mode.

Figure 4:
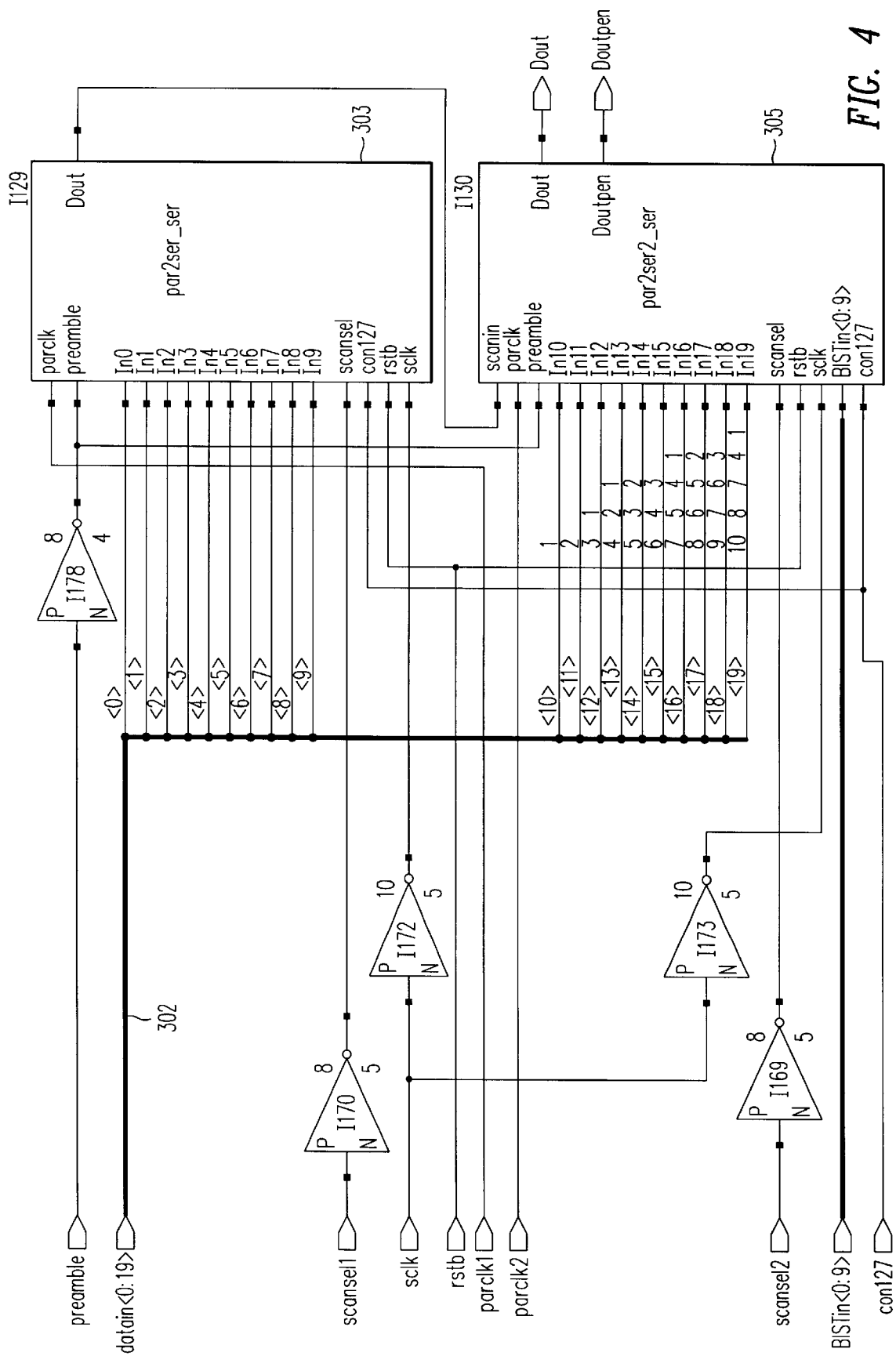
FIG. 4 is a schematic diagram of a parallel-to-serial block.
Figure 5C:
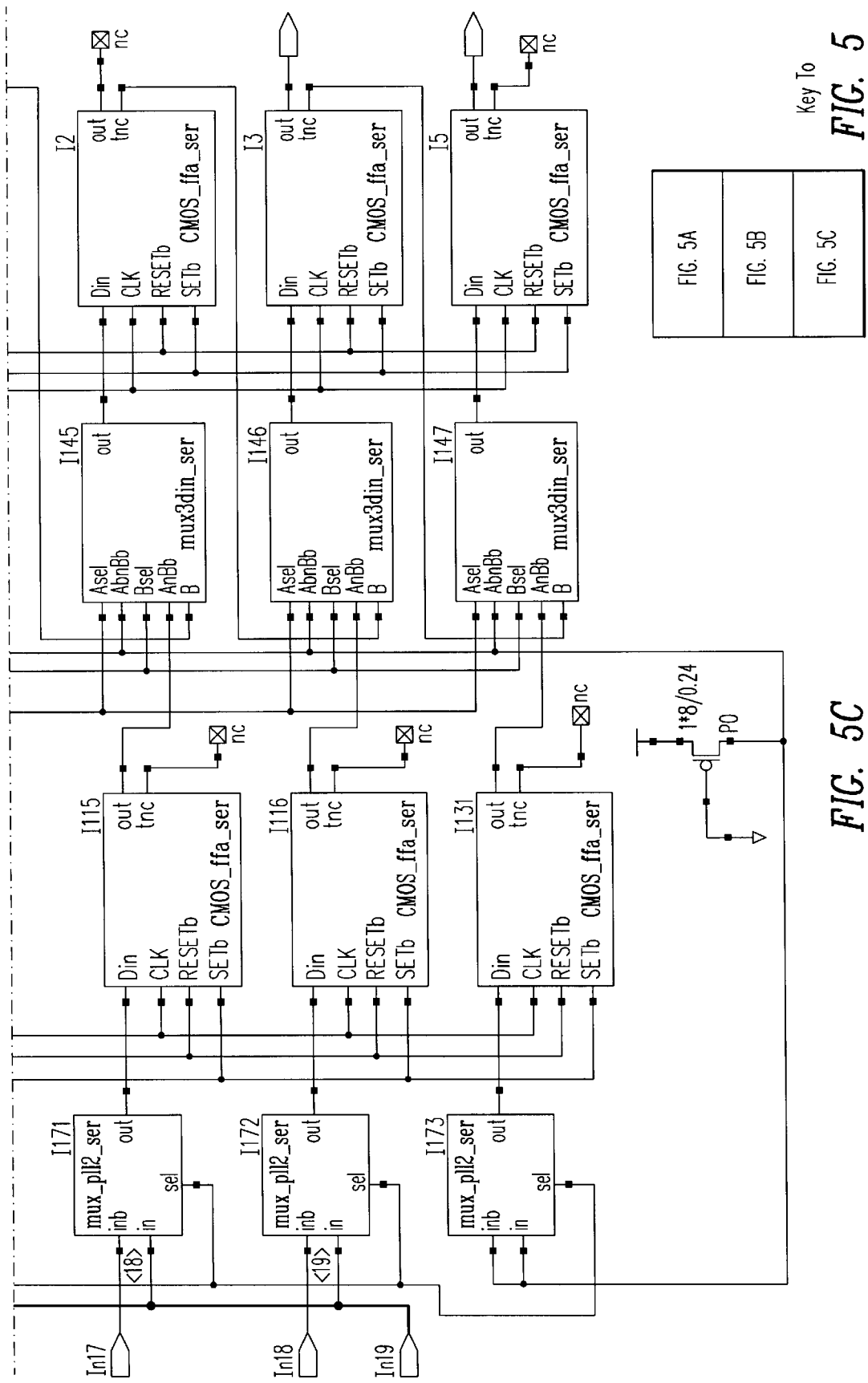
FIG. 5 is a schematic diagram of a register block in a parallel-to-serial block.
Figure 5A:
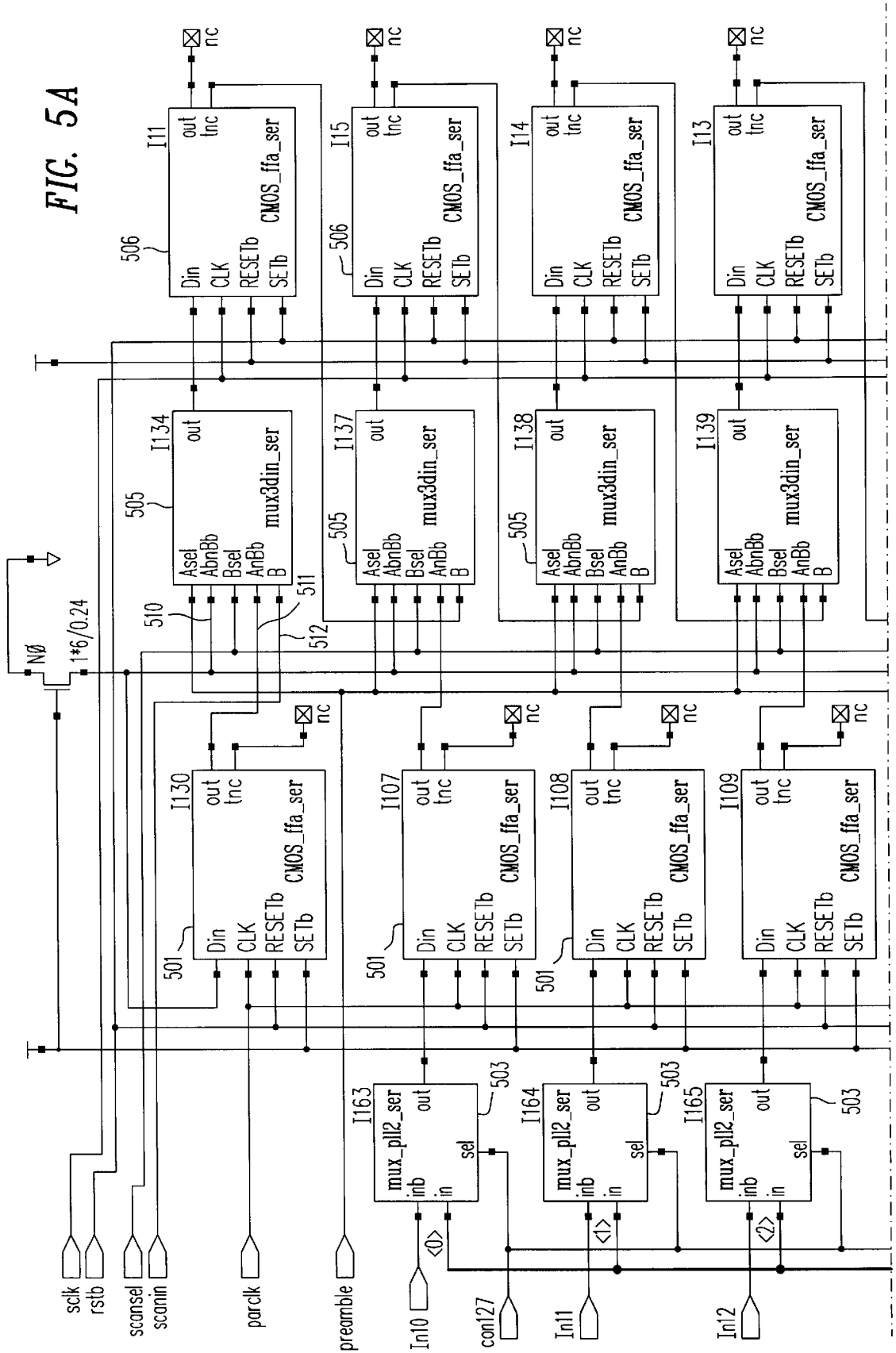
Figure 5B:
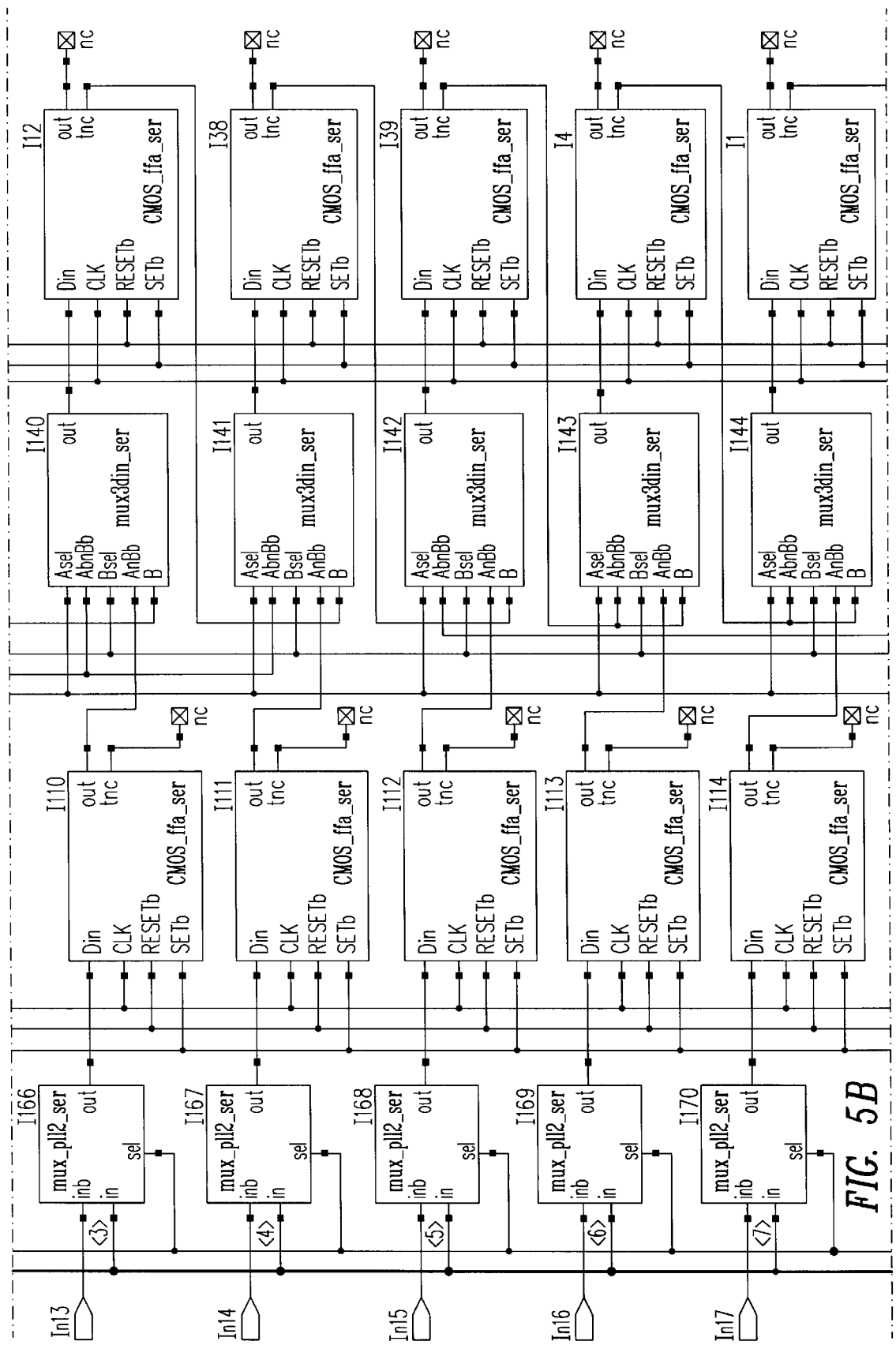
Figure 6A:
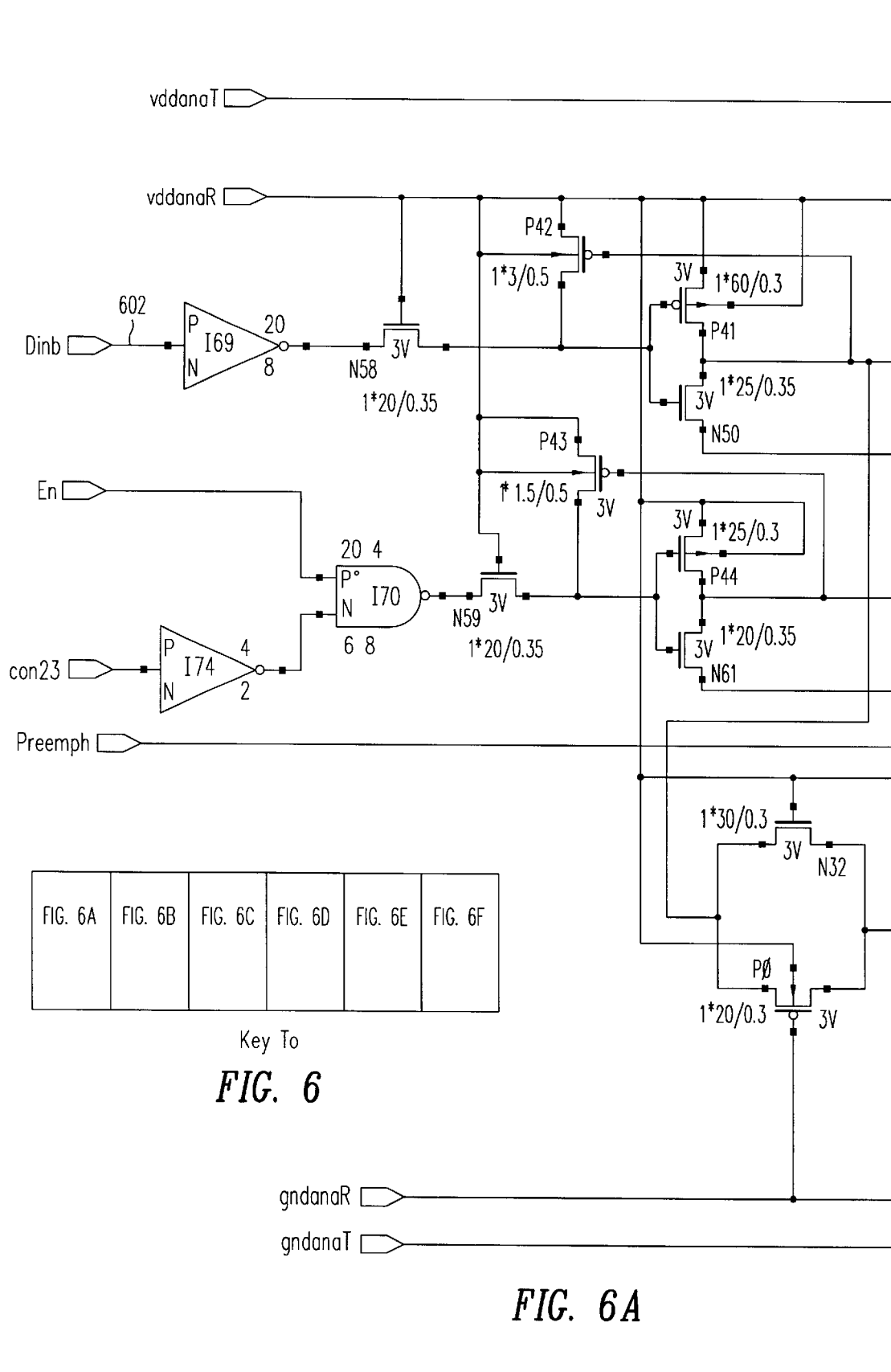
FIG. 6 is a schematic diagram of a transmitter.
Figure 6B:
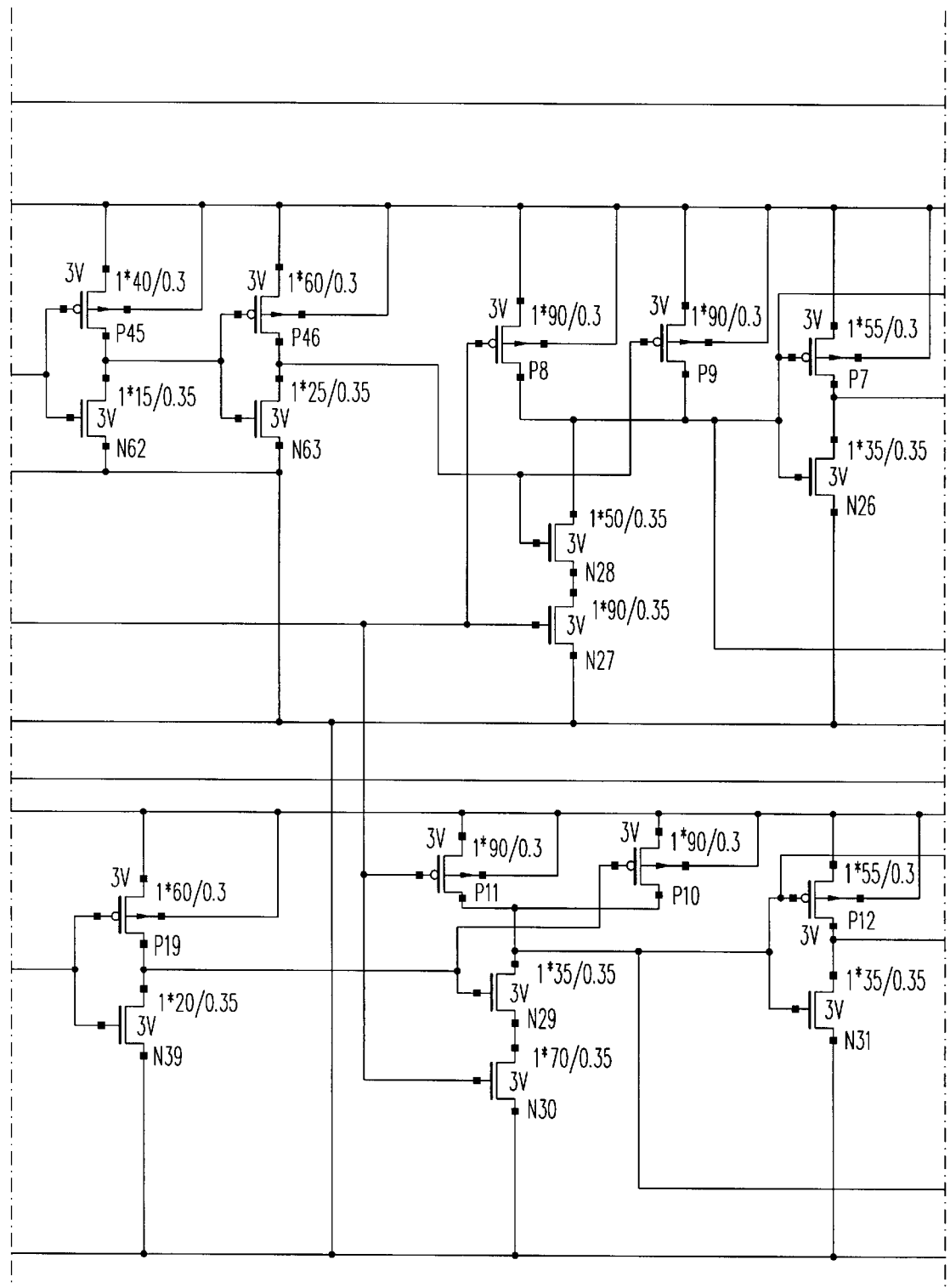
Figure 6C:
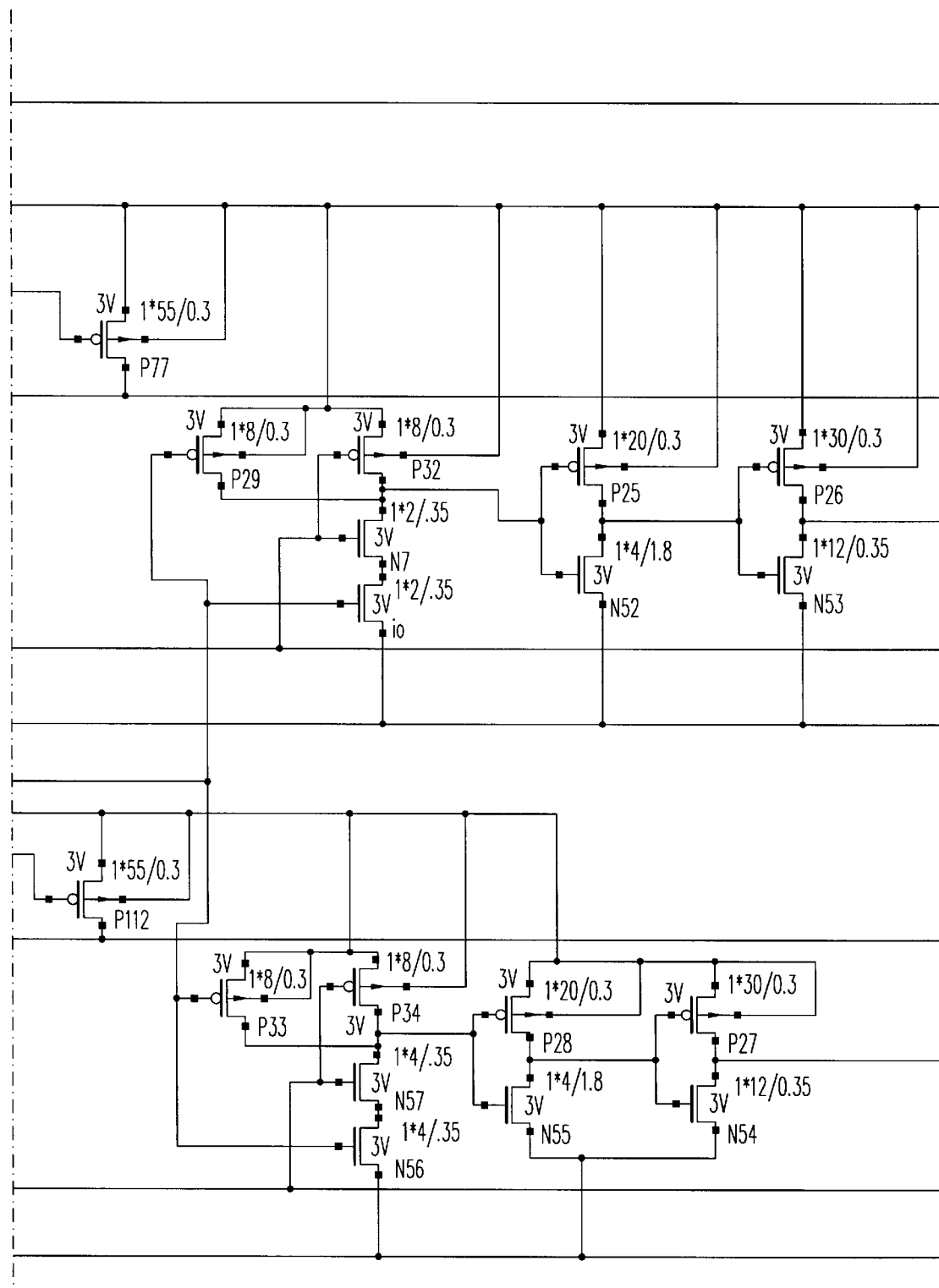
Figure 6D:
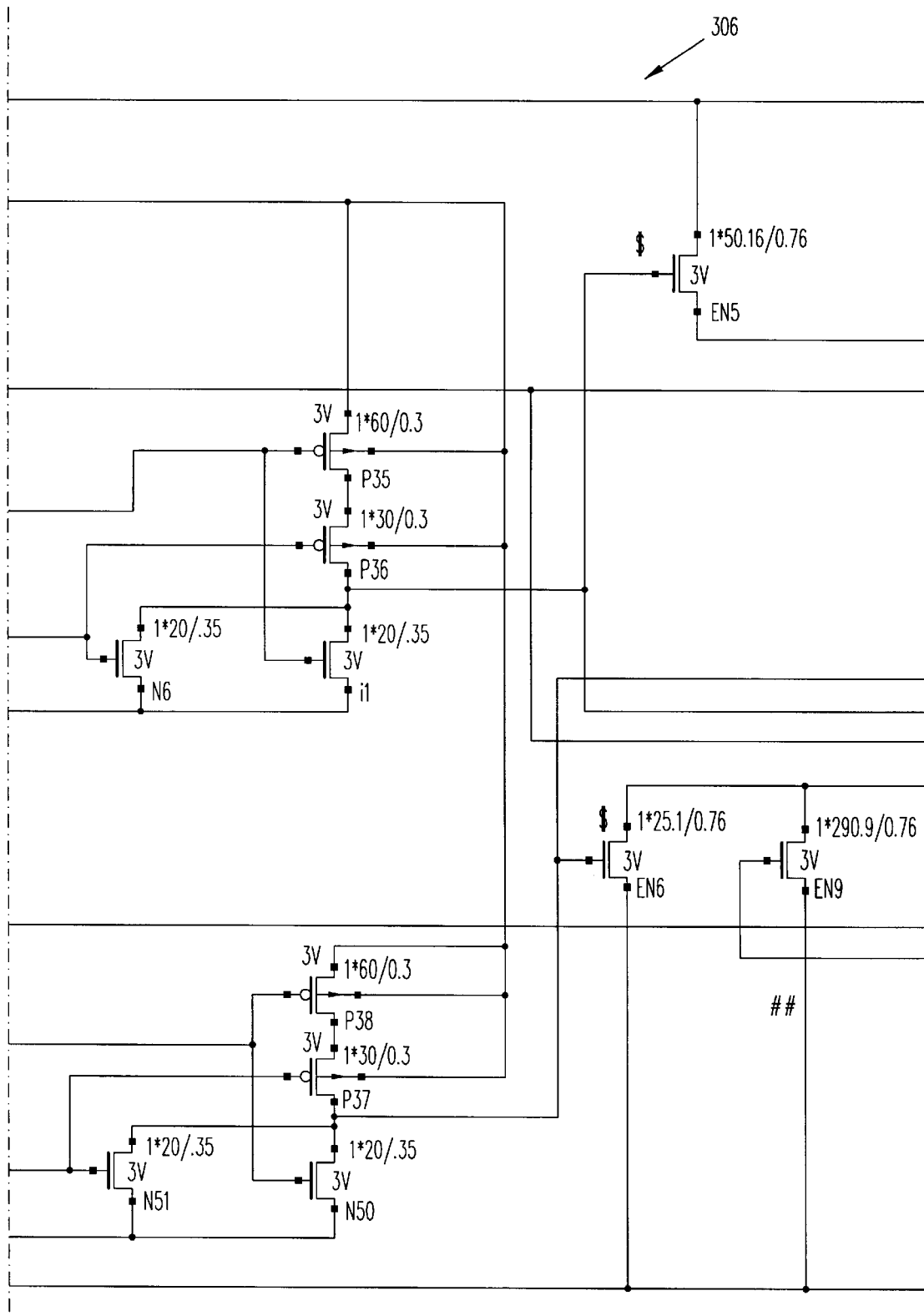
Figure 6E:
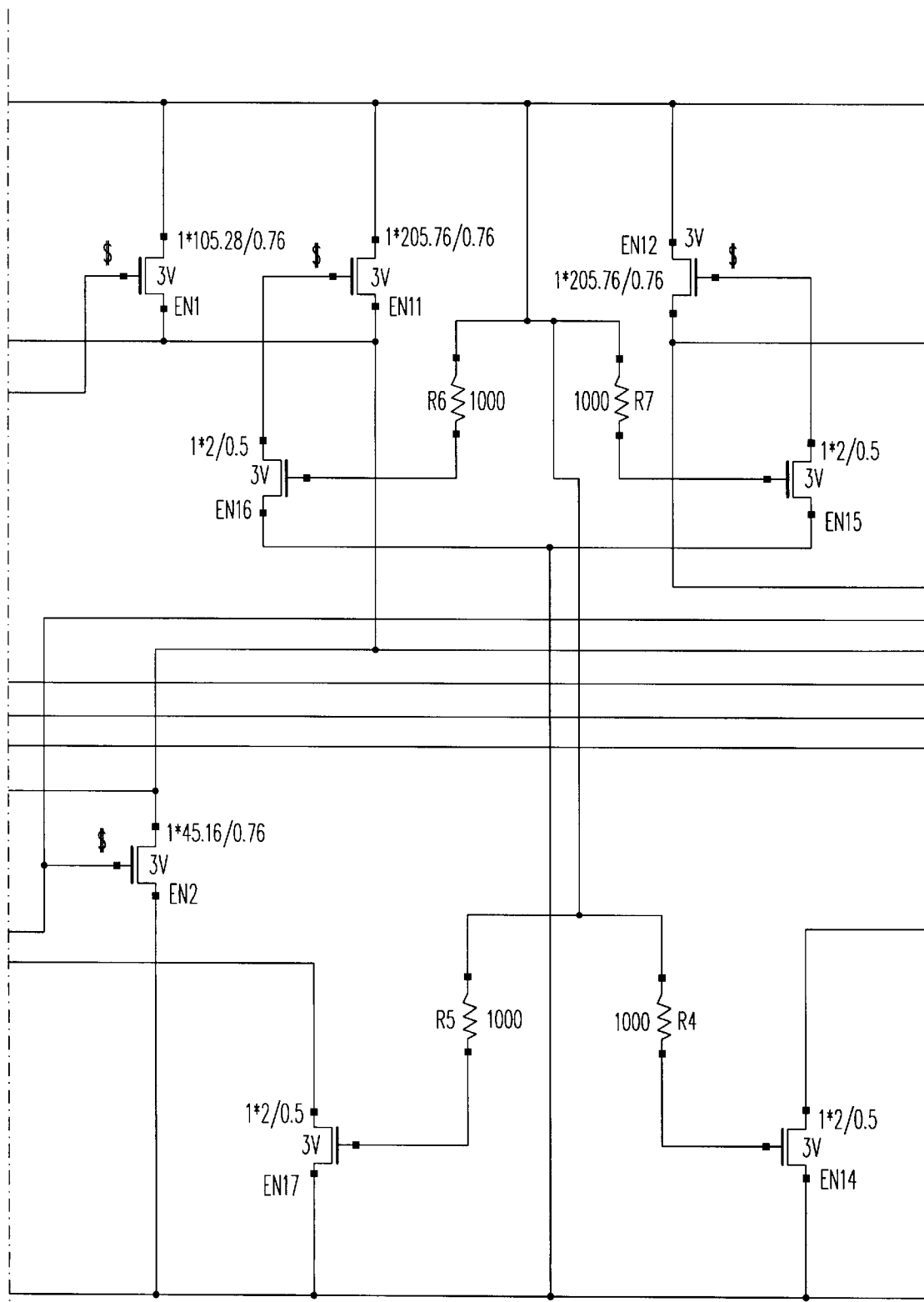
Figure 6F:
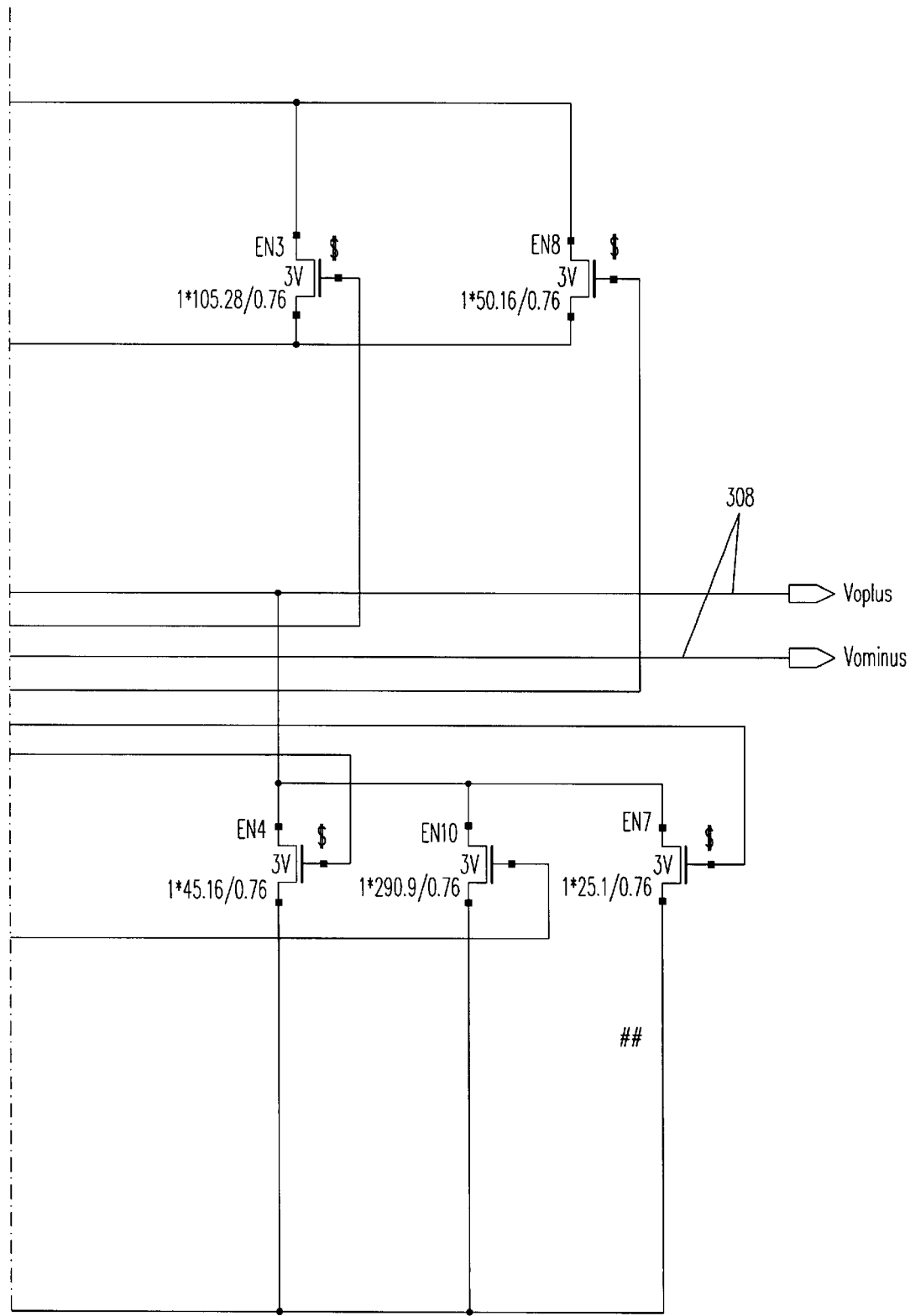

In transmit mode, parallel data on bus 302 is provided to parallel-to-serial block 304 where the data are serialized. Parallel-to-serial block 304 is illustrated in more detail in FIG. 4. Parallel-to-serial block includes two register blocks 303 and 305. Register blocks 303 and 305 are illustrated in more detail in FIG. 5. Register blocks 303 and 305 include a series of registers 501 with inputs connected to a series of multiplexers 503 for built in self testing and outputs connected to a series of multiplexers 505. Parallel data are loaded into registers 501 on the rising edge of a slow clock. Depending on the state of multiplexers 505 either preamble data or actual data are parallel-loaded into registers 506. Multiplexers 505 are then switched to connect registers 506 together and a fast clock generated by a phase locked loop shifts the data, either preamble or actual data, out serially. The serialized data are then provided as an input to transmitter block 306 (FIG. 3) where they are output and provided to pads 308. Transmitter block 306 is illustrated in more detail in FIG. 6. The serialized data are provided on line 602, then output to pads 308. The circuitry shown in FIG. 6 converts the digital TTL/CMOS data to dual-differential data, which are then output to pads 308.

Figure 7:
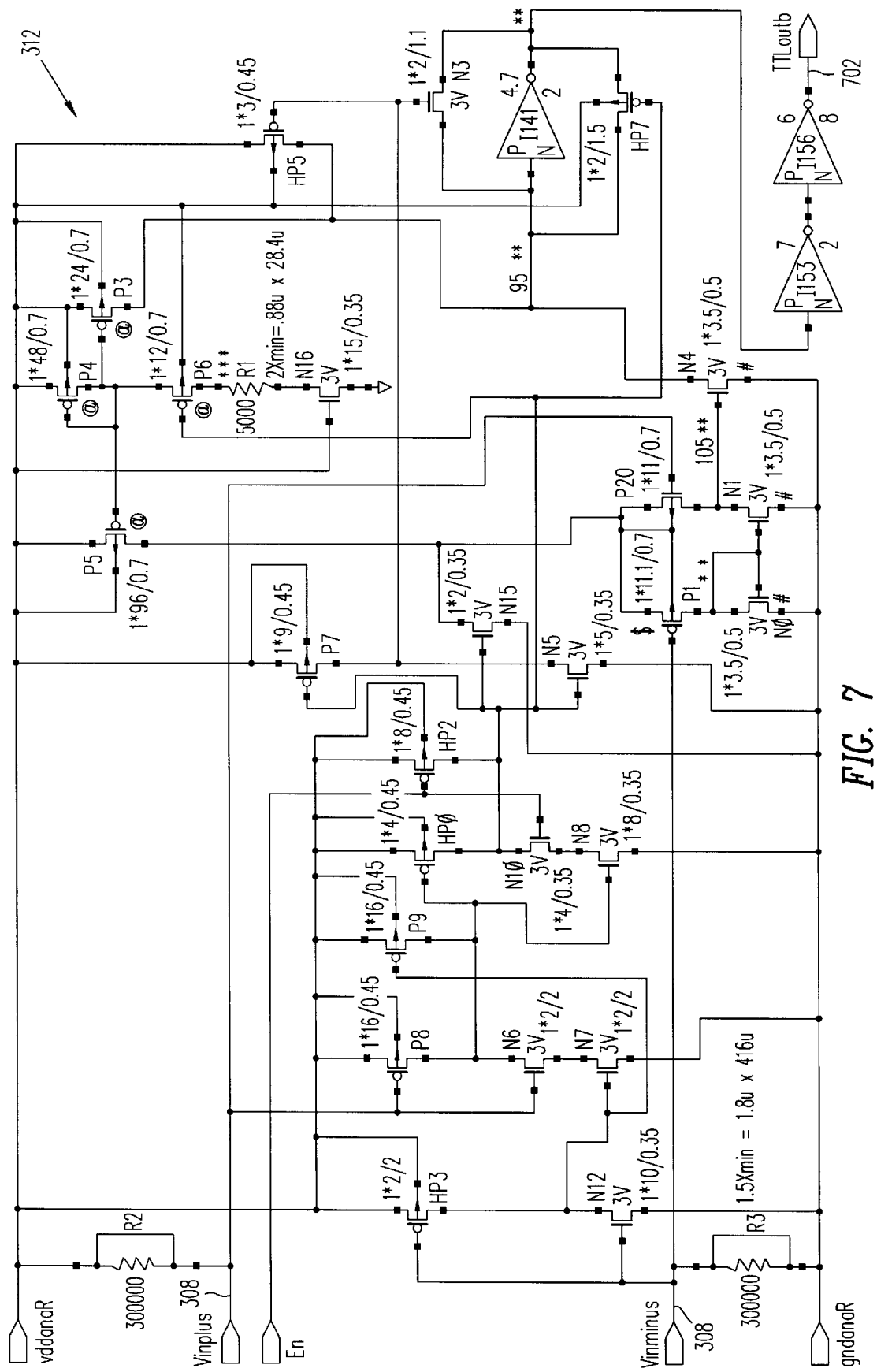
FIG. 7 is a schematic diagram of a receiver.
Figure 8A:
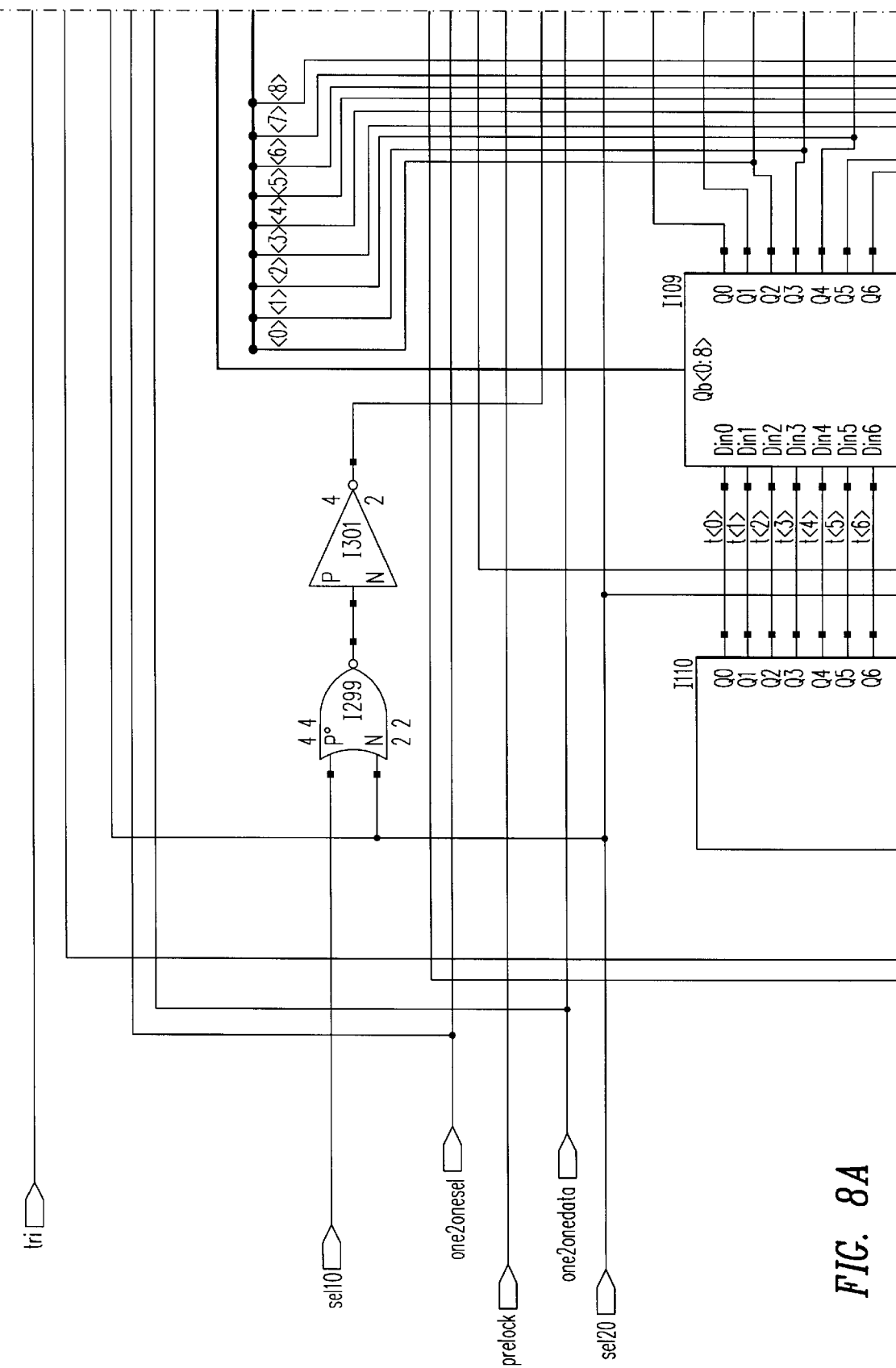
FIG. 8 is a schematic diagram of a serial-to-parallel block.
Figure 8B:
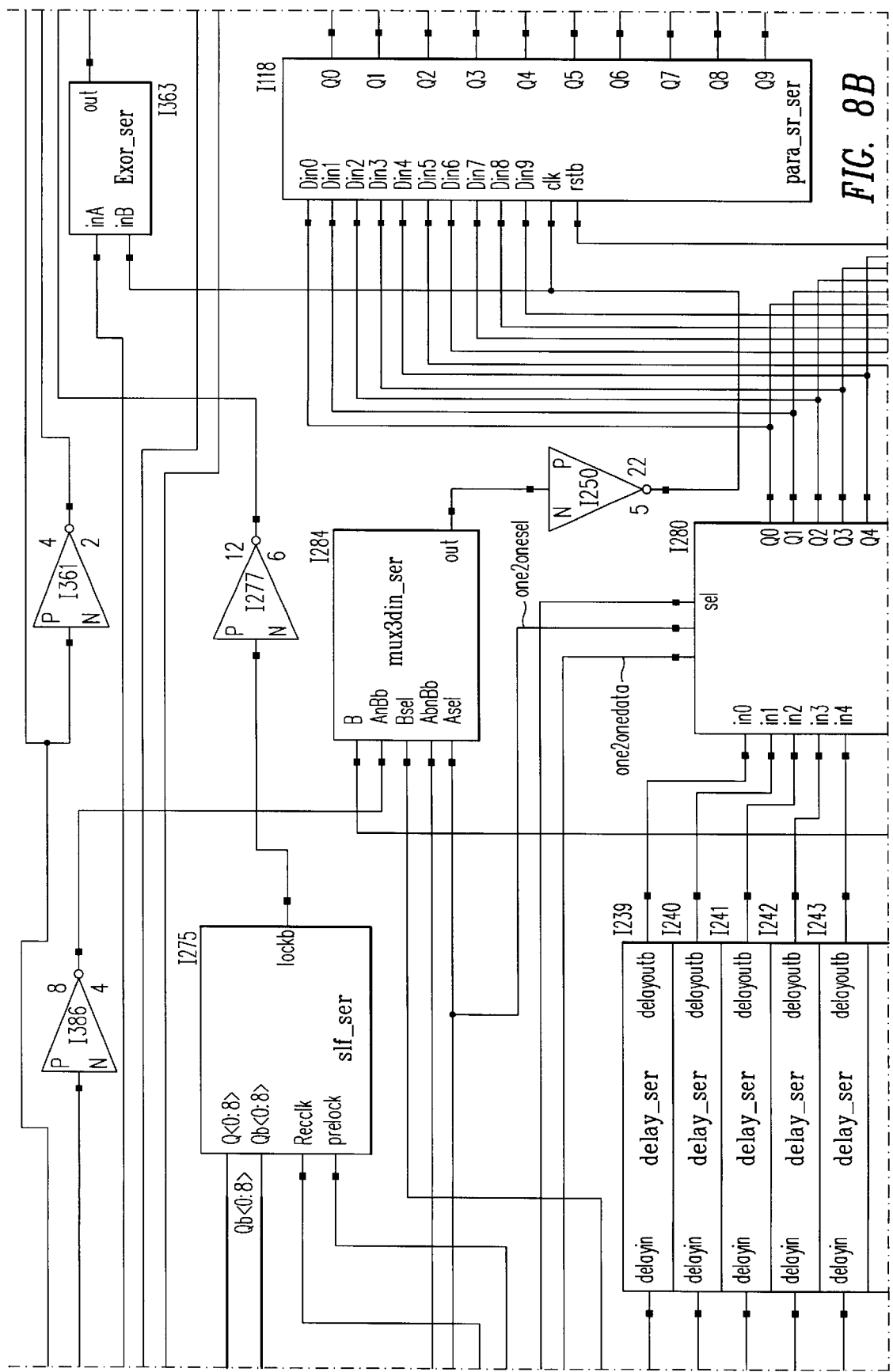
Figure 8C:
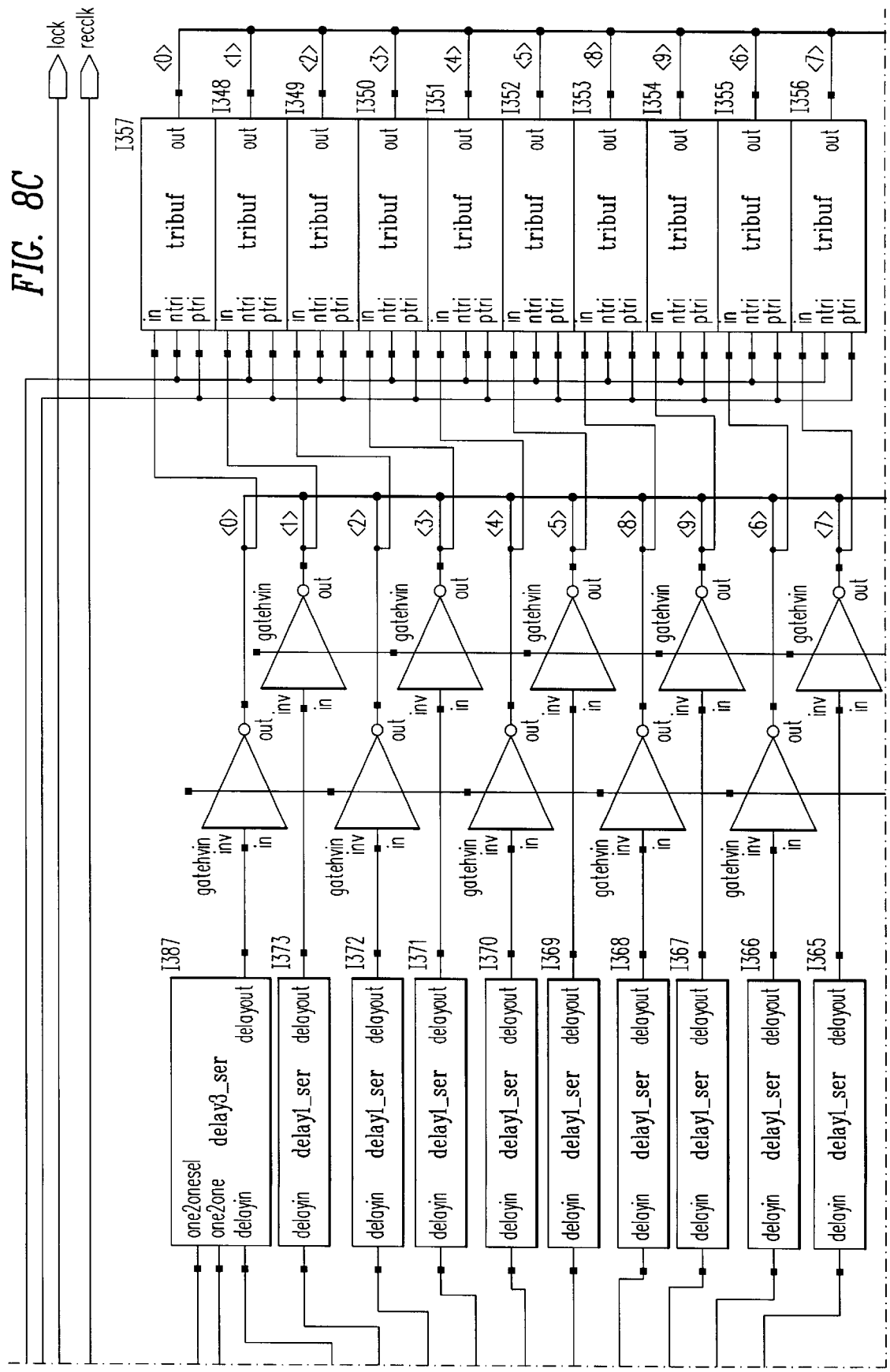
Figure 8D:
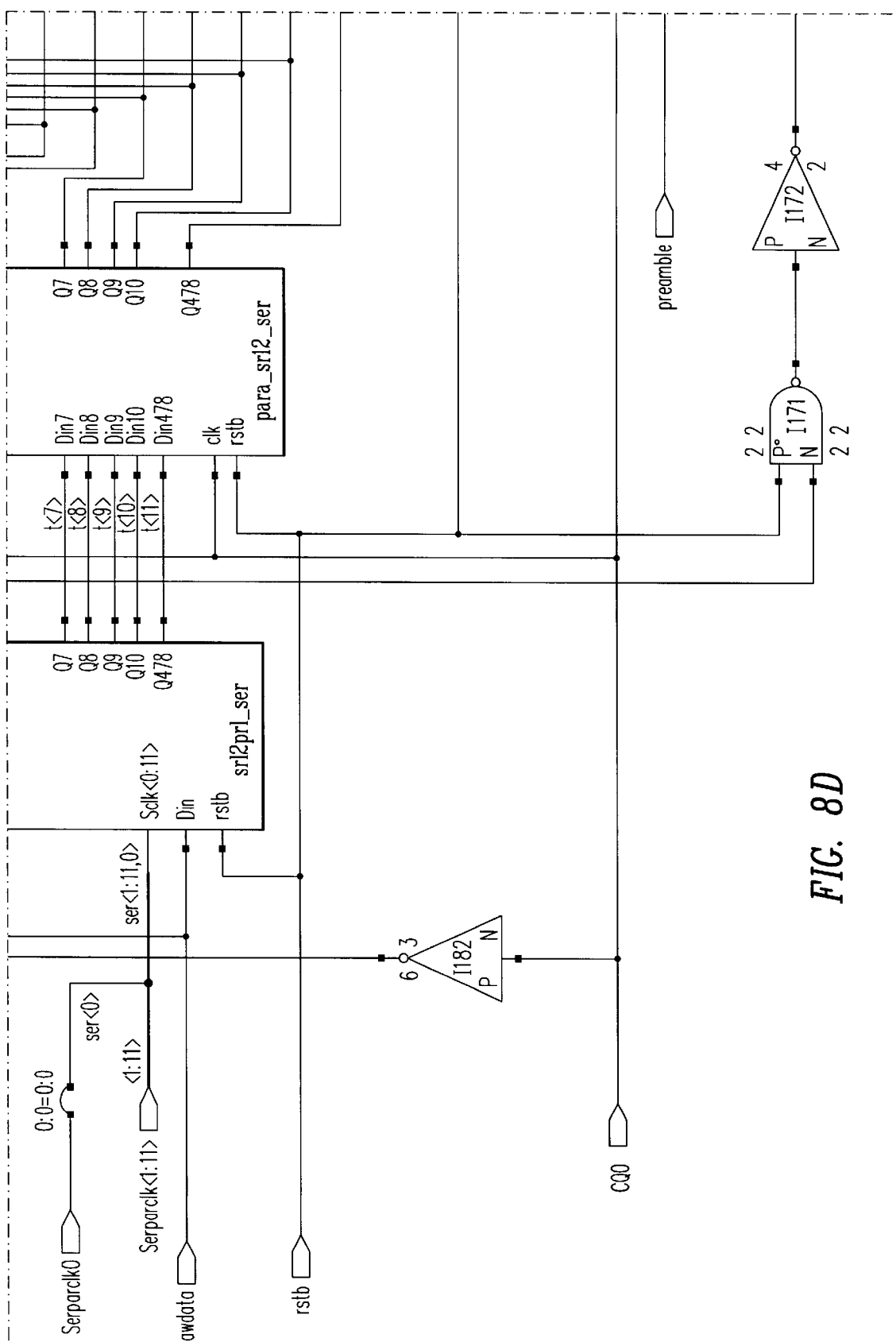
Figure 8E:
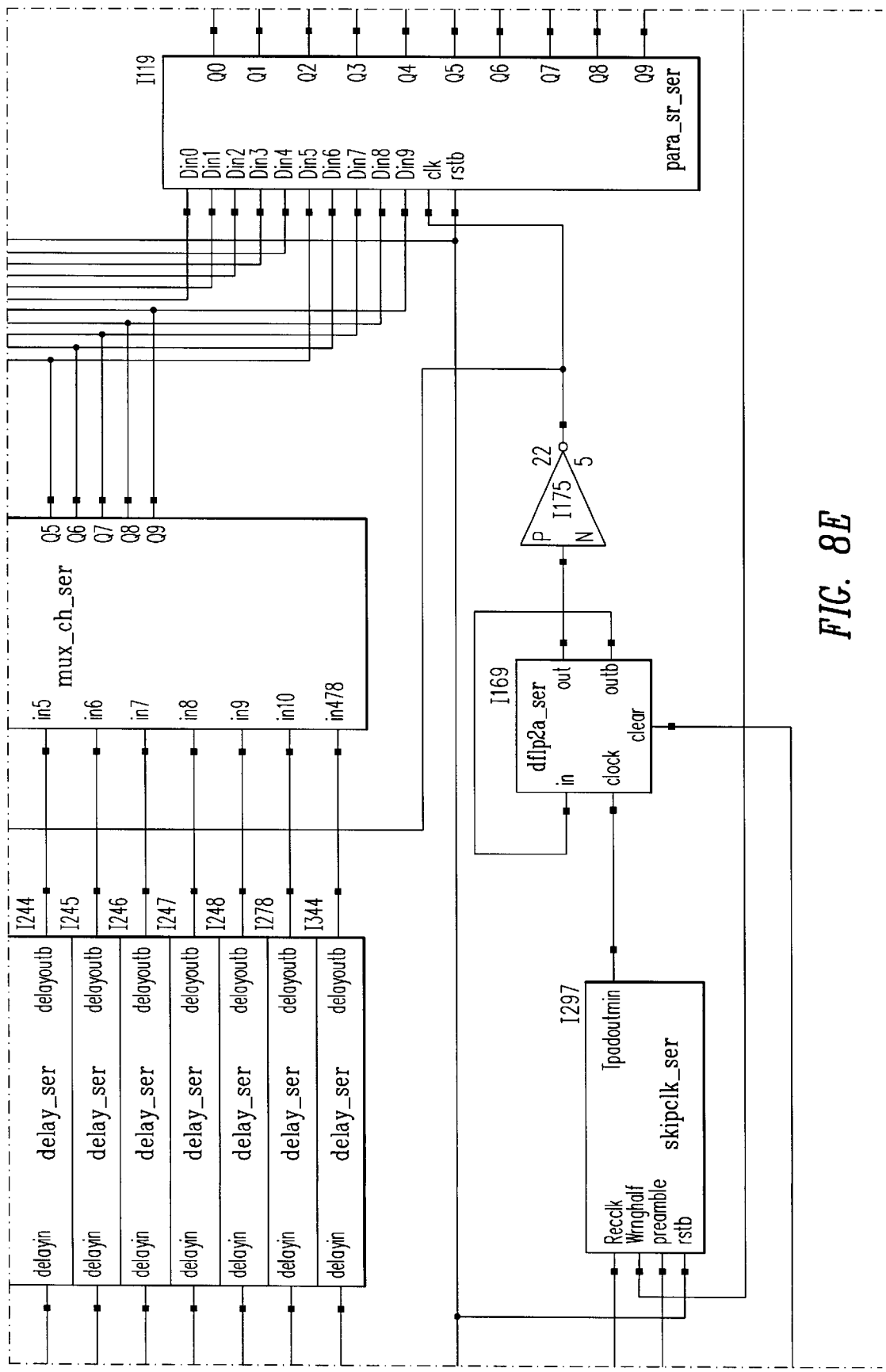

In receive mode, serial data from pads 308 are input to receiver block 312. Receiver block 312 is illustrated in more detail in FIG. 7. The circuitry shown in FIG. 7 takes the dual differential serial data received on pads 308 and converts the data to a digital TTL/CMOS data stream 702, which can be understood by the core of the FPGA. Data 702 are then input to PLL control block 400. PLL control block 400 is illustrated in more detail FIG. 9. PLL control block 400 includes a phase-locked loop (PLL) 410, two stair-step clock generators 420, and two state machines 408 and 424. The data output from PLL control block 400 are input to serial-to-parallel block 314 where the data are deserialized then output as parallel data on bus 316. Serial-to-parallel block 314 is illustrated in more detail in FIG. 8. Serial-to-parallel block 314 includes a series of registers. Data are sequentially loaded into the registers, then shifted out as parallel data on bus 316 in a single clock cycle.

As described above, mode selection signal 350 determines if the data channel block operates in clock recovery mode or in channel clock mode. When mode selection signal 350 is low, the data channel block operates in clock recovery mode and when mode selection signal 350 is high, the data channel block operates in channel clock mode.

Figure 19:
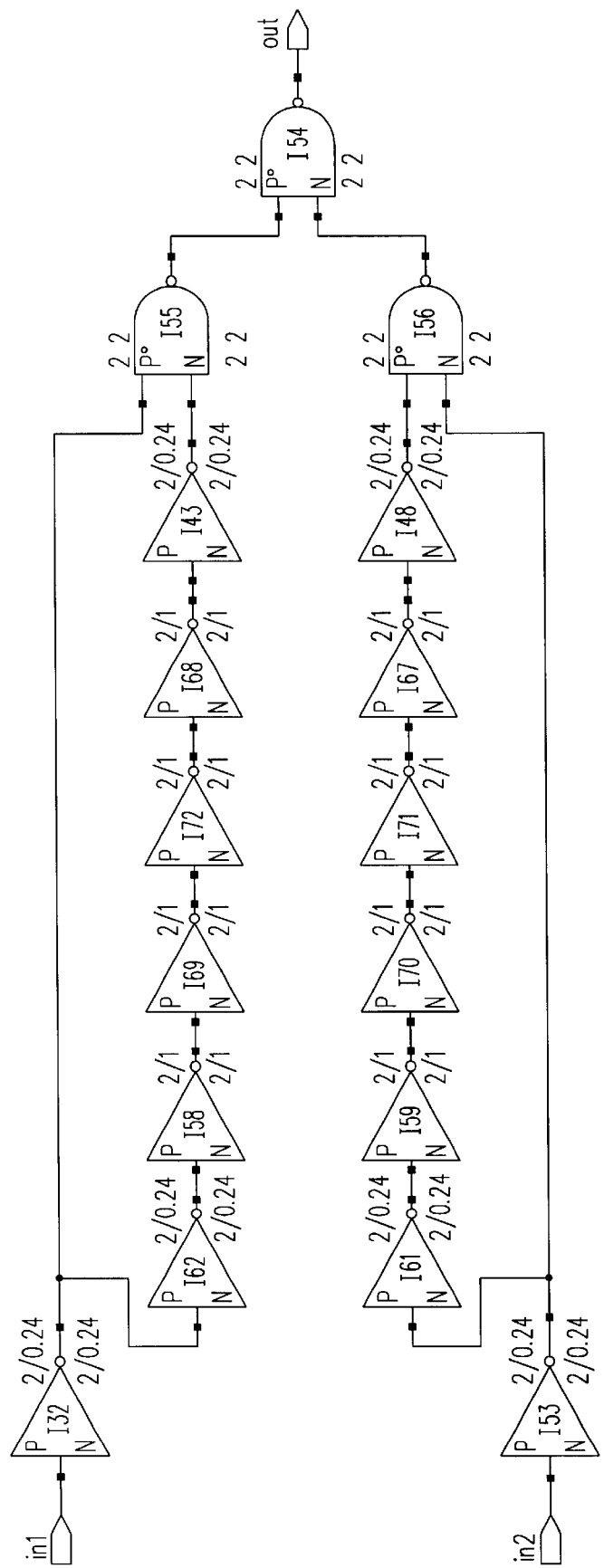
FIG. 19 is a schematic diagram of a glitch circuit.

Data channel 112 operates as follows in clock recovery mode. In clock recovery mode, there is a clock embedded in the data, which must be included with the data in transmit mode, and recovered from the data in receive mode. In transmit mode, PLL 410 must lock to a reference clock before data can be transmitted. The reference clock is provided by the FPGA and is a slow clock, i.e. a clock used for clocking low speed parallel data, not high speed serial data. PLL 410 is illustrated in more detail in FIG. 10. PLL 410 includes a phase detector 1002, a charge pump 1004, a voltage-controlled oscillator 1006, and a glitch circuit 1008. Phase detector 1002 compares two clock signals, 1010 and 1012. Clock signal 1010 is the reference clock. Clock signal 1012 is received from stair-step clock generator 420, described in more detail below. Stair-step clock generator 420 receives a fast serial data clock signal from the VCO, then divides it by the serialization such that clock signal 1012 can be compared to the reference clock 1010 in phase detector 1002. If clocks 1010 and 1012 do not match, phase detector 1002 signals charge pump 1004 to increase or decrease the voltage to VCO 1006. As long as phase detector 1002 sends signals of sufficient size to charge pump 1004, glitch circuit 1008 outputs a glitch signal 1014. Glitch circuit 1008 is illustrated in more detail in FIG. 19. Glitch circuit 1008 filters small signals from phase detector 1002, avoiding a loss-of-lock signal for small differences between clock 1010 and clock 1012. When phase detector 1002 stops sending sufficiently large signals to charge pump 1004, glitch signal 1014 switches. After the glitch signal switches, counter 414 (FIG. 9) counts 16 clock cycles. If glitch signal 1014 does not switch again in 16 clock cycles, PLL 410 has locked to reference clock 1010.

Figure 11C:
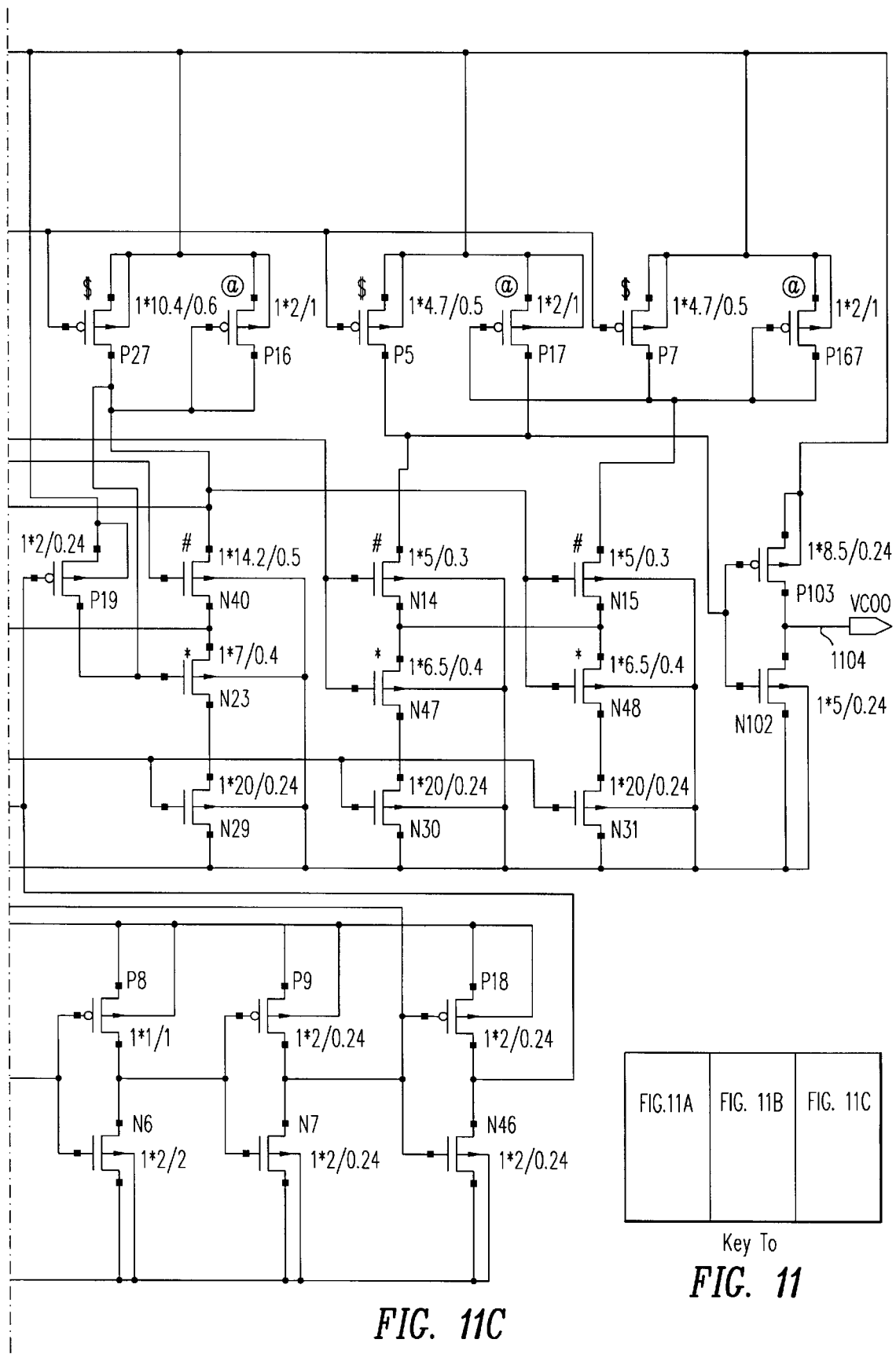
FIG. 11 is a schematic diagram of a voltage controlled oscillator.
Figure 11A:
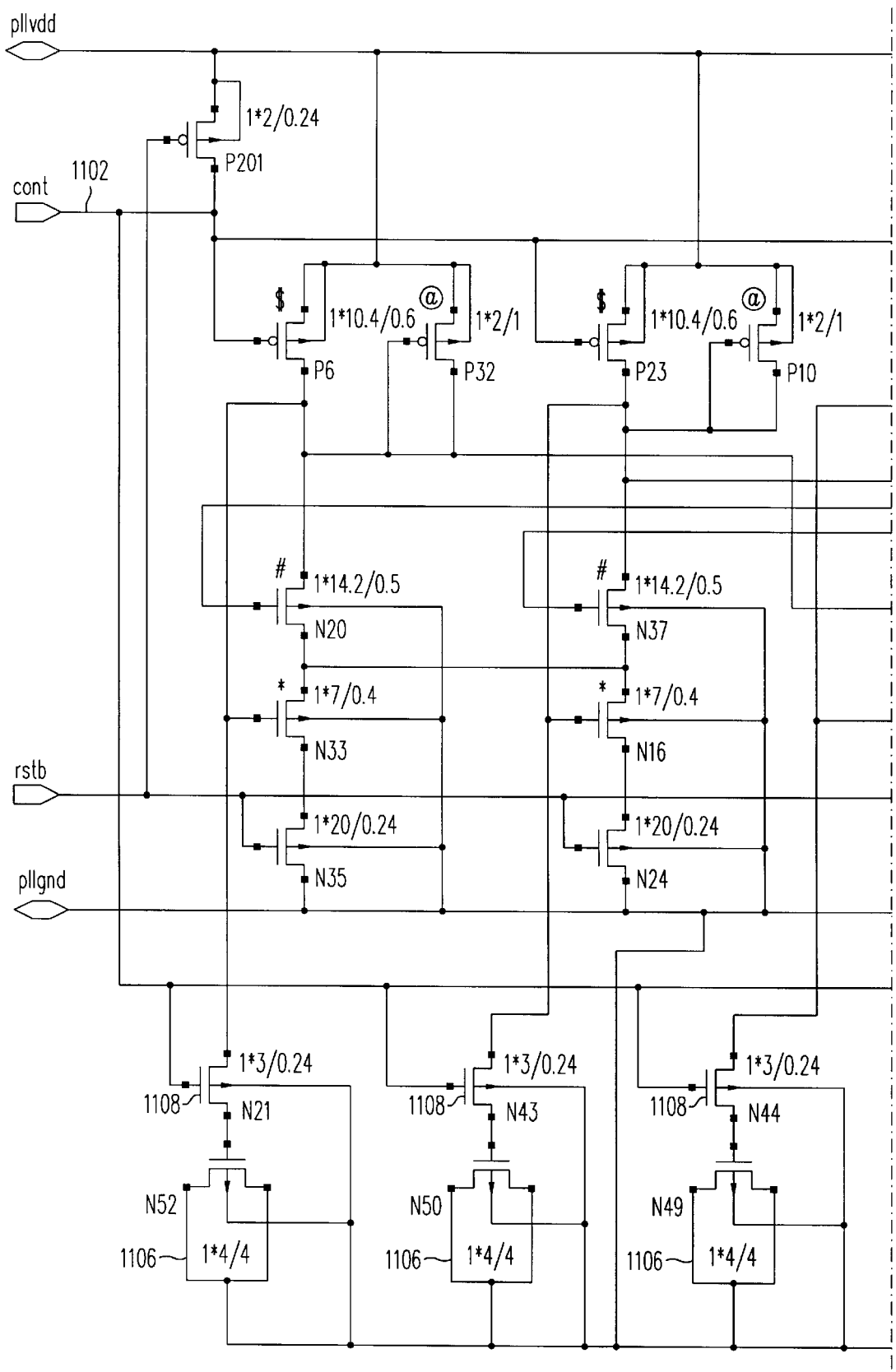
Figure 11B:
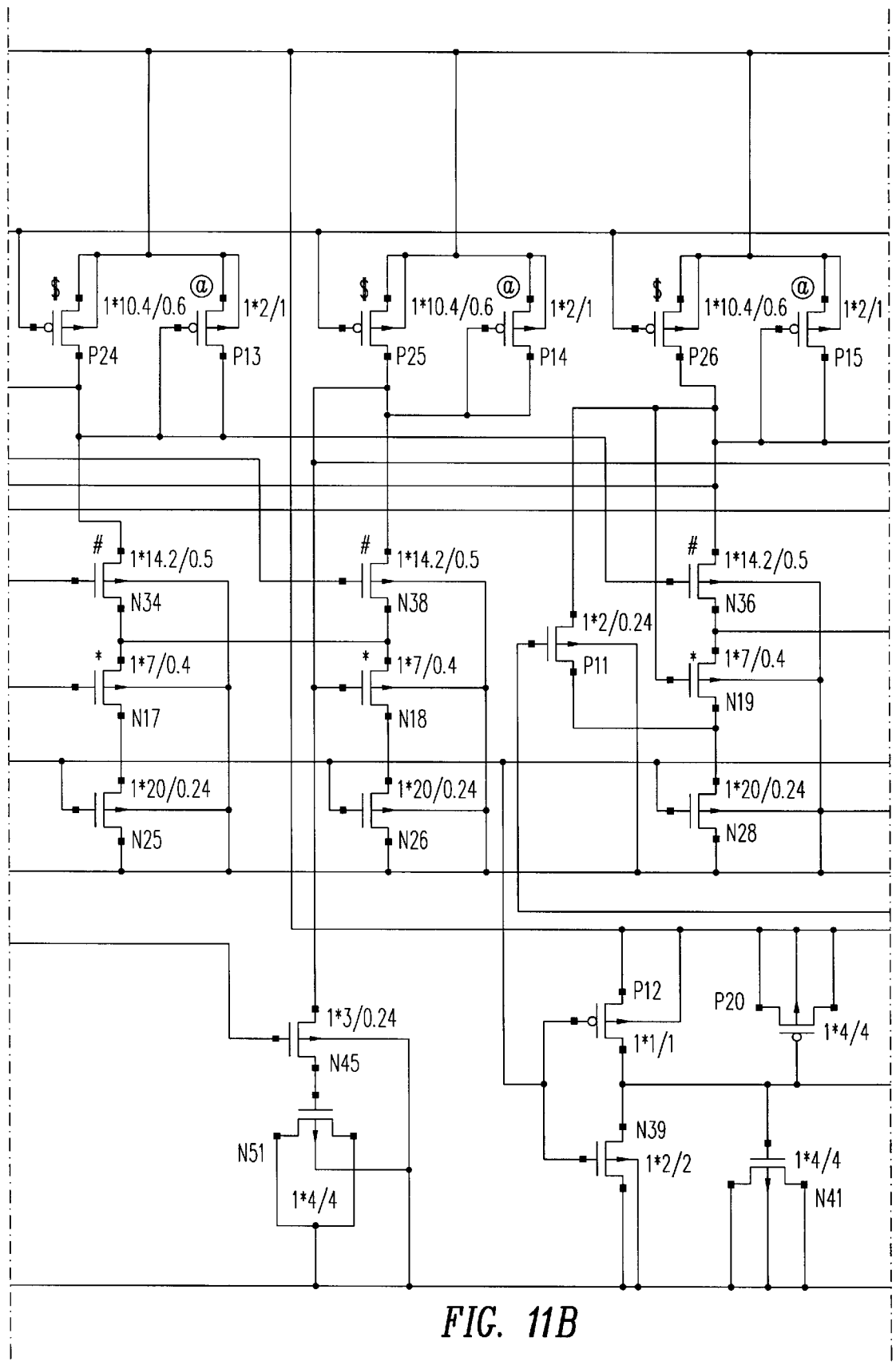

In accordance with another aspect of the invention, PLL 410's VCO 1006 has a set of switched capacitors which increase the frequency range of the VCO. FIG. 11 illustrates an embodiment of VCO 1006. VCO 1006 includes a set of capacitors 1106 connected to a control line 1102 by a set of transistors 1108. In general, as control signal 1102 increases in voltage, the frequency of output signal 1104 decreases. Similarly, as control signal 1102 decreases in voltage, the frequency of output signal 1104 increases. Capacitors 1106 magnify this effect. As the control voltage increases, transistors 1108 begin to turn on, which allows capacitors 1106 to affect the rest of the VCO circuit. The capacitance decreases the frequency of output signal 1104. As the control voltage decreases, transistor 1108 begin to turn off, which isolates the rest of the VCO circuit from capacitors 1106. The reduced capacitance increases the frequency of output signal 1104.

Figure 13:
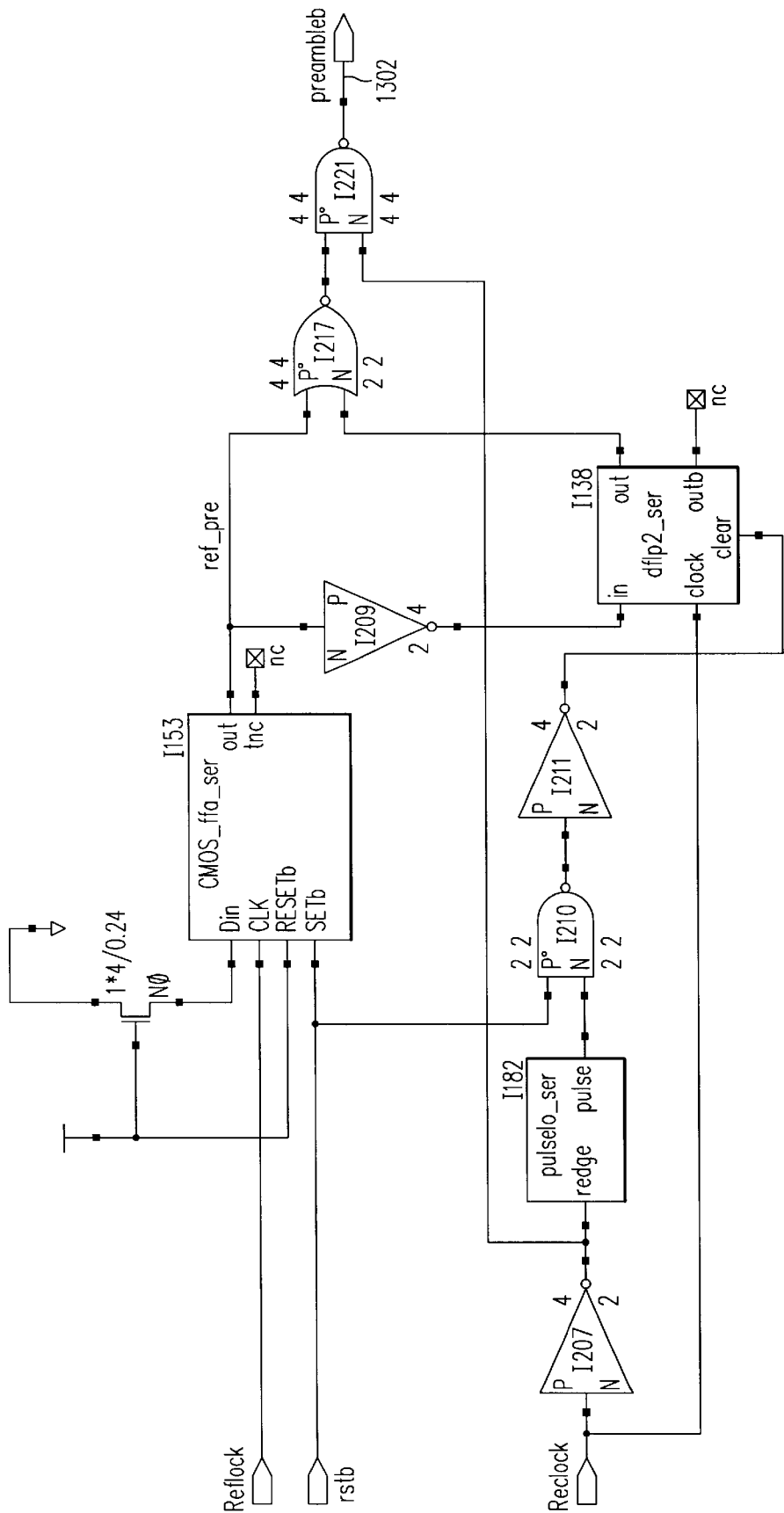
FIG. 13 is a schematic diagram of a state machine.

State machine 424, illustrated in more detail in FIG. 13, operates in the transmit mode of clock recovery mode. State machine 424 stays in its first state until lock is established to the reference clock, as described above. State machine 424 then changes to its second state, which allows the transmitter to send preamble. When signal 422 switches, indicating that the receiver has locked to the preamble, state machine 424 switches to its final state. In the final state, the parallel-to-serial block 304 sends data.

The preamble is determined by whether the data channel block is operating in 20:1 clock recovery mode or 10:1 clock recovery mode. Select 20 signal 418 (FIG. 9) determines whether the serialization is 20:1 or 10:1. Select 20 signal 418 adjusts the size of the shift register loop in circuit 420 to divide the slow clock input to the PLL. In 10:1 mode, the preamble is six logic high signals then six logic low signals. In 20:1 mode, the preamble is six logic high signals, six logic low signals, seven logic high signals, then five logic low signals. In 10:1 mode, the preamble is generated by register block 303 of FIG. 4. In 20:1 mode, the preamble is generated by both register blocks 303 and 305. As described below, in 20:1 mode, the data are treated as two blocks of twelve bits each. Thus, the preamble of 20:1 mode must be assymetric, such that the receiver can determine which of two data blocks is the first block and which is the second block. If the receiver receives a preamble of seven logic high signals, five logic low signals, six logic high signals, then six logic low signals, instead of six logic high signals, six logic low signals, seven logic high signals, then five logic low signals, the receiver skips one clock signal in order to properly lock to the preamble.

Transmitter 306 continues to send preamble data until state machine 424 senses that locked signal 422 has switched high, indicating that the receiver has locked to the preamble. State machine 424 determines whether parallel-to-serial block 314 generates preamble or actual data by switching signal 1302. Once the receiver is locked to the preamble data, signal 1302 switches, parallel-to-serial block 304 begins generating actual data, transmitter 306 sends the data received from parallel-to-serial block 304. In 10:1 mode, parallel-to-serial block 304 "packages" the data into 12 bit blocks, where the first bit, or start bit, is a logic high and the last bit, or stop bit, is a logic low. In 20:1 mode, parallel-to-serial block 304 packages the data into two 12 bit blocks where the first bit is a logic high start bit, the twelfth bit is a logic low stop bit, the thirteenth bit is a logic high start bit and the twenty-fourth bit is a logic low stop bit.

Parallel-to-serial block 304 switches between preamble and actual data by switching multiplexers 505. Multiplexers 505 are three-way multiplexers. Signal 510 switches a parallel load of preamble data into registers 506. Signal 511 switches a parallel load of actual data into registers 506. Signal 512 switches the data in registers 506 out of the registers.

Figure 12:
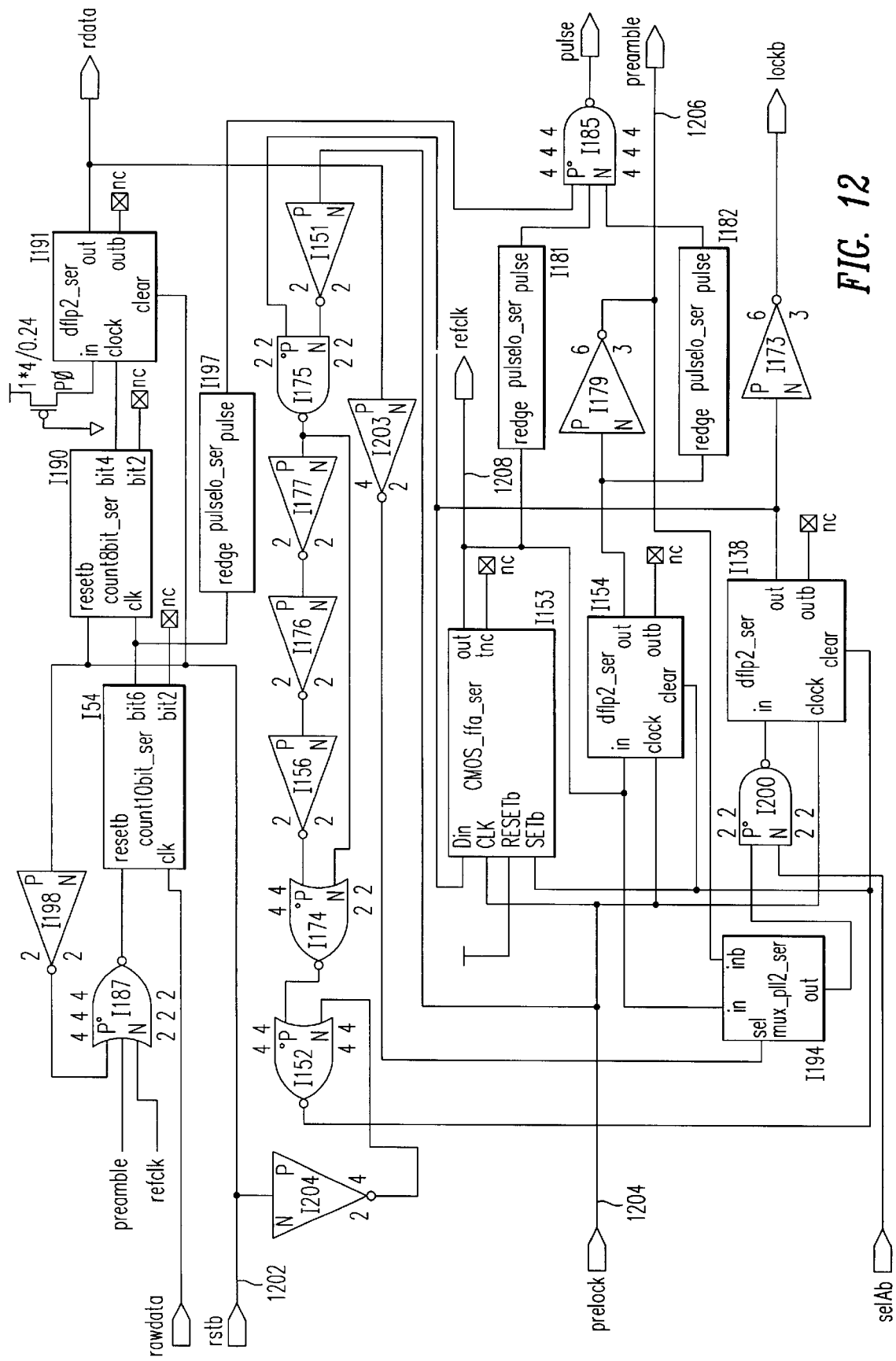
FIG. 12 is a schematic diagram of a state machine.

In receive mode, the data channel block must first lock to a reference clock, as described above in reference to FIGS. 9, 10, and 11. State machine 408, shown in more detail in FIG. 12, is used in receive mode of clock recovery mode. When active, state machine 408 first allows PLL 410 to lock to the reference signal. Once locked, counter 414 is allowed to count to 16 before sending signal 416 high, moving the state machine to its next state. In its second state, state machine 408 again waits for PLL 410 to lock to preamble data that may be sent by the transmitter. Once a second lock is established and counter 414 has counted to 16, a rising edge on signal 416 causes state machine 408 to switch signal 425 high after 8 slow clock cycles. Signal 425 can be connected to the transmitter to signal a locked condition.

Figure 14A:
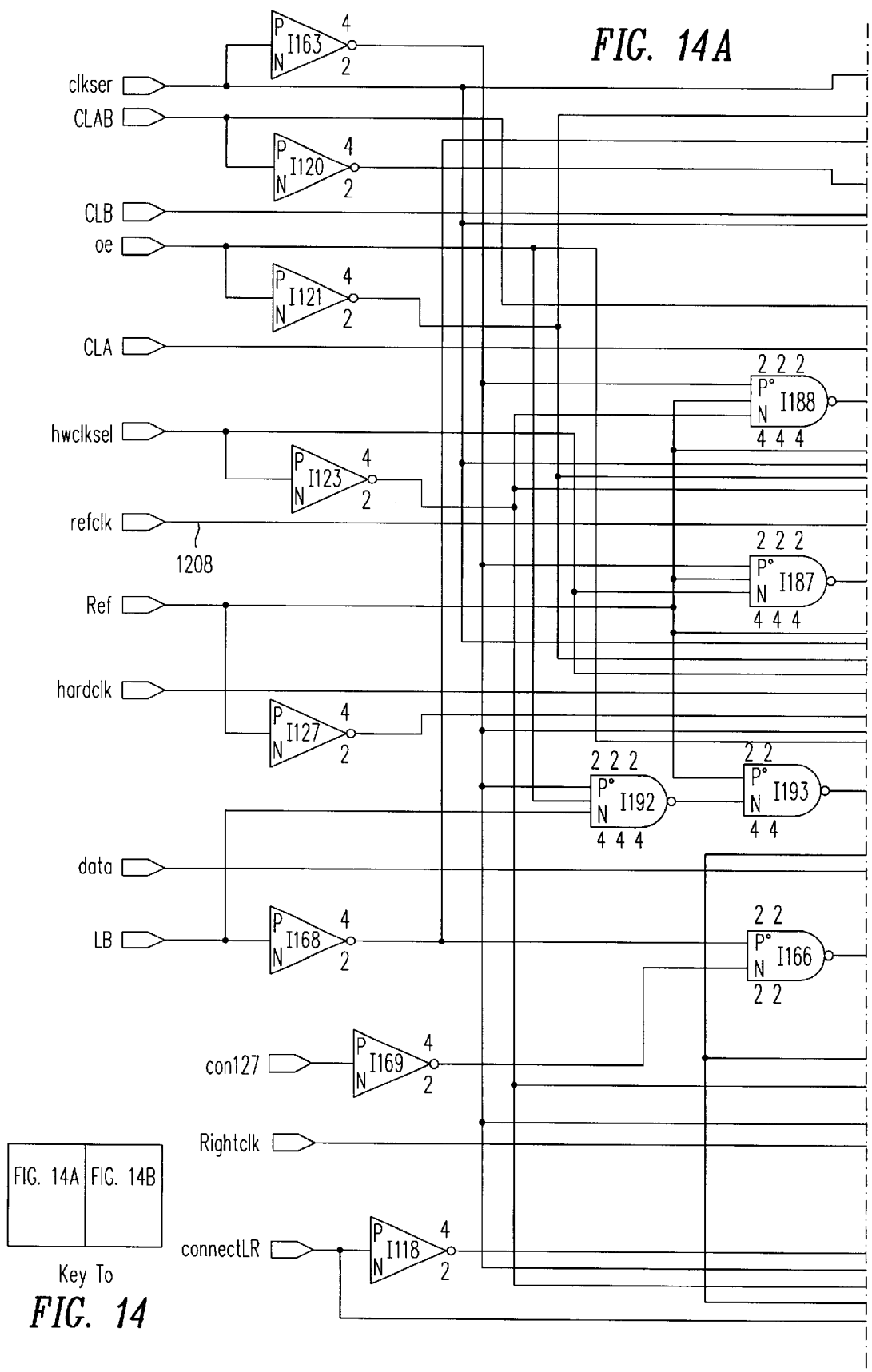
FIG. 14 is a schematic diagram of a multiplexer.
Figure 14B:
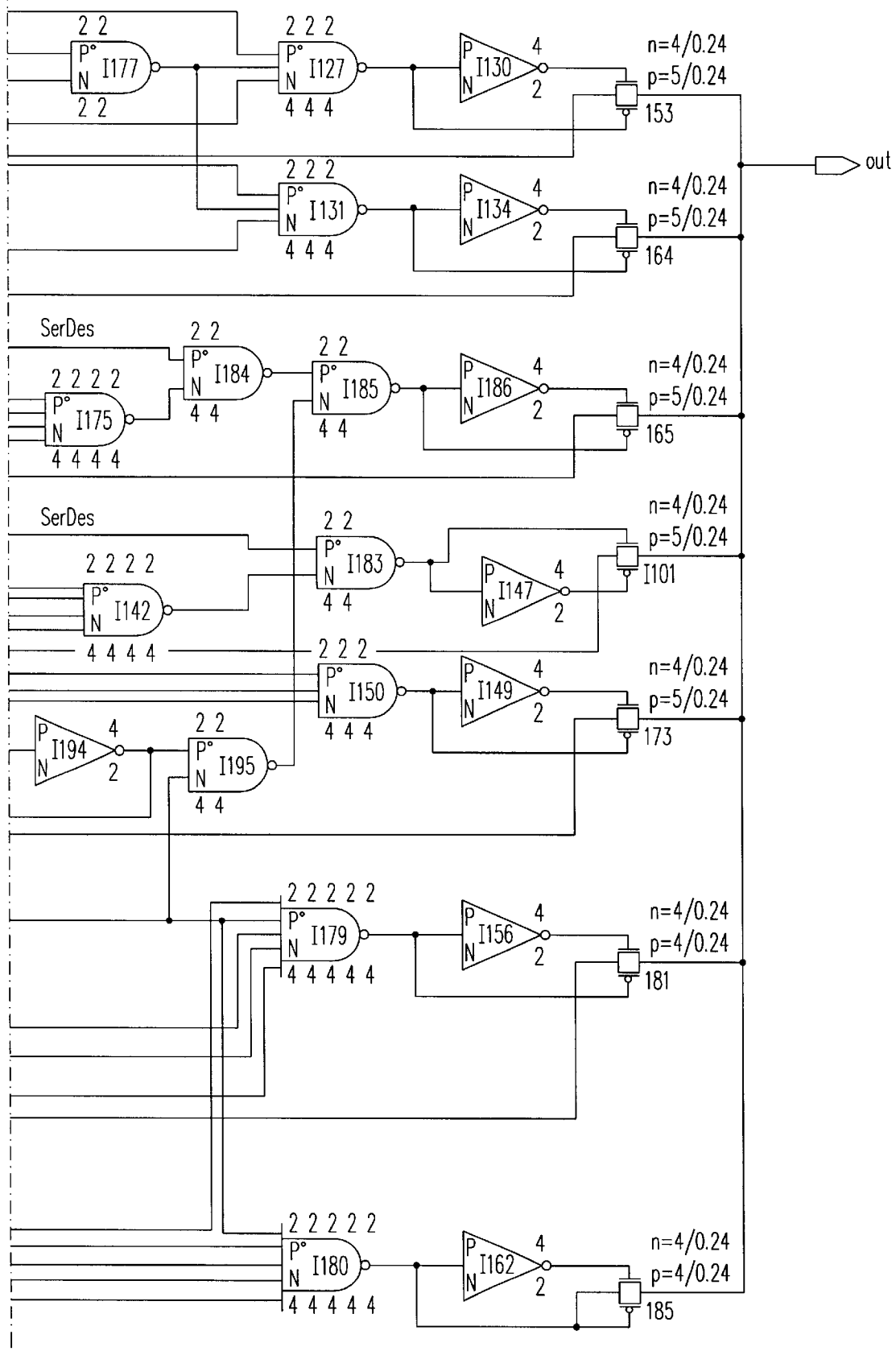

Once the PLL is locked to the reference clock, state machine 408 swiches signal 1208. Signal 1208 controls multiplexer 426 (FIG. 9), which is illustrated in more detail in FIG. 14. When signal 1208 is low, multiplexer 426 passes the reference clock. When signal 1208 switches high, multiplexer 426 passes data, which may initially will be preamble. Once the receiver has locked to the preamble, the state machine activates gate 430 by forcing line 425 high, which allows gate 428 to pass only the embedded clock from multiplexer 426 when gate 428 senses a rising edge between the stop bit of one data packet and the start bit of the next data packet.

Figure 15A:
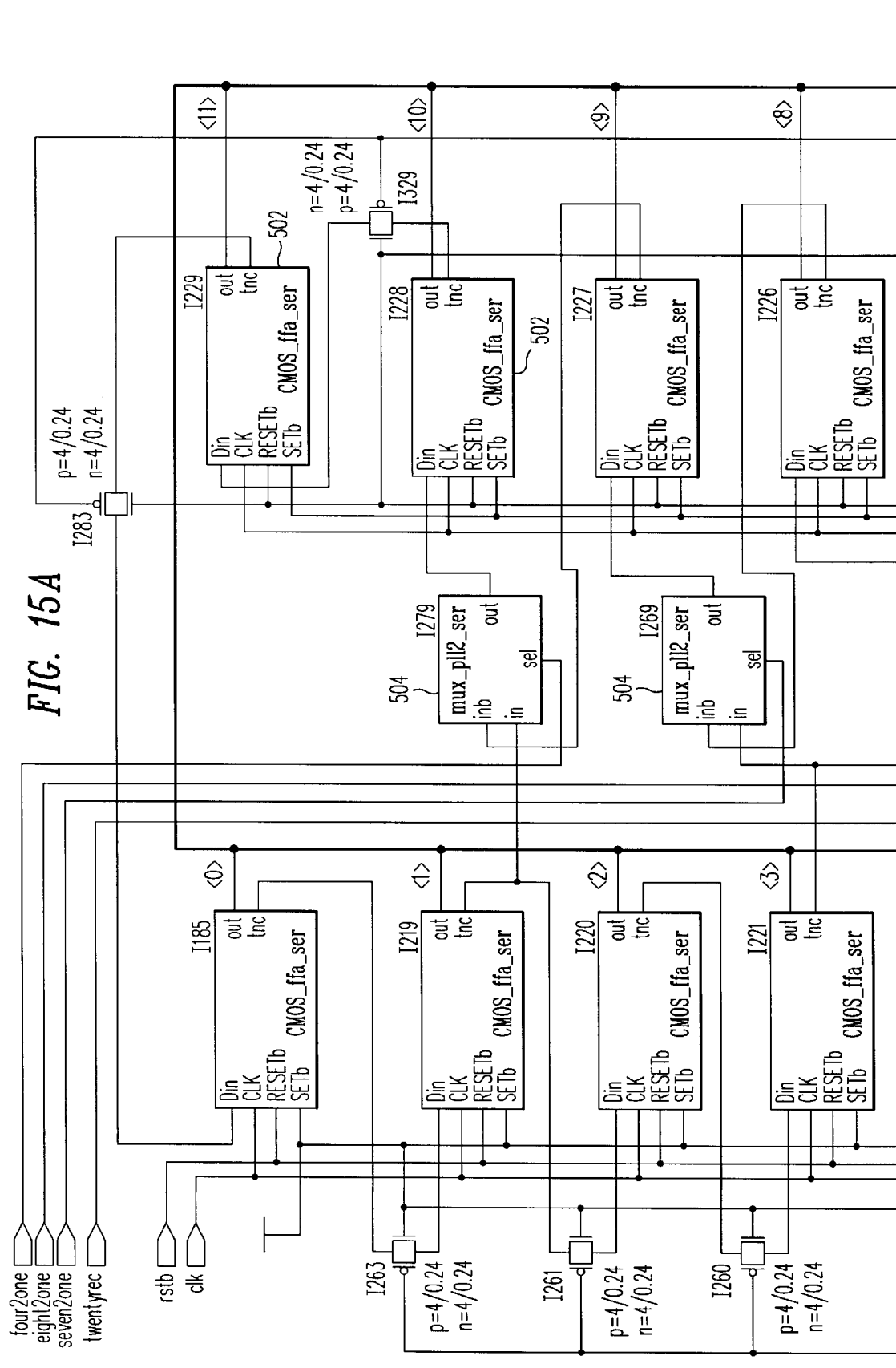
FIG. 15 is a schematic diagram of an stair-step clock generator.
Figure 15B:
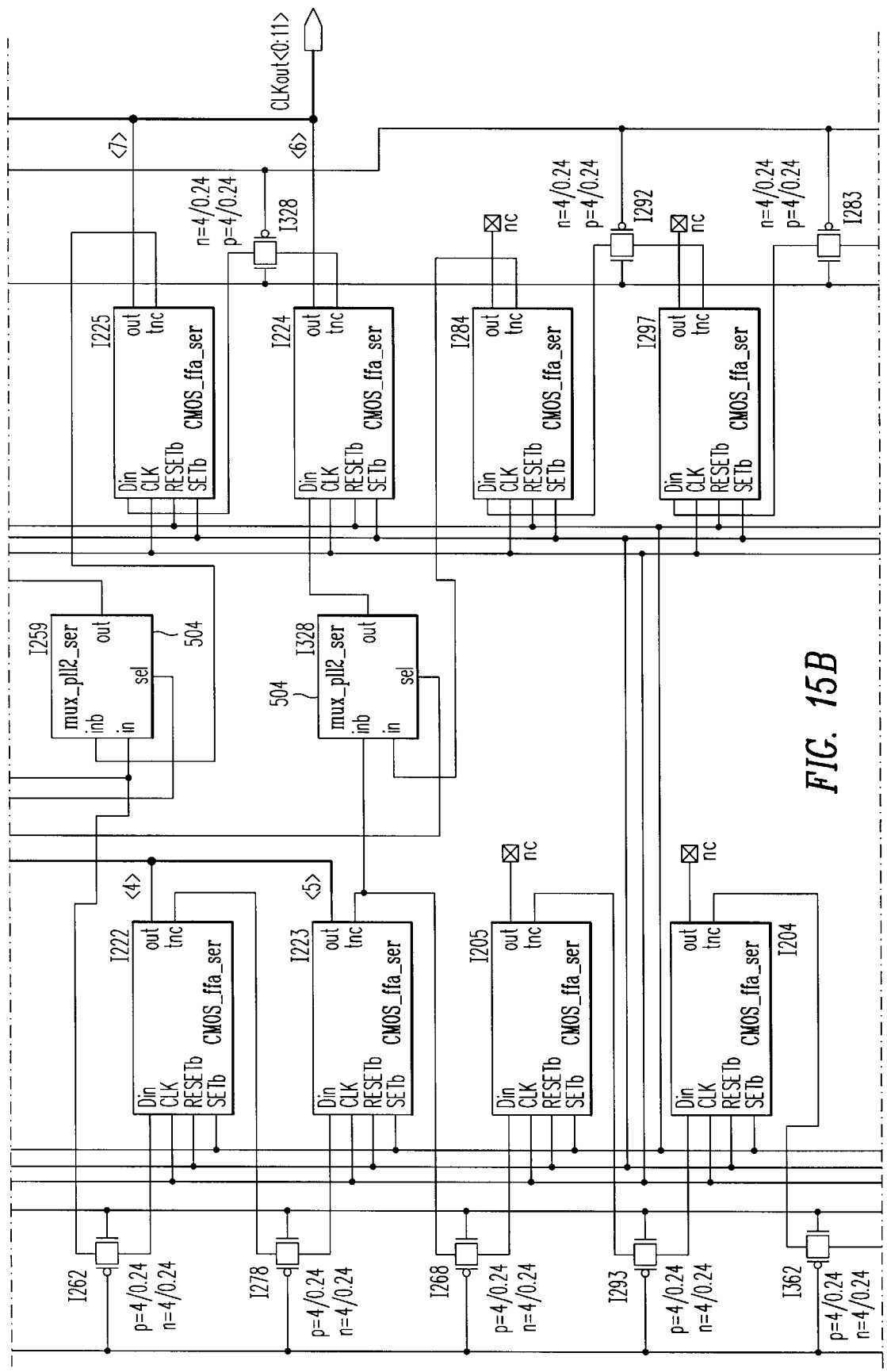

In accordance with another aspect of the invention, stair-step clock generator 420 (FIG. 9) creates a series of rising edge signals, which are sent to serial-to-parallel block 314 and used to sequentially clock data bits into the registers of serial-to-parallel block 314. Stair-step clock generator 420 is illustrated in more detail in FIG. 15. Stair-step clock generator 420 includes several registers 502 and multiplexers 504. Multiplexers 504 determine how many registers 502 are operating at a given time, which dictates the number of bits being serialized or deserialized. Two of the rising edge signals 441 and 442 are routed through gates 443, 444, and 430. These gates create an envelope, which allows gate 428 to pass the embedded clock from the data stream.

In 20:1 mode, the data are treated as two blocks of 10:1 data. Accordingly, two banks of registers in the serial-to-parallel block are loaded as two blocks of 10:1 data. The stair-step clock generator operates on a 10:1 clock signal, but PLL 410 must operate on a 20:1 clock signal in order to provide the data to serial-to-parallel block fast enough. Thus, the stair-step clock signal is divided by divider 460 in 20:1 mode, such that a 20:1 clock signal is provided as clock signal 1012.

Figures 9, 9A:
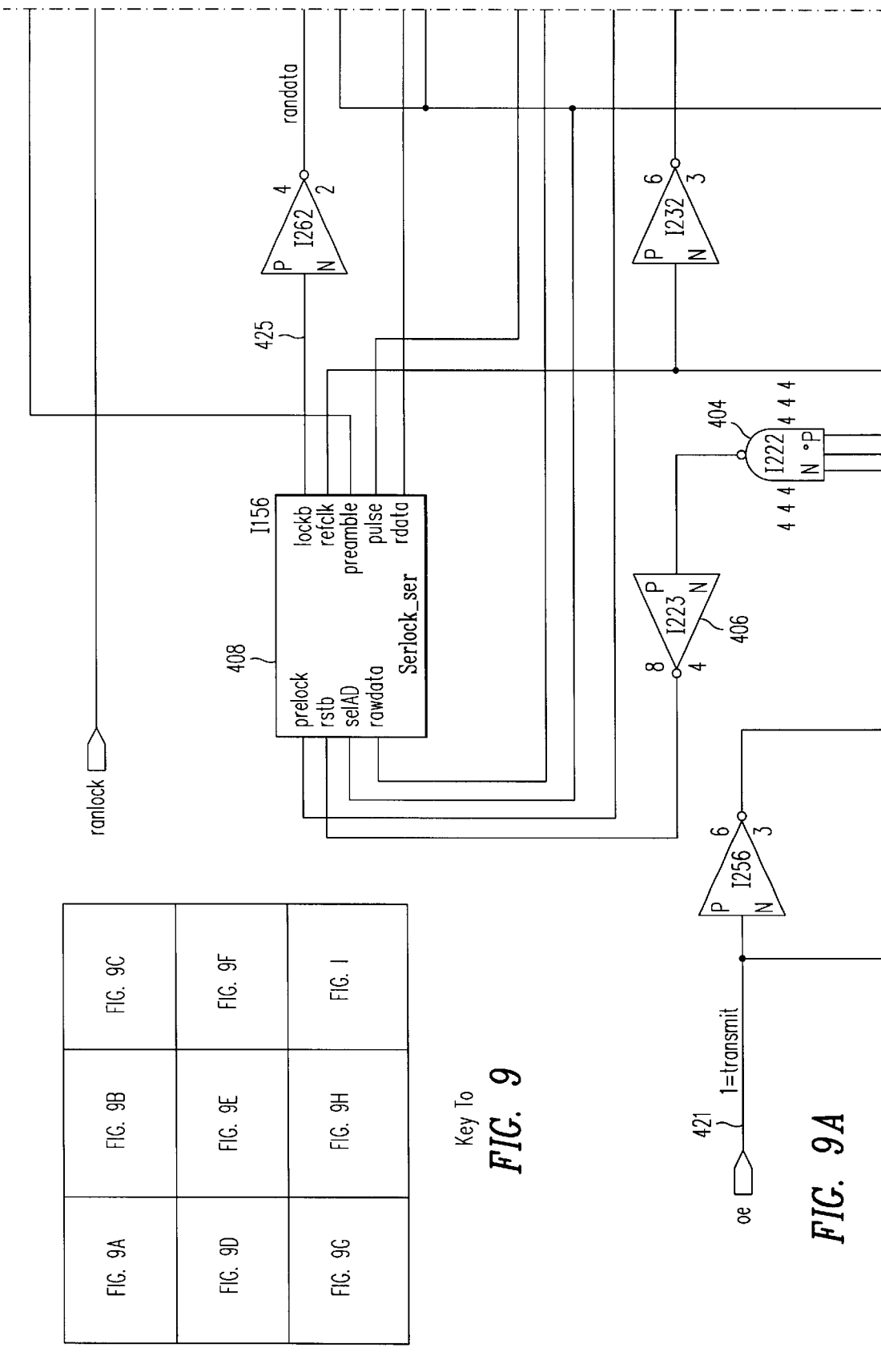
FIG. 9 is a schematic diagram of PLL/control circuitry used in a data channel block.
Figure 9B:
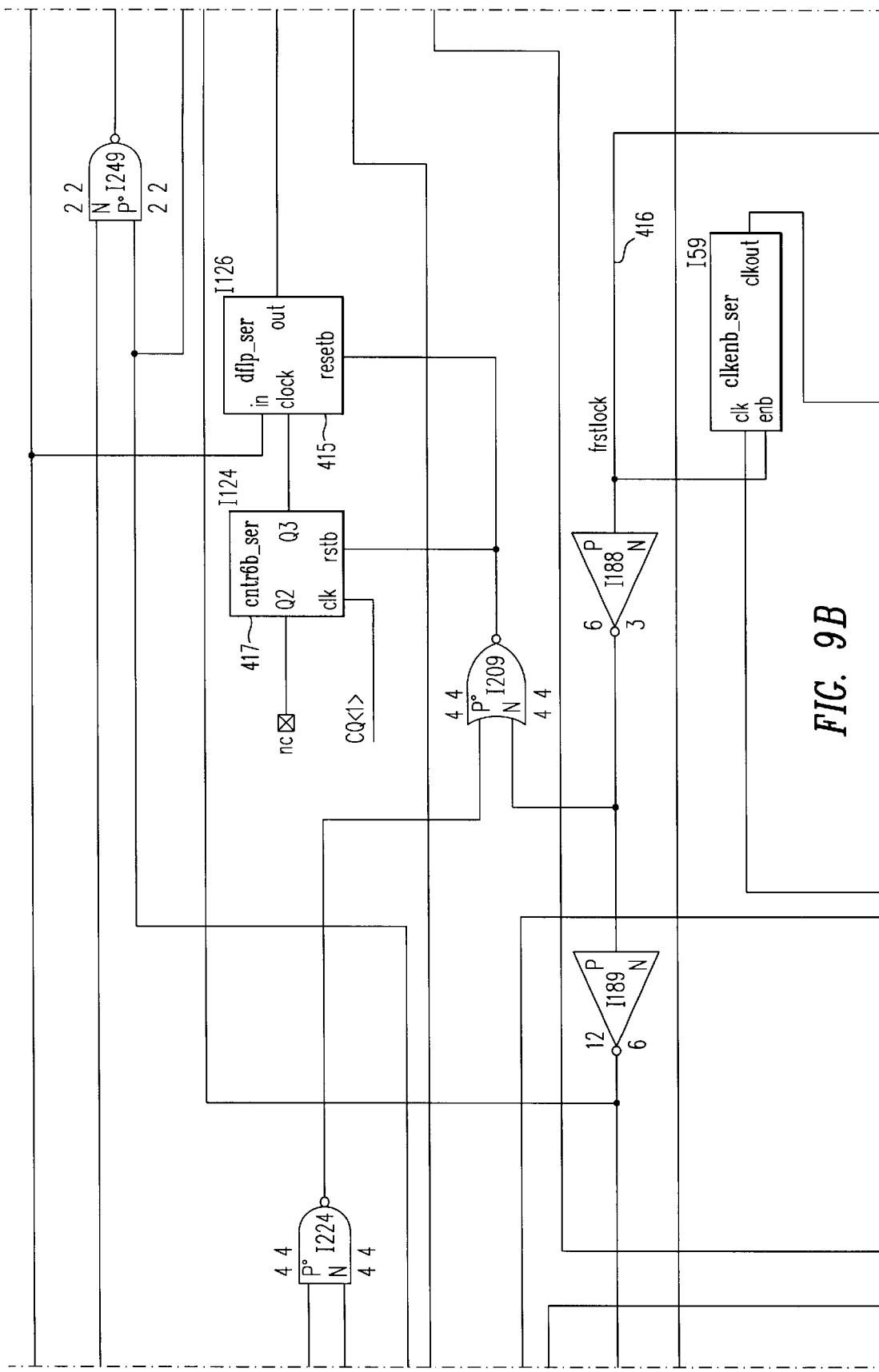
Figure 9D:
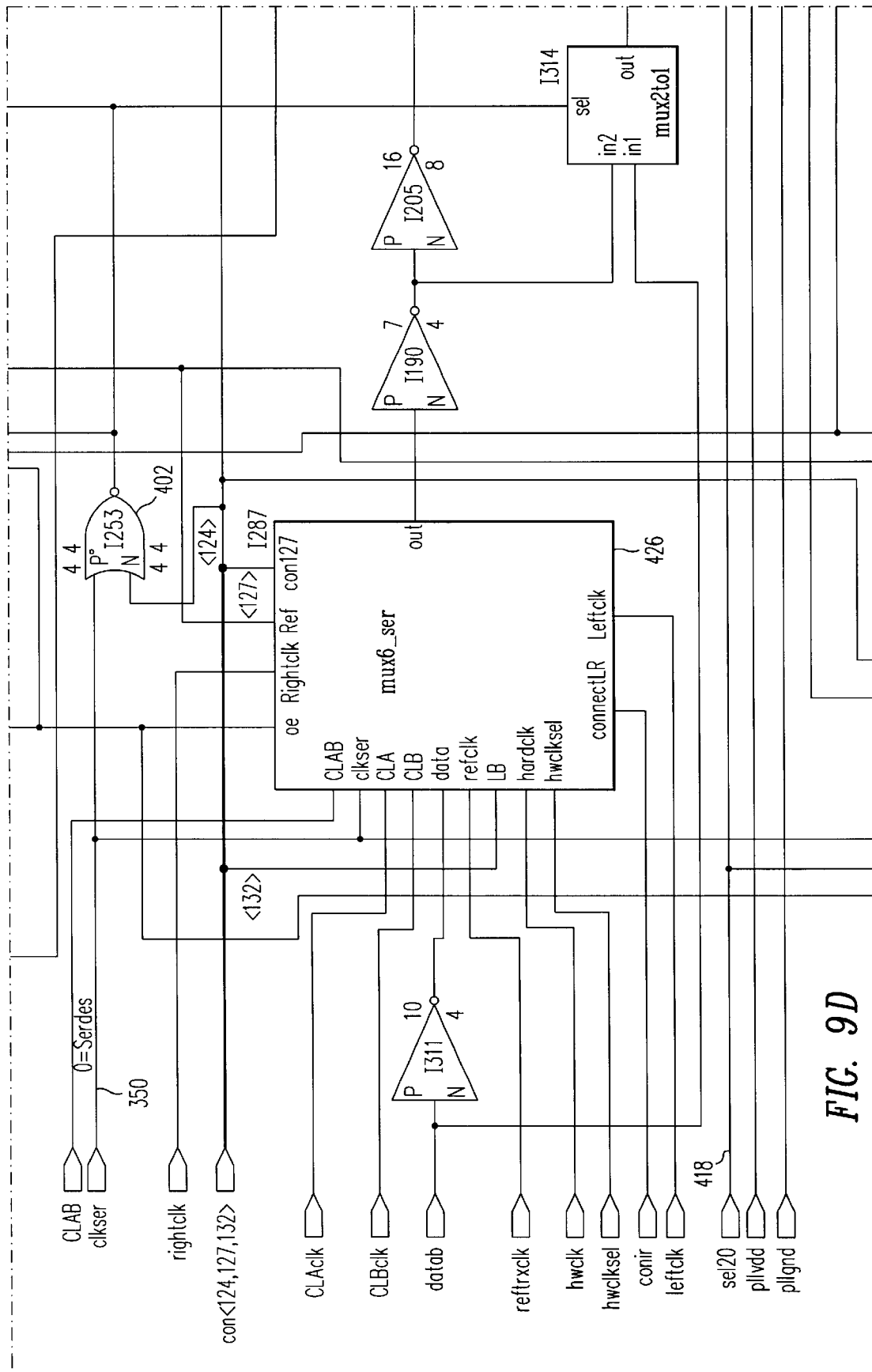
Figure 9E:
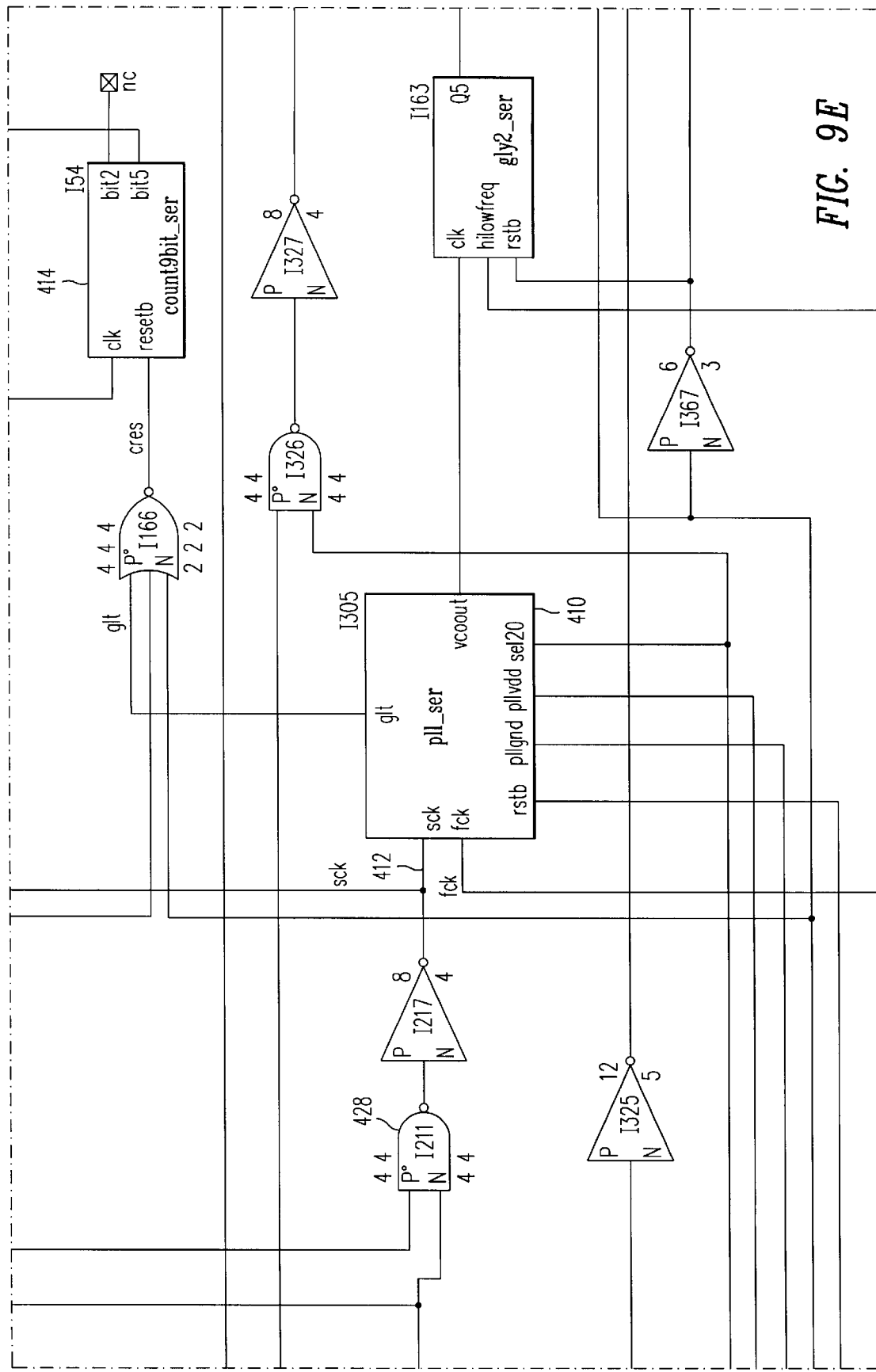
Figure 9F:
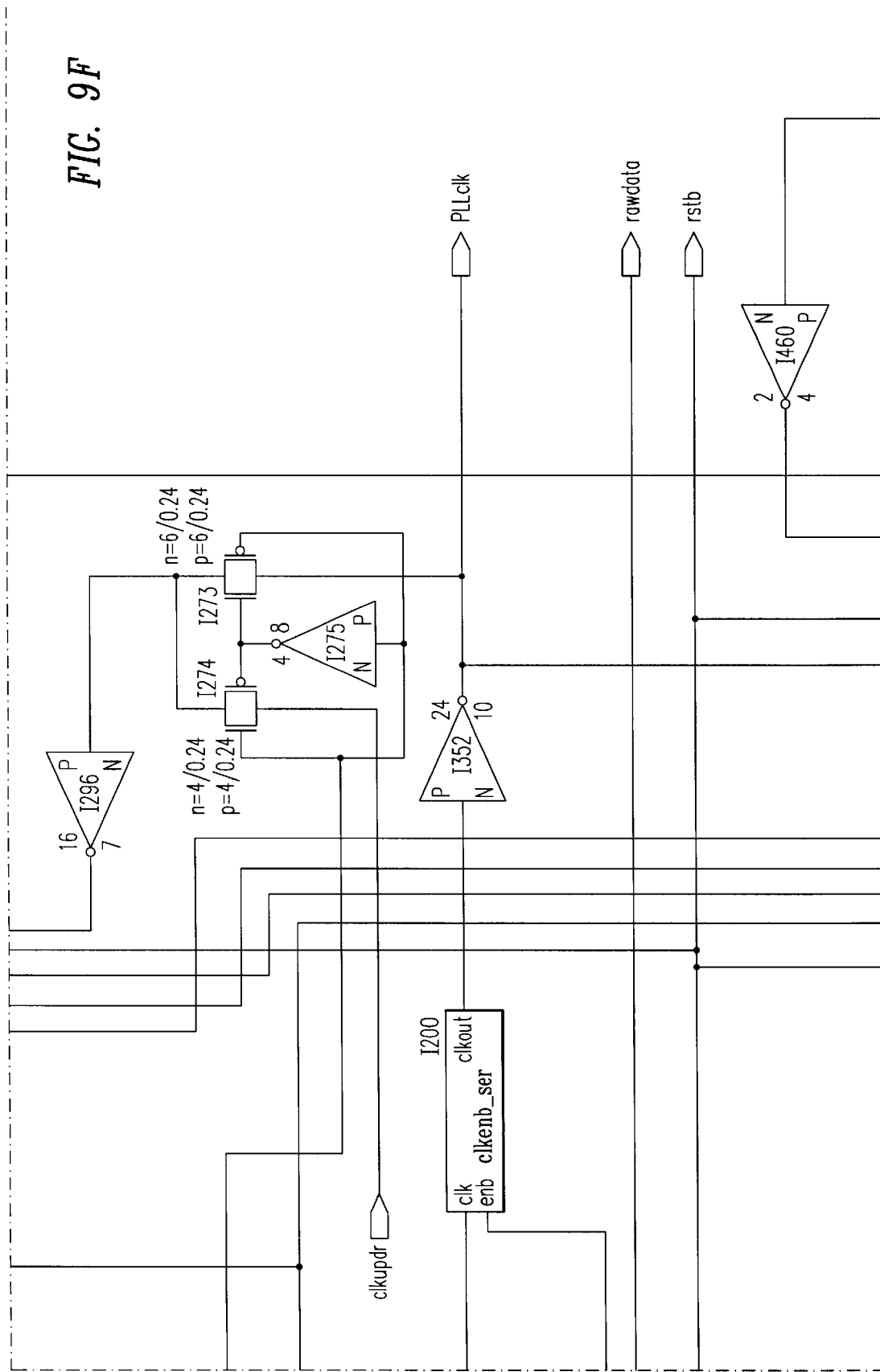
Figure 9G:
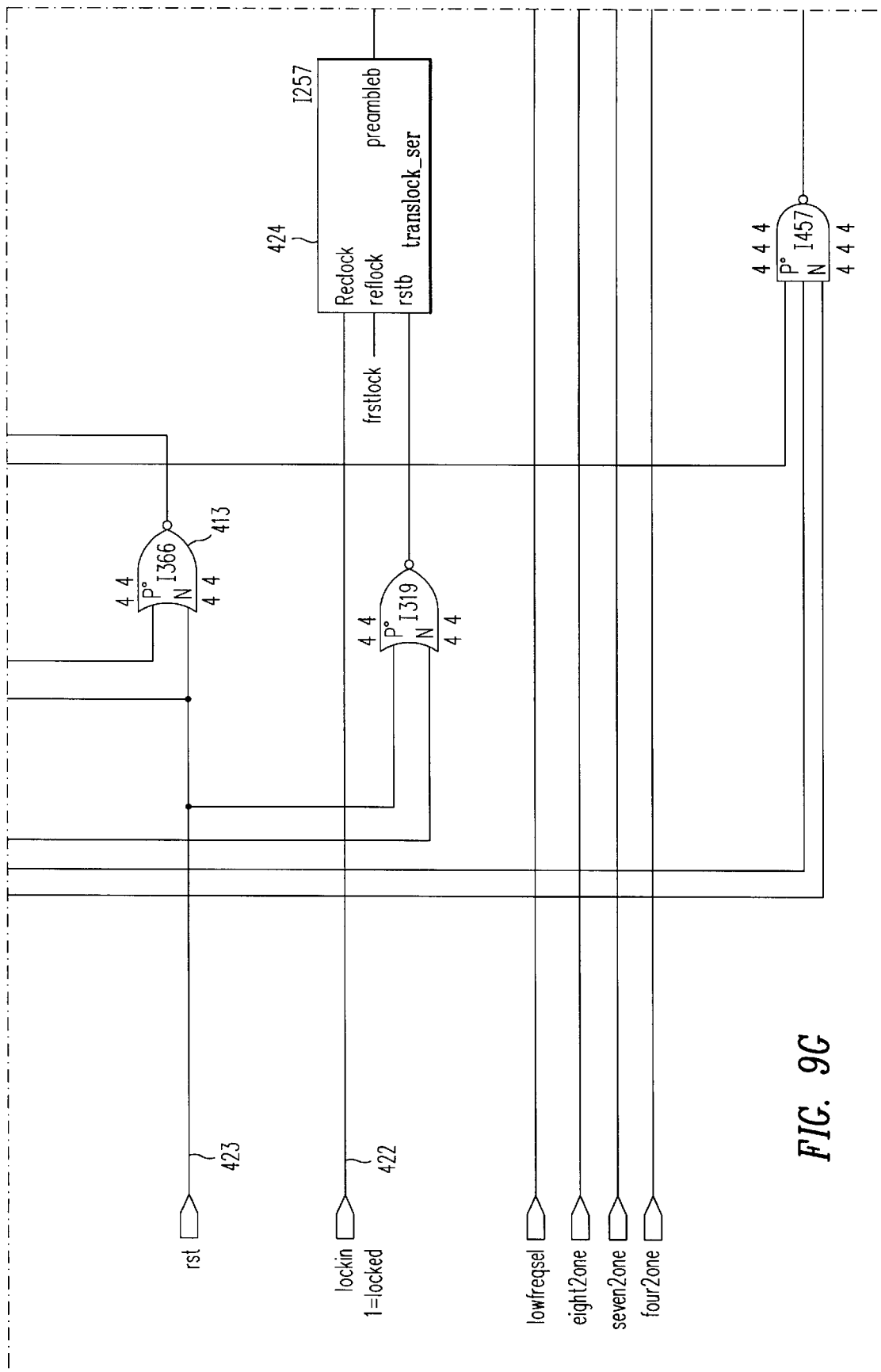
Figure 9H:
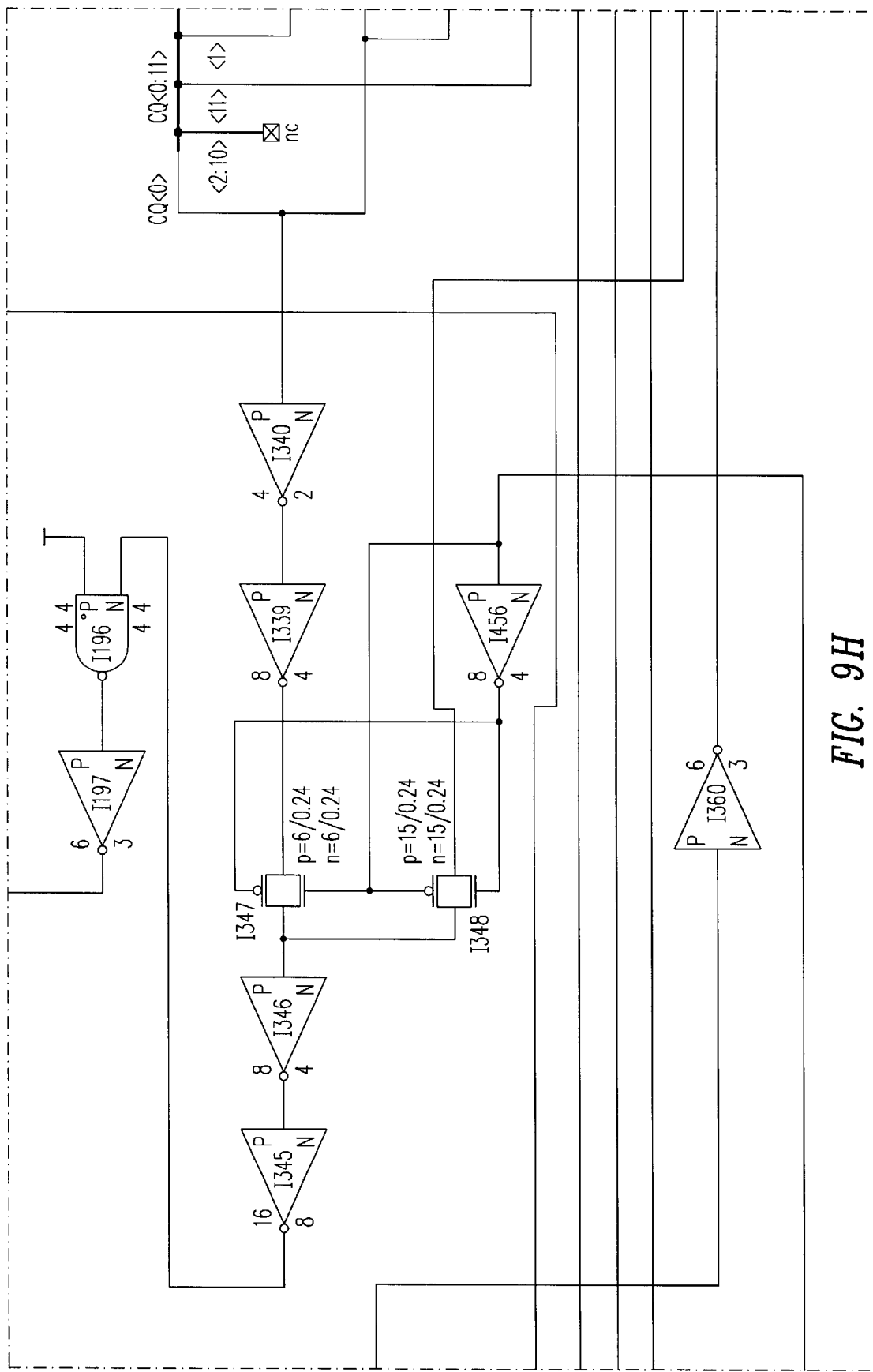
Figure 9I:
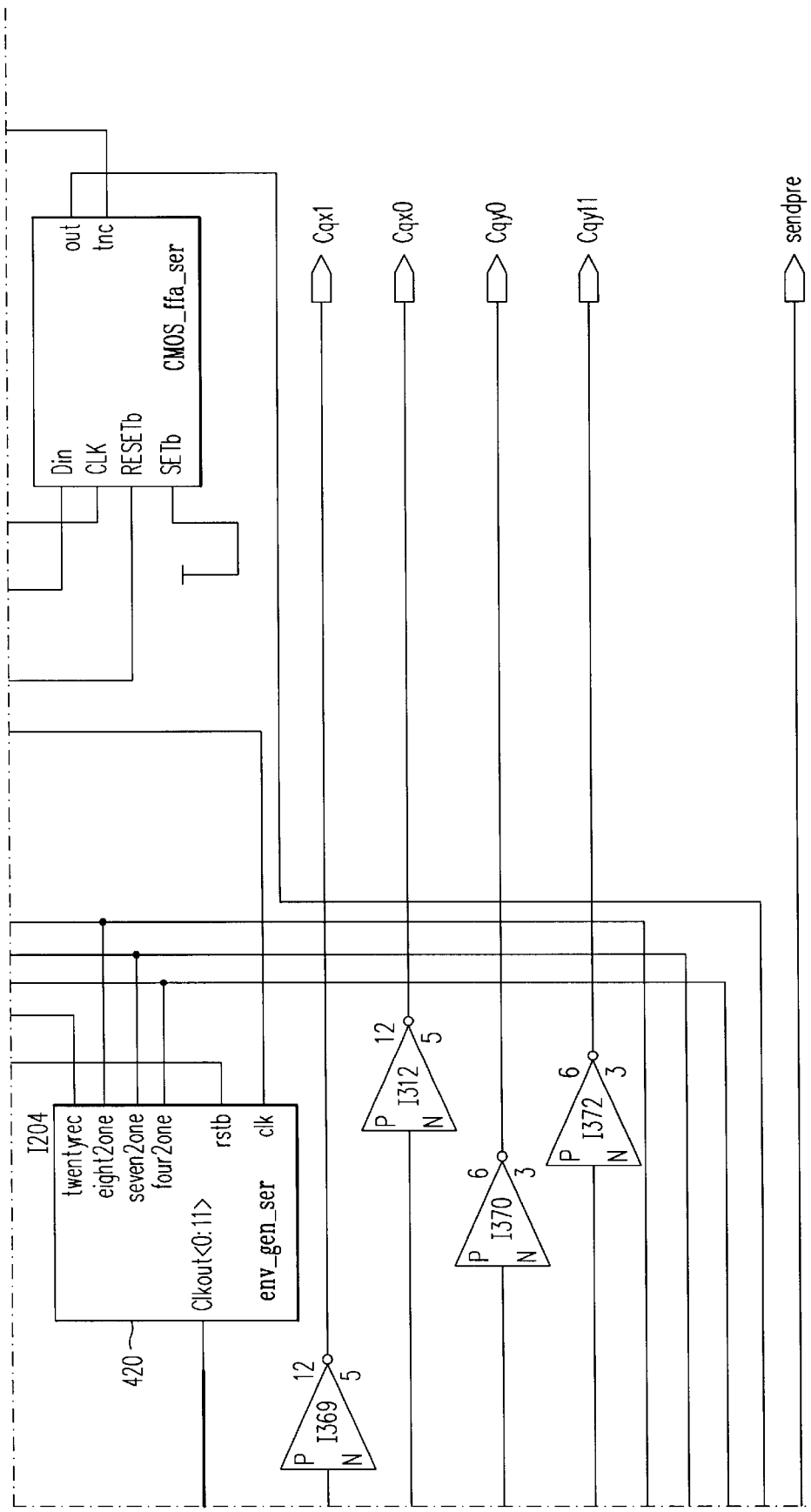
Figure 10:
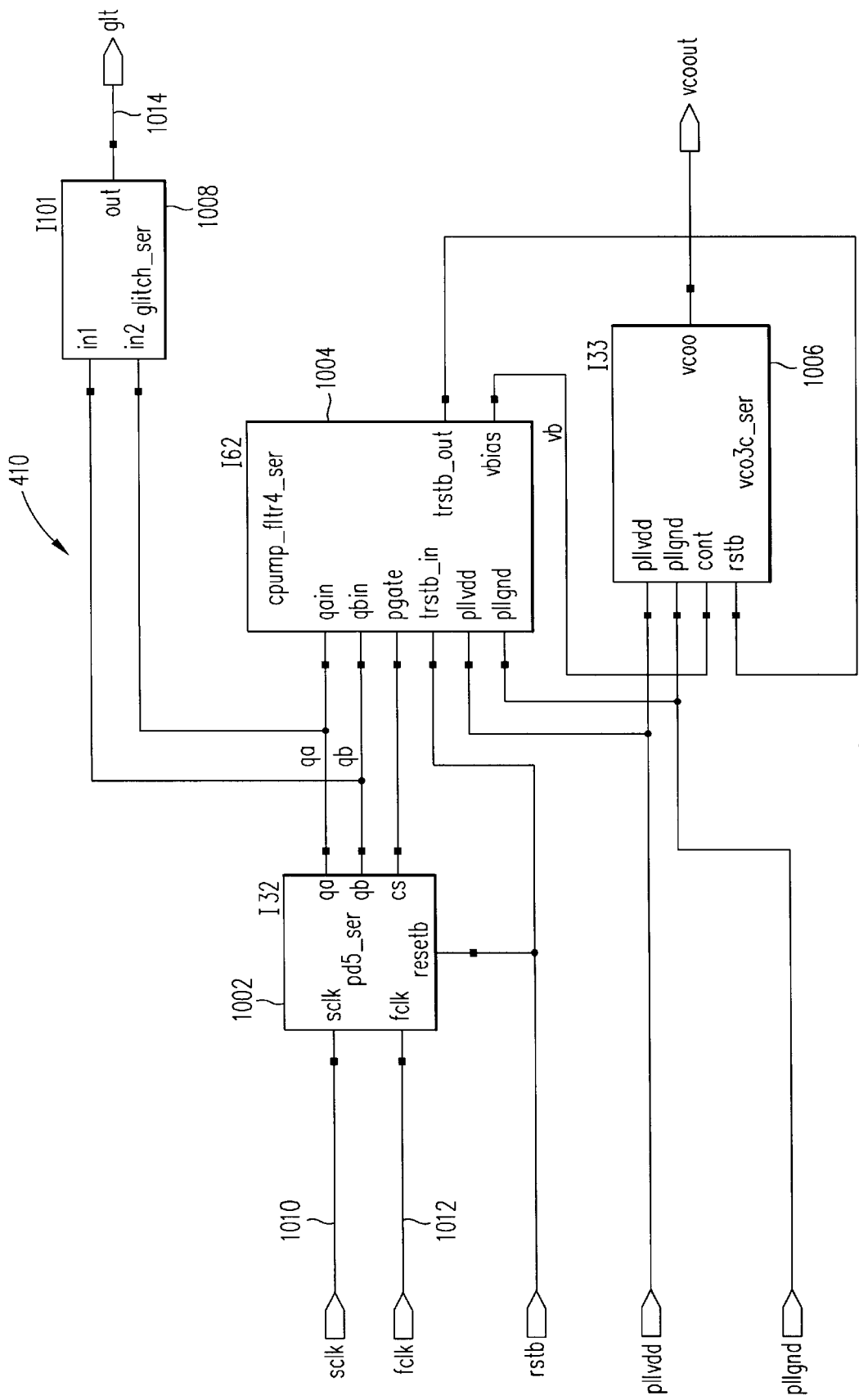
FIG. 10 is a schematic diagram of a phase-locked loop.
Figure 16A:
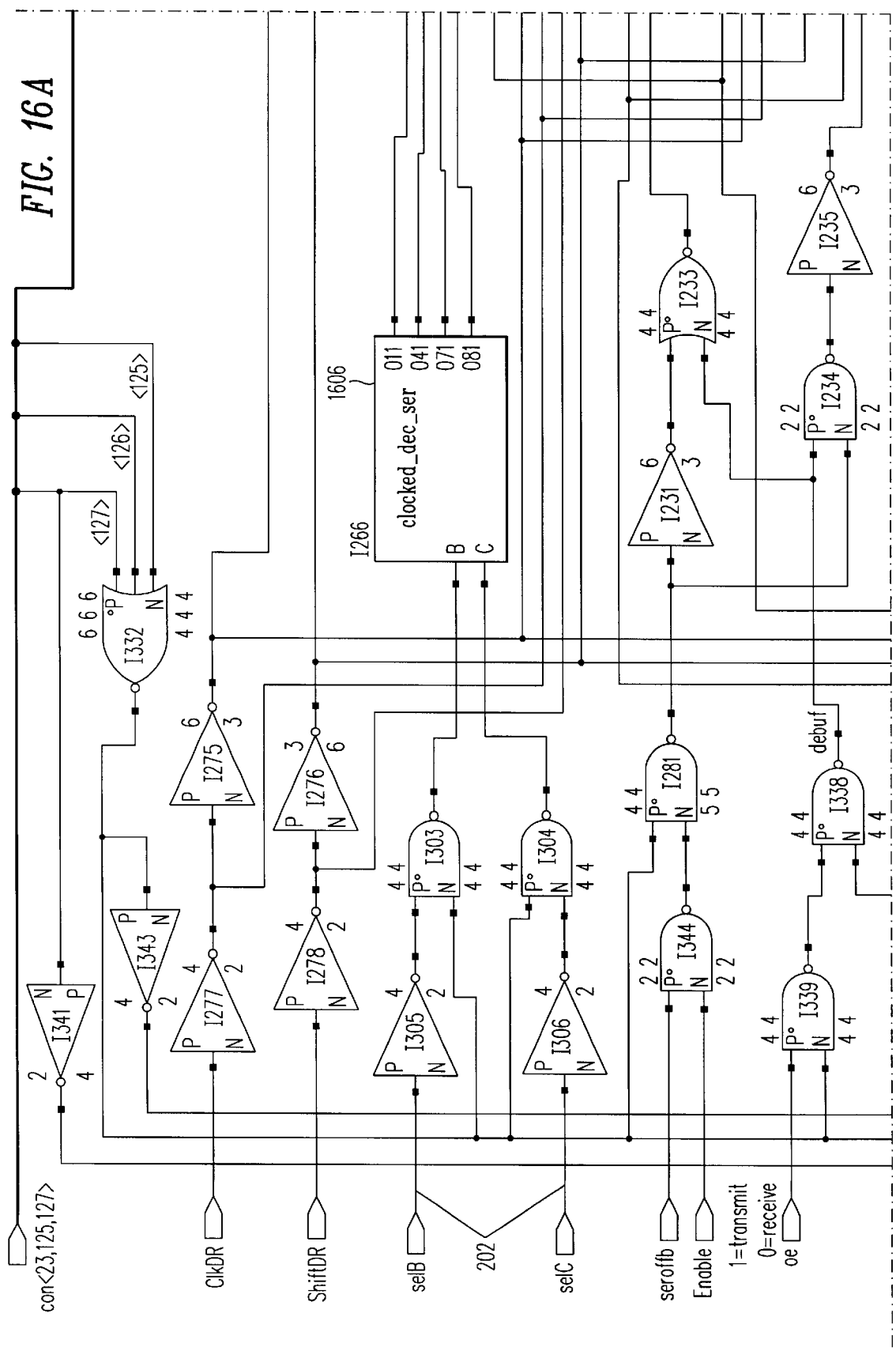
FIG. 16 is a schematic diagram of a channel clock block.
Figure 16B:
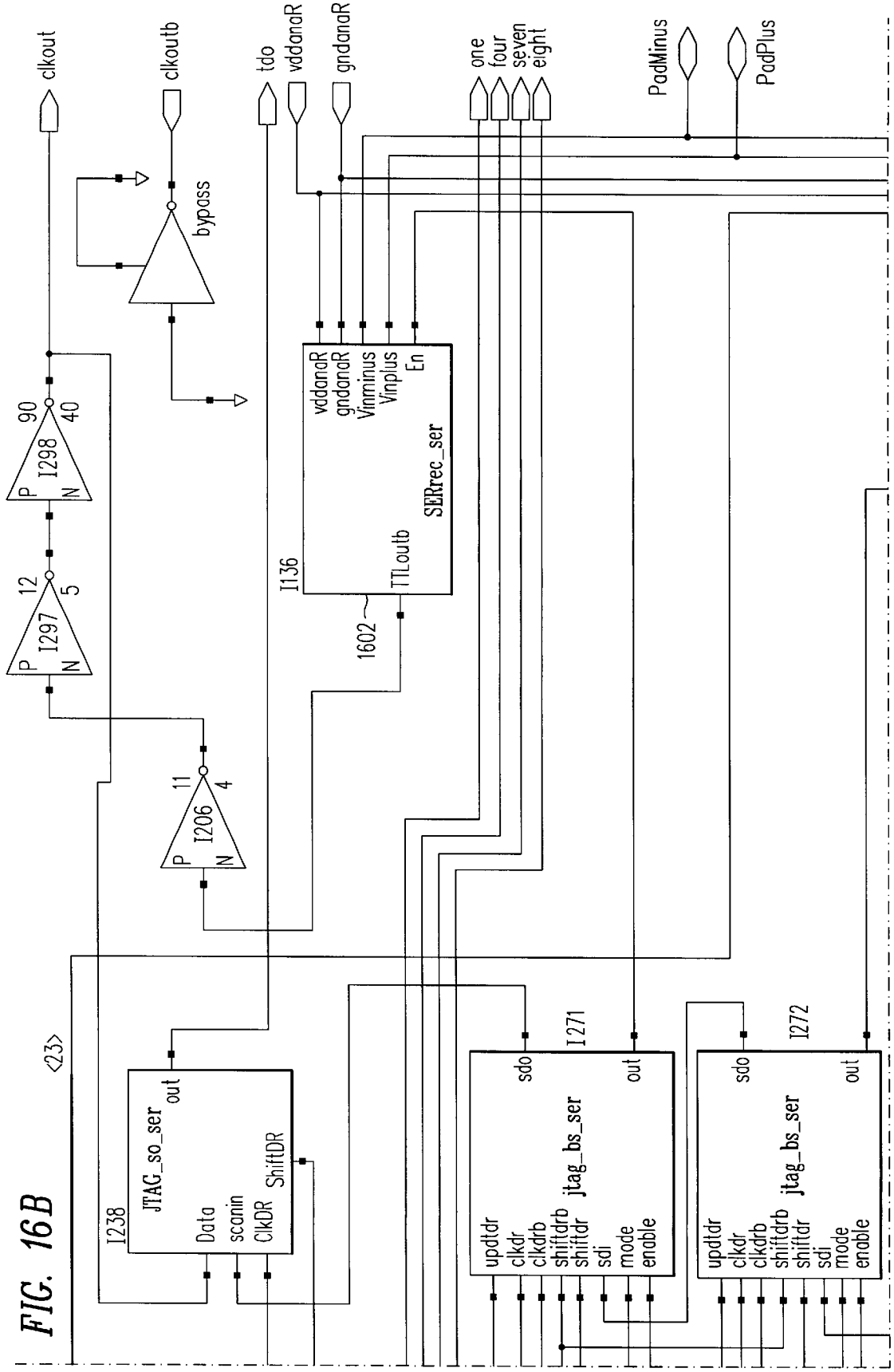
Figure 16C:
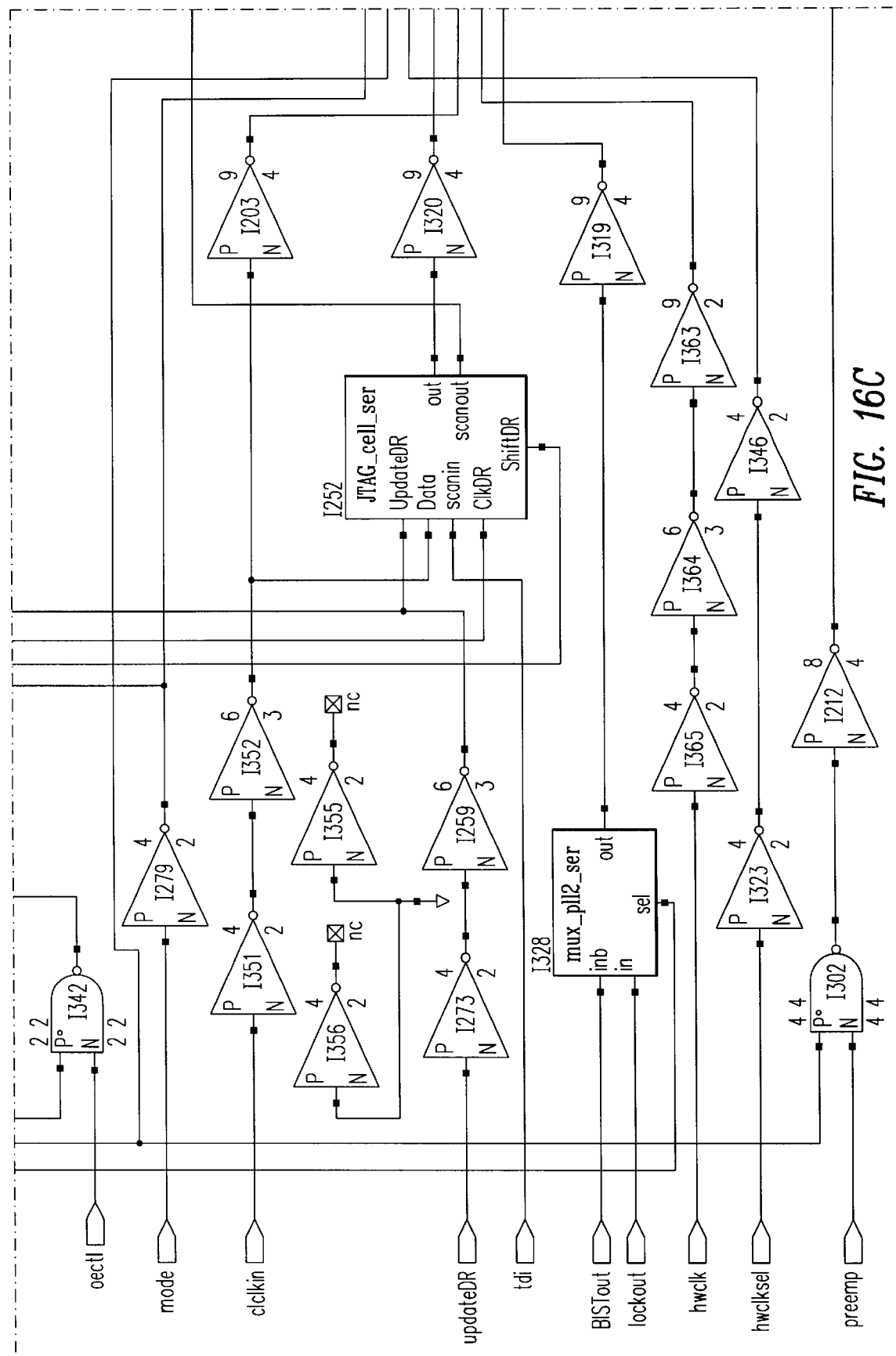
Figure 17:
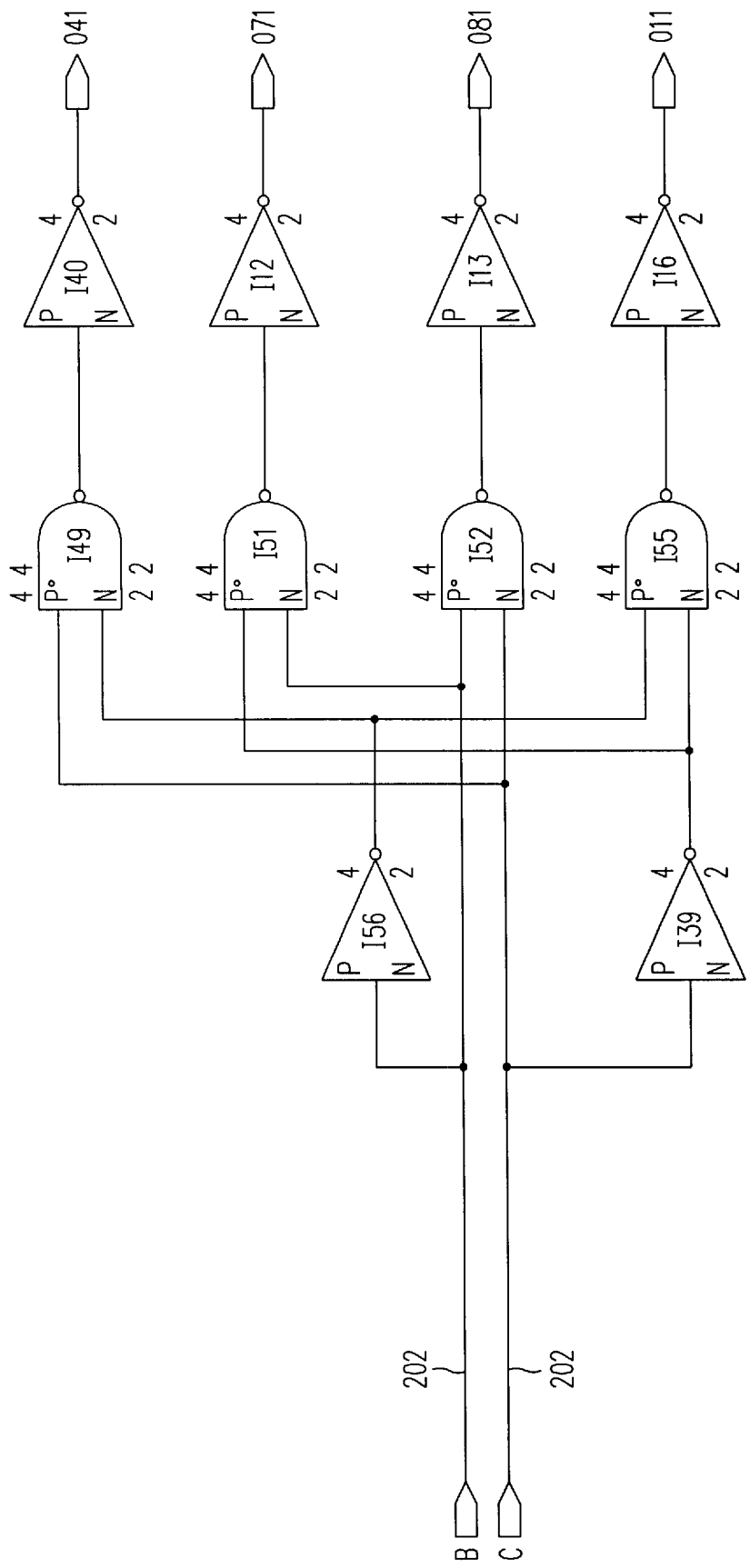
FIG. 17 is a schematic diagram of a serialization selection circuit.

In channel clock mode, channel clocks 114A and 114B (FIG. 1) provide the clock signal with which the data is serialized and deserialized. Channel clocks 114A and 114B are illustrated in more detail in FIG. 16. Each channel clock includes a transmitter 1604 and a receiver 1602. As illustrated in FIG. 2, each channel clock 114 receives two serialization selection signals 202. These serialization selection signals are programmed to determine the serialization associated with each of the channel clocks when data channel blocks 112 operate in channel clock mode. The serializations available for each channel clock are 8:1, 7:1, 4:1, and 1:1. Each channel clock can be programmed with a different serialization, but each channel clock can have only one serialization associated with that channel clock. The circuit in block 1606, illustrated in more detail in FIG. 17, provides four outputs to data channel blocks 112 corresponding to the four possible serializations. Since either channel clock can be selected for each data channel block 112, each data channel block 112 receives eight inputs from the channel clocks, corresponding to four possible serializations for each clock. These eight signals provide the selected serialization to stair-step clock generator 420 (FIG. 9).

Data channel block 112 operates as follows in channel clock mode. The data channel block receives from the FPGA side of the device mode selection signal 350 and clock selection signal 360. Mode selection signal 350 indicates that the data channel block is to operate in channel clock mode, and disables state machine 408. Clock selection signal 360 indicates which channel clock the data channel is to use to serialize and deserialize data. As described above, selection of the channel clock also dictates the serialization. In channel clock mode, data are collected from a data channel block, and the clock signal is collected from a channel clock block, instead of from the data stream.

Since channel clocks 114A and 114B are not used by the data channel blocks in clock recovery mode, the channel clocks can be used as low voltage differential signalling (LVDS) buffers. When not used to provide a clock signal to data channel blocks 112, they can be configured to buffer data from the field programmable gate array side of the device.

Several methods are available to test the SERDES core.

Figure 18A:
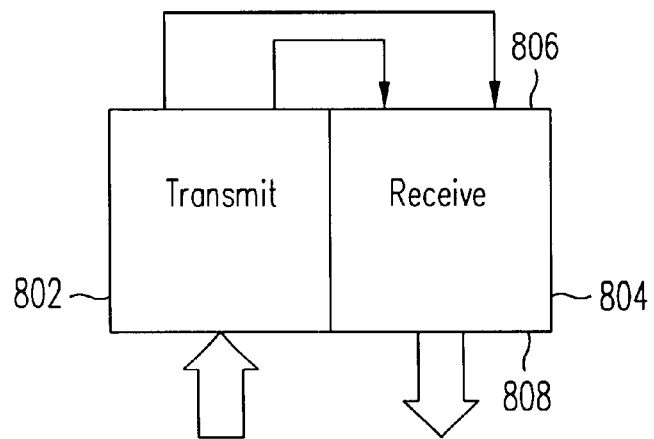
FIGS. 18A and 18B are diagrams of schemes for testing a serializer/deserializer core.

In accordance with another aspect of the invention, the data channel blocks in the SERDES core can be tested by a bi-directional loop back test. A conventional loop-back test is illustrated in FIG. 18A. Conventionally, the serialization and deserialization of data is performed by a separate transmitter 802 and receiver 804. The transmitter and receiver are tested by transmitter 802 receiving parallel data from the core of the device on the parallel side 808 of the transmitter, then serializing the data and outputting the data on the serial side 806 of the transmitter. The serial data then loop back into the serial side 806 of receiver 804 where they are deserialized into parallel data and output from the parallel side 808 of receiver 804. The parallel data are then verified.

Figure 18B:
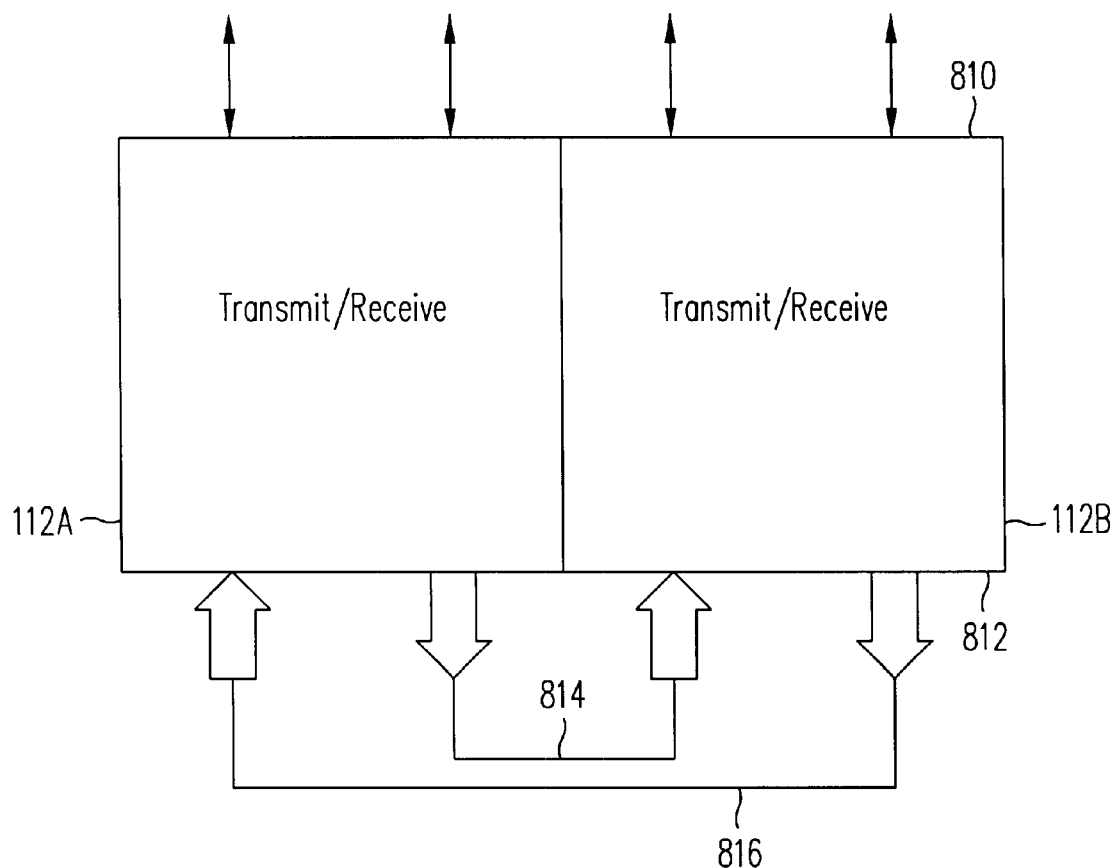

One embodiment of a bidirectional loop back test according to the present invention is illustrated in FIG. 18B. In contrast to the separate transmitter 802 and receiver 804 described above, the present invention uses data channel blocks 112 each of which can be programmed to operate at a given time as either a transmitter or a receiver. Two adjacent data channel blocks are tested in both directions by a loop back test. In the first loop, data channel 112A is programmed to be a receiver and data channel 112B is programmed to be a transmitter. Data is received on the serial side 810 of data channel 112A, deserialized, then output as parallel data on the parallel side 812 of data channel 112A. The parallel data then loop back in loop 814 to data channel 112B, which is programmed as a transmitter. Data channel 112B receives the parallel data, serializes, then outputs the serial data on serial side 810. The serial data are then verified. Data channel 112B is then switched to a receiver and data channel 112A is switched to a transmitter. Serial data is deserialized by data channel 112B, output as parallel data, then looped back in loop 816 to data channel 112A, where the data are serialized and verified.

In one embodiment, a series of registers are provided between the field programmable gate array core and the SERDES core. Multiplexers control the registers. In normal operation, the multiplexers connect the field programmable gate array core to data channels in the SERDES core. In loop-back operation, the multiplexers connect the data channels in the SERDES core together for testing.

In accordance with another aspect of the invention, the data channel blocks in the SERDES core can be tested by a bi-directional built-in self test (BIST). The bi-directional BIST operates in much the same way as the loop back test described above, except the test data is supplied automatically by a linear feedback shift register connected to a bus which connects to each data channel block and the data is verified automatically by an accumulator connected to a bus which connects to each data channel block. In contrast, the FPGA side of the device supplies and verifies the data used in a loop-back test. Also, in BIST mode, the data is supplied and verified on the parallel side of the data channel blocks, not the serial side as in the bi-directional loop back test described above. The linear feedback shift register coupled to the transmitter provides pseudo random parallel data. The linear feedback shift register coupled to the receiver accumulates the parallel data received and generates a signature. If at the end of the data stream the signature matches a predetermined hardwired correct signature, the test is automatically run in the opposite direction with the linear feedback shift registers and data channels switching values.

FIG. 3 illustrates one embodiment of BIST. If the data channel is configured to transmit, multiplexer 380 routes the data to line 352, instead of to transmitter 306. If the data channel is configured to receive, the data on line 352 is received on one of lines 354. Multiplexers 356 then isolate the data from receiver 312, and select one of lines 354. One of lines 354 corresponds to data from the data channel on the right side of the data channel shown in FIG. 3 and the other of lines 354 corresponds to the data channel on the left side of the data channel shown in FIG. 3.

In accordance with another aspect of the invention, the data channel block illustrated in FIG. 3 includes four joint test action group (JTAG) cells for performing boundary scan tests. Under normal operation, transmit/receive selection signal 310 turns one of transmitter 306 and receiver 312 on, and turns the other off. In JTAG testing mode, it is desirable to have both transmitter 306 and receiver 312 on simultaneously, such that the same data channel block can send and receive the data under test. Such an arrangement simplifies debug if errors are found, over an arrangement where different data channel blocks send and receive the data under test. JTAG cells 330 and 332 allow both transmitter 306 and receiver 312 to be active simultaneously by taking separate control of signal 310, without interfering with the function of transmit/receive selection signal 310 when the data channel block is not under test. JTAG cells 330 and 332 enable both the receiver and the transmitter at the same time, while JTAG cells 336 and 334 actually transmit, receive and check the data.

Although the present invention is described in connection with certain specific embodiments for instructional purposes, the present invention is not limited thereto. The depictions of the various structures in the various diagrams are illustrative. Accordingly, various modifications, adaptations, and combinations of various features of the described embodiments can be practiced without departing from the scope of the invention as defined in the following claims.

What is being claimed is:

1. A field programmable gate array comprising:
   a channel clock having a clock output line;
   a data channel capable of serializating and deserializing data, the data channel comprising:
   clock recovery circuitry capable of serializating and deserializing data with an embedded clock signal; and
   channel clock circuitry capable of serializing and deserializing data using a clock signal on the clock output line; and
   a selection line coupled to the data channel, wherein a selection signal on the selection line activates one of the clock recovery circuitry and the channel clock circuitry.

2. The field programmable gate array of claim 1 wherein the data channel further comprises:
   a transmitter coupled to a transmit/receive line; and
   a receiver coupled to the transmit/receive line;
   wherein a transmit/receive signal on the transmit/receive line activates one of the transmitter and the receiver.

3. The field programmable gate array of claim 1 wherein the data channel further comprises
   an stair-step clock generator comprising:
   a plurality of registers having a plurality of inputs and a plurality of outputs; and
   a plurality of multiplexers coupled to the plurality of inputs;
   wherein the plurality of registers generate a plurality of sequential rising edge signals at the plurality of outputs.

4. The field programmable gate array of claim 3 wherein:
   a first output in said plurality is coupled to an input of an inverter;
   an output of the inverter is coupled to a first input of a first NAND gate;
   a second output in said plurality is coupled to a second input of the first NAND gate;
   an output of the first NAND gate is coupled to an input of a second NAND gate;
   an output of the second NAND gate is coupled to an first input of a third NAND gate;
   a data line is coupled to a second input of the third NAND gate; and
   a plurality of data packet signals are provided on said data line, the plurality of data packet signals comprising a start bit, a data bit, and a stop bit.

5. The field programmable gate array of claim 3 wherein the data channel further comprises a plurality of control lines coupled to the plurality of multiplexers, wherein signals on the control lines determines a number of the registers activated by the plurality of multiplexers.

6. The field programmable gate array of claim 5 wherein the channel clock further comprises:
   a serialization selection circuit having an input line and a plurality of output lines, wherein the plurality of outputs lines are coupled to the plurality of control lines.

7. The field programmable gate array of claim 1 wherein the data channel block further comprises a voltage controlled oscillator, the voltage controlled oscillator comprising:
   a control line;
   an output line;
   a capacitor;
   a transistor disposed between the capacitor and the output line, the transistor having a gate coupled to said control line.

8. The field programmable gate array of claim 1 wherein the channel clock further comprises a low voltage differential signaling input/output buffer.

9. The field programmable gate array of claim 2 wherein the data channel further comprises:
   a first JTAG cell having a first enable line coupled to the transmitter;
   a second JTAG cell having a first input line coupled to the transmitter and a first output line;
   a third JTAG cell having a second enable line coupled to the receiver; and
   a fourth JTAG cell having a second input line coupled to the receiver, and a second output line; wherein
   a first signal on the first enable line and a second signal on the second enable line activate the transmitter and receiver, respectively;
   a third signal on the first output line indicates a fourth signal on the first input line is correct; and
   a fifth signal on the second input line indicates a sixth signal on the second input line is correct.

10. A method of testing a first data channel comprising a first transmitter and a first receiver and a second data channel comprising a second transmitter and a second receiver, the method comprising:
    providing a first set of serial data to the first receiver;
    the first data channel deserializing the first set of serial data to provide a first set of parallel data;
    providing the first set of parallel data to the second transmitter;
    the second data channel serializing the first set of parallel data to provide a second set of serial data;
    verifying the second set of serial data.

11. The method of claim 10 further comprising:
    providing a third set of serial data to the second receiver;
    the second data channel deserializing the third set of serial data to provide a second set of parallel data;
    providing the second set of parallel data to the first transmitter;
    the first data channel serializing the second set of parallel data to provide a fourth set of serial data;
    verifying the fourth set of serial data.

12. The method of claim 10 wherein:
    each of the first and second data channels is coupled to a field programmable gate array; and providing a first set of serial data comprises receiving a first set of serial data from the field programmable gate array.

13. The method of claim 10 wherein:

each of the first and second data channels is coupled to a linear feedback shift register and an accumulator;

providing a first set of serial data comprises receiving a first set of serial data from the linear feedback shift register; and verifying the second set of serial data comprises providing the second set of serial data to the accumulator.

14. A method of operating a field programmable gate array having a channel clock having a clock output line, a data channel, and a selection line coupe to the channel, comprising:

providing a selection signal on the selection; and in response to the selection signal, activating the data channel to serialize and deserialize data with one of an embedded clock signal and a clock signal on the clock output line.

* * * * *